(12) United States Patent
Holzer et al.

(10) Patent No.: US 11,475,626 B2
(45) Date of Patent: Oct. 18, 2022

(54) DAMAGE DETECTION FROM MULTI-VIEW VISUAL DATA

(71) Applicant: Fyusion, Inc., San Francisco, CA (US)

(72) Inventors: Stefan Johannes Josef Holzer, San Mateo, CA (US); Abhishek Kar, Berkeley, CA (US); Matteo Munaro, San Francisco, CA (US); Pavel Hanchar, Minsk (BY); Radu Bogdan Rusu, San Francisco, CA (US)

(73) Assignee: Fyusion, Inc., San Francisco, CA (US)

( * ) Notice: Subject to any disclaimer, the term of this patent is extended or adjusted under 35 U.S.C. 154(b) by 0 days.

(21) Appl. No.: 16/692,219

(22) Filed: Nov. 22, 2019

(65) Prior Publication Data
US 2020/0236296 A1    Jul. 23, 2020

Related U.S. Application Data

(63) Continuation-in-part of application No. 16/518,585, filed on Jul. 22, 2019, now Pat. No. 10,950,032, and
(Continued)

(51) Int. Cl.
*G06T 15/20* (2011.01)
*G06T 7/00* (2017.01)
(Continued)

(52) U.S. Cl.
CPC .......... *G06T 15/205* (2013.01); *G01C 21/32* (2013.01); *G06F 9/453* (2018.02); *G06F 16/29* (2019.01);
(Continued)

(58) Field of Classification Search
CPC ......... H04N 5/232939; H04N 5/23238; H04N 5/23222; G06T 7/0002; G06T 7/70;
(Continued)

(56) References Cited

U.S. PATENT DOCUMENTS

| | | |
|---|---|---|
| 5,764,306 A | 6/1998 | Steffano |
| 5,923,380 A | 7/1999 | Yang |
| 6,067,369 A | 5/2000 | Kamei |
| 6,453,069 B1 | 9/2002 | Matsugu |
| 6,788,309 B1 | 9/2004 | Swan |
| 6,879,956 B1 | 4/2005 | Honda |

(Continued)

FOREIGN PATENT DOCUMENTS

| | | |
|---|---|---|
| WO | 2016064921 A1 | 4/2016 |
| WO | 2017115149 A1 | 7/2017 |

(Continued)

OTHER PUBLICATIONS

Int'l Application Serial No. PCT/US20/12592, Int'l Search Report and Written Opinion dated Apr. 21, 2020.
(Continued)

*Primary Examiner* — Gevell V Selby
(74) *Attorney, Agent, or Firm* — Kwan & Olynick LLP

(57) ABSTRACT

One or more images of an object, each from a respective viewpoint, may be captured at a camera at a mobile computing device. The images may be compared to reference data to identify a difference between the images and the reference data. Image capture guidance may be provided on a display screen for capturing another one or more images of the object that includes the identified difference.

18 Claims, 36 Drawing Sheets

Related U.S. Application Data a continuation-in-part of application No. 16/518,501, filed on Jul. 22, 2019.

(60) Provisional application No. 62/843,119, filed on May 3, 2019, provisional application No. 62/843,113, filed on May 3, 2019, provisional application No. 62/795,427, filed on Jan. 22, 2019, provisional application No. 62/795,421, filed on Jan. 22, 2019.

(51) Int. Cl.

| | | |
|---|---|---|
| *G06T 7/70* | (2017.01) | |
| *G06T 19/00* | (2011.01) | |
| *G06F 30/15* | (2020.01) | |
| *G06N 3/02* | (2006.01) | |
| *G06Q 30/02* | (2012.01) | |
| *G06T 15/10* | (2011.01) | |
| *G06T 17/00* | (2006.01) | |
| *G06F 9/451* | (2018.01) | |
| *H04N 5/232* | (2006.01) | |
| *G06F 17/18* | (2006.01) | |
| *G06T 7/593* | (2017.01) | |
| *H04N 13/271* | (2018.01) | |
| *H04N 13/243* | (2018.01) | |
| *G06F 16/29* | (2019.01) | |
| *G01C 21/32* | (2006.01) | |
| *H04N 13/00* | (2018.01) | |

(52) U.S. Cl.
CPC .............. *G06F 17/18* (2013.01); *G06F 30/15* (2020.01); *G06N 3/02* (2013.01); *G06Q 30/0278* (2013.01); *G06T 7/0002* (2013.01); *G06T 7/0004* (2013.01); *G06T 7/593* (2017.01); *G06T 7/70* (2017.01); *G06T 15/10* (2013.01); *G06T 17/00* (2013.01); *G06T 19/003* (2013.01); *G06T 19/006* (2013.01); *H04N 5/232939* (2018.08); *H04N 13/243* (2018.05); *H04N 13/271* (2018.05); *G06T 2200/08* (2013.01); *G06T 2200/24* (2013.01); *G06T 2207/10016* (2013.01); *G06T 2207/10028* (2013.01); *G06T 2207/20076* (2013.01); *G06T 2207/20081* (2013.01); *G06T 2207/20084* (2013.01); *G06T 2207/20224* (2013.01); *G06T 2207/30108* (2013.01); *G06T 2207/30244* (2013.01); *G06T 2207/30248* (2013.01); *H04N 2013/0081* (2013.01)

(58) Field of Classification Search
CPC ........... G06T 2207/20081; G06T 2207/20224; G06T 2207/10016; G06T 2207/20084; G06F 9/453; G06F 17/18
See application file for complete search history.

(56) References Cited

U.S. PATENT DOCUMENTS

| | | |
|---|---|---|
| 6,912,313 B2 | 6/2005 | Li |
| 7,249,019 B2 | 7/2007 | Culy |
| 7,292,257 B2 | 11/2007 | Kang |
| 7,565,004 B2 | 7/2009 | Hashimoto |
| 7,949,529 B2 | 5/2011 | Weider |
| 9,182,229 B2 | 11/2015 | Grässer |
| 9,218,698 B2 | 12/2015 | Ricci |
| 9,467,750 B2 | 10/2016 | Banica |
| 9,495,764 B1 | 11/2016 | Boardman |
| 9,886,636 B2 | 2/2018 | Zhang |
| 9,886,771 B1* | 2/2018 | Chen ...................... G06T 7/344 |
| 10,319,094 B1 | 6/2019 | Chen |
| 10,657,647 B1 | 5/2020 | Chen |
| 11,004,188 B2 | 5/2021 | Holzer |
| 2002/0063714 A1 | 5/2002 | Haas |
| 2002/0198713 A1 | 12/2002 | Franz |
| 2004/0258306 A1 | 12/2004 | Hashimoto |
| 2007/0253618 A1 | 11/2007 | Kim |
| 2008/0101656 A1 | 5/2008 | Barnes |
| 2008/0180436 A1 | 7/2008 | Kraver |
| 2009/0289957 A1 | 11/2009 | Sroka |
| 2010/0111370 A1 | 5/2010 | Black |
| 2010/0251101 A1 | 9/2010 | Haussecker |
| 2011/0218825 A1 | 9/2011 | Hertenstein |
| 2013/0297353 A1 | 11/2013 | Strange |
| 2014/0119604 A1 | 5/2014 | Mai |
| 2014/0172245 A1 | 6/2014 | Soles et al. |
| 2015/0029304 A1* | 1/2015 | Park .................. H04N 5/23293 348/36 |
| 2015/0097931 A1 | 4/2015 | Hatzilias |
| 2015/0103170 A1 | 4/2015 | Nelson |
| 2015/0125049 A1 | 5/2015 | Taigman |
| 2015/0278987 A1* | 10/2015 | Mihara .............. H04N 5/23238 345/427 |
| 2015/0317527 A1 | 11/2015 | Graumann |
| 2015/0347845 A1 | 12/2015 | Benson |
| 2015/0365661 A1* | 12/2015 | Hayashi ............. H04N 5/23222 348/175 |
| 2016/0035096 A1 | 2/2016 | Rudow |
| 2017/0109930 A1 | 4/2017 | Holzer |
| 2017/0199647 A1 | 7/2017 | Richman |
| 2017/0208246 A1 | 7/2017 | Kimura |
| 2017/0277363 A1 | 9/2017 | Holzer |
| 2017/0293894 A1* | 10/2017 | Taliwal ................... G06T 7/143 |
| 2018/0027178 A1 | 1/2018 | Macmillan |
| 2018/0160102 A1 | 6/2018 | Luo |
| 2018/0225858 A1 | 8/2018 | Jie |
| 2018/0260793 A1 | 9/2018 | Li |
| 2018/0315260 A1 | 11/2018 | Anthony |
| 2018/0322623 A1 | 11/2018 | Memo et al. |
| 2018/0338126 A1 | 11/2018 | Trevor |
| 2018/0349746 A1 | 12/2018 | Vallespi-Gonzalez |
| 2019/0012394 A1 | 1/2019 | Endras |
| 2019/0035165 A1 | 1/2019 | Gausebeck |
| 2019/0073641 A1 | 3/2019 | Utke |
| 2019/0098277 A1 | 3/2019 | Takama |
| 2019/0116322 A1 | 4/2019 | Holzer |
| 2019/0147221 A1 | 5/2019 | Grabner |
| 2019/0147583 A1 | 5/2019 | Stefan |
| 2019/0164301 A1 | 5/2019 | Kim |
| 2019/0189007 A1 | 6/2019 | Herman |
| 2019/0196698 A1 | 6/2019 | Cohen |
| 2019/0197196 A1 | 6/2019 | Yang |
| 2019/0317519 A1 | 10/2019 | Chen |
| 2019/0318759 A1 | 10/2019 | Doshi |
| 2019/0335156 A1 | 10/2019 | Rusu |
| 2020/0151860 A1 | 5/2020 | Safdarnejad |
| 2020/0231286 A1 | 7/2020 | Movsesian |
| 2020/0233892 A1 | 7/2020 | Calhoun |
| 2020/0234397 A1 | 7/2020 | Holzer |
| 2020/0234398 A1 | 7/2020 | Holzer |
| 2020/0234424 A1 | 7/2020 | Holzer |
| 2020/0234451 A1 | 7/2020 | Holzer |
| 2020/0234488 A1 | 7/2020 | Holzer |
| 2020/0236296 A1 | 7/2020 | Holzer |
| 2020/0236343 A1 | 7/2020 | Holzer |
| 2020/0257862 A1 | 8/2020 | Kar |
| 2020/0258309 A1 | 8/2020 | Holzer |
| 2020/0349757 A1 | 11/2020 | Holzer |

FOREIGN PATENT DOCUMENTS

| | | |
|---|---|---|
| WO | 2017195228 A1 | 11/2017 |
| WO | 2020009948 A1 | 1/2020 |
| WO | 2020154096 A1 | 7/2020 |

OTHER PUBLICATIONS

Alberto Chavez-Aragon, et al., "Vision-Based Detection and Labelling of Multiple Vehicle Parts", 2011 14th International IEEE

(56) References Cited

OTHER PUBLICATIONS

Conference on Intelligent Transportation Systems Washington, DC, USA. Oct. 5-7, 2011, 6 pages.
U.S. Appl. No. 16/518,501, CTFR—Final Rejection, dated Dec. 9, 2020, 16 pgs.
U.S. Appl. No. 16/518,501, Examiner Interview Summary Record (Ptol-413), dated Nov. 23, 2020, 2 pgs.
U.S. Appl. No. 16/518,501, Non-Final Rejection, dated Sep. 1, 2020, 15 pgs.
U.S. Appl. No. 16/518,512, Examiner Interview Summary Record (Ptol-413), dated Nov. 19, 2020, 3 pgs.
U.S. Appl. No. 16/518,512, Non-Final Rejection, dated Oct. 1, 2020, 24 pgs.
U.S. Appl. No. 16/518,512, Office Action Appendix, dated Nov. 19, 2020, 1 pg.
U.S. Appl. No. 16/518,558, Non-Final Rejection, dated Sep. 8, 2020, 14 pgs.
U.S. Appl. No. 16/518,585, Non-Final Rejection, dated Sep. 3, 2020, 13 pgs.
U.S. Appl. No. 16/596,516, Non-Final Rejection, dated Jun. 23, 2020, 37 pgs.
U.S. Appl. No. 16/596,516, Notice Of Allowance And Fees Due (Ptol-85), dated Sep. 21, 2020, 10 pgs.
U.S. Appl. No. 16/692,133, Non-Final Rejection, dated Jul. 24, 2020, 17 pgs.
U.S. Appl. No. 16/692,170, Non-Final Rejection, dated Nov. 20, 2020, 13 pgs.
U.S. Appl. No. 16/692,219, Non-Final Rejection, dated Dec. 8, 2020, 9 pgs.
U.S. Appl. No. 16/861,100, Non-Final Rejection, dated Oct. 8, 2020, 11 pgs.
U.S. Appl. No. 16/518,512, Notice of Allowance dated Jan. 25, 2021, 7 pgs.
U.S. Appl. No. 16/518,512, Notice of Allowance dated Dec. 16, 2020, 9 pgs.
U.S. Appl. No. 16/518,558, Examiner Interview Summary dated Dec. 16, 2020, 1 pg.
U.S. Appl. No. 16/518,558, Final Office Action dated Dec. 16, 2020, 16 pgs.
U.S. Appl. No. 16/518,570, Non-Final Office Action dated Jan. 6, 2021, 17 pgs.
U.S. Appl. No. 16/518,585, Notice of Allowance dated Dec. 14, 2020, 5 pgs.
U.S. Appl. No. 16/692,133, Notice of Allowance dated Dec. 15, 2020, 7pgs.
U.S. Appl. No. 16/692,170, Notice of Allowance dated Feb. 9, 2021, 8 pgs.
U.S. Appl. No. 16/861,100, Advisory Action dated Jun. 10, 2021, 3 pgs.
U.S. Appl. No. 16/861,100, Examiner Interview Summary dated Feb. 10, 2021, 2 pgs.
U.S. Appl. No. 16/861,100, Examiner Interview Summary dated Jun. 10, 2021, 1 pg.
U.S. Appl. No. 16/861,100, Examiner Interview Summary dated Jun. 3, 2021, 2 pgs.
U.S. Appl. No. 16/861,100, Final Office Action dated Feb. 26, 2021, 15 pgs.
Gerd Lindner et al., "Structure-Preserving Sparsification of Social Networks", arXiv:1505.00564v1 [cs.SI] May 4, 2015, 8 pages.
International Search Report and Written Opinion for App. No. PCT/US2021/013471, dated May 6, 2021, 10 pages.
International Search Report and Written Opinion for App. No. PCT/US2021/013472, dated May 11, 2021, 10 pages.
Jeff Donahue et al., "DeCAF: ADeep Convolutional Activation Feature for Generic Visual Recognition", arXiv: 1310.153 1v1 [cs.CV] Oct. 6, 2013, 10 pages.
Office Action (Non-Final Rejection) dated Sep. 2, 2021 for U.S. Appl. No. 17/174,250 (pp. 1-22).
Office Action (Non-Final Rejection) dated Sep. 24, 2021 for U.S. Appl. No. 17/215,596 (pp. 1-14).
Office Action (Non-Final Rejection) dated Oct. 4, 2021 for U.S. Appl. No. 16/861,097 (pp. 1-15).
Office Action (Notice of Allowance and Fees Due (PTOL-85)) dated Sep. 15, 2021 for U.S. Appl. No. 16/518,570 (pp. 1-8).
Office Action dated Jul. 16, 2021 for U.S. Appl. No. 16/518,501 (pp. 1-23).
Office Action dated Jun. 14, 2021 for U.S. Appl. No. 16/518,570 (pp. 1-24).
Riza Alp Guler et al., "DensePose: Dense Human Pose Estimation In The Wild", arXiv:1802.00434v1 [cs.CV] Feb. 1, 2018, 12 pages.
Shubham Tulsiani and Jitendra Malik, "Viewpoints and Keypoints", arXiv:1411.6067v2 [cs.CV] Apr. 26, 2015, 10 pages.
Wenhao Lu, et al., "Parsing Semantic Parts of Cars Using Graphical Models and Segment Appearance Consistency", arXiv:1406.2375v2 [cs.CV] Jun. 11, 2014, 12 pages.
Office Action (Final Rejection) dated Jun. 14, 2021 for U.S. Appl. No. 16/518,570 (pp. 1-23).
Office Action (Final Rejection) dated Dec. 7, 2021 for U.S. Appl. No. 16/518,501 (pp. 1-21).
Office Action (Final Rejection) dated Mar. 3, 2022 for U.S. Appl. No. 17/174,250 (pp. 1-24).
Office Action (Final Rejection) dated Jan. 20, 2022 for U.S. Appl. No. 17/215,596 (pp. 1-16).
Office Action (Final Rejection) dated Jan. 19, 2022 for U.S. Appl. No. 16/861,097 (pp. 1-16).
International Search Report and Written Opinion for App. No. PCT/US2021/013431, dated May 6, 2021, 10 pages.
Office Action (Final Rejection) dated Jan. 19, 2022 for U.S. Appl. No. 16/861,100 (pp. 1-19).
Office Action (Final Rejection) dated Nov. 9, 2021 for U.S. Appl. No. 16/518,558 (pp. 1-17).
Office Action (Non-Final Rejection) dated Mar. 28, 2022 for U.S. Appl. No. 16/518,501 (pp. 1-21).
Office Action (Non-Final Rejection) dated Mar. 29, 2022 for U.S. Appl. No. 16/518,558 (pp. 1-16).
Office Action (Non-Final Rejection) dated Apr. 14, 2022 for U.S. Appl. No. 17/144,879 (pp. 1-12).
Office Action (Non-Final Rejection) dated Sep. 20, 2021 for U.S. Appl. No. 16/861,100 (pp. 1-19).
Office Action (Notice of Allowance and Fees Due (PTOL-85)) dated Apr. 7, 2022 for U.S. Appl. No. 17/215,596 (pp. 1-9).
Office Action dated Jul. 26, 2021 for U.S. Appl. No. 16/518,558 (pp. 1-17).

* cited by examiner

DAMAGE DETECTION FROM MULTI-VIEW VISUAL DATA

CROSS-REFERENCE TO RELATED APPLICATIONS

The present application claims priority under 35 U.S.C. 120 to U.S. Provisional Patent Application No. 62/795,421, titled "AUTOMATIC VEHICLE DAMAGE DETECTION FROM MULTI-VIEW VISUAL DATA", filed Jan. 22, 2019, by Holzer et al., which is hereby incorporated by reference in its entirety and for all purposes. The present application is also a continuation-in-part of and claims priority under 35 U.S.C. 120 to U.S. patent application Ser. No. 16/518,501, titled "AUTOMATIC VIEW MAPPING FOR SINGLE-IMAGE AND MULTI-VIEW CAPTURES", filed Jul. 22, 2019, by Holzer et al., which claims priority under 35 U.S.C. 120 to U.S. Provisional Patent Application No. 62/795,427, titled "AUTOMATIC VIEW MAPPING FOR SINGLE- AND MULTI-VIEW CAPTURES", filed Jan. 22, 2019, by Holzer et al., both of which are hereby incorporated by reference in its entirety and for all purposes. The present application claims priority under 35 U.S.C. 120 to U.S. Provisional Patent Application No. 62/843,113, titled "OBJECT DAMAGE AGGREGATION", filed May 3, 2019, by Holzer et al., which is hereby incorporated by reference in its entirety and for all purposes. The present application is also a continuation-in-part of and claims priority under 35 U.S.C. 120 to U.S. patent application Ser. No. 16/518,585, titled "Object Capture Coverage Evaluation", filed Jul. 22, 2019, by Holzer et al., which claims priority under 35 U.S.C. 120 to U.S. Provisional Patent Application No. 62/843,119, titled "Object Capture Coverage Evaluation", filed May 3, 2019, by Holzer et al., both of which are hereby incorporated by reference in its entirety and for all purposes.

COPYRIGHT NOTICE

A portion of the disclosure of this patent document contains material which is subject to copyright protection. The copyright owner has no objection to the facsimile reproduction by anyone of the patent document or the patent disclosure as it appears in the United States Patent and Trademark Office patent file or records but otherwise reserves all copyright rights whatsoever.

TECHNICAL FIELD

The present disclosure relates generally to the detection of damage on an object, and more specifically to automatic detection of damage based on multi-view data.

DESCRIPTION OF RELATED ART

Vehicles need to be inspected for damage on different occasions. For example, a vehicle may be inspected after an accident to evaluate or support an insurance claim or police report. As another example, a vehicle may be inspected before and after the rental of a vehicle, or before buying or selling a vehicle.

Vehicle inspection using conventional approaches is a largely manual process. Typically, a person walks around the vehicle and manually notes damage and conditions. This process is time-intensive, resulting in significant costs. The manual inspection results also vary based on the person. For example, a person may be more or less experienced in evaluating damage. The variation in results can yield a lack of trust and potential financial losses, for example when buying and selling vehicles or when evaluating insurance claims.

Overview

According to various embodiments, techniques and mechanisms described herein provide for systems, devices, methods, and machine readable media for providing image capture guidance. In some implementations, a first one or more images of a designated object may be captured via a camera at a mobile computing device. Each of the first one or more images may be captured from a respective viewpoint. The first one or more images may be compared to reference data to identify a difference between the first one or more images and the reference data. An instruction may be transmitted to a display screen at the mobile computing device to provide image capture guidance. The image capture guidance may include an instruction for capturing a second one or more images of the designated object. The second one or more images may include a designated portion of the object that includes the identified difference.

In some embodiments, the image capture guidance may be provided as an overlay on a live video feed presented on the display screen. The difference includes a characteristic such as an estimated probability of damage to the designated object portion, an estimated severity of damage to the designated object portion, or an estimated type of damage to the designated object portion. The difference may include a statistical estimate, and the image capture guidance may be provided so as to decrease statistical uncertainty for the statistical estimate.

According to various embodiments, the image capture guidance may identify a targeted camera position. Alternately, or additionally, the image capture guidance may identify a targeted camera orientation. Alternately, or additionally, the image capture guidance may identify a targeted camera zoom level. Alternately, or additionally, the image capture guidance may be configured to as to align the camera with a designated perspective view within a three-dimensional model of the object.

In some implementations, comparing the first one or more images to reference data to identify the difference may involve applying a neural network to estimate one or more two-dimensional skeleton joints for a respective one of the first images. Alternately, or additionally, comparing the first one or more images to reference data to identify the difference may involve estimating pose information for a designated one of the first images. The pose information may include a location and angle of the camera with respect to the designated object for the designated image. Alternately, or additionally, comparing the first one or more images to reference data to identify the difference comprises applying a neural network to the first one or more images to map the first one or more images to an object model.

According to various embodiments, a multi-view representation of the designated object may be constructed at the mobile computing device based on the first one or more images. The multi-view representation may be navigable in one or more directions. The multi-view representation of the designated object may be updated based on the second one or more images.

BRIEF DESCRIPTION OF THE DRAWINGS

The included drawings are for illustrative purposes and serve only to provide examples of possible structures and operations for the disclosed inventive systems, apparatus, methods and computer program products for image processing. These drawings in no way limit any changes in form and detail that may be made by one skilled in the art without departing from the spirit and scope of the disclosed implementations.

DETAILED DESCRIPTION

According to various embodiments, techniques and mechanisms described herein may be used to identify and represent damage to an object such as a vehicle. The damage detection techniques may be employed by untrained individuals. For example, an individual may collect multi-view data of an object, and the system may detect the damage automatically.

According to various embodiments, various types of damage may be detected. For a vehicle, such data may include, but is not limited to: scratches, dents, flat tires, cracked glass, broken glass, or other such damage.

In some implementations, a user may be guided to collect multi-view data in a manner that reflects the damage detection process. For example, when the system detects that damage may be present, the system may guide the user to take additional images of the portion of the object that is damaged.

According to various embodiments, techniques and mechanisms described herein may be used to create damage estimates that are consistent over multiple captures. In this way, damage estimates may be constructed in a manner that is independent of the individual wielding the camera and does not depend on the individual's expertise. In this way, the system can automatically detect damage in an instant, without requiring human intervention.

Although various techniques and mechanisms are described herein by way of example with reference to detecting damage to vehicles, these techniques and mechanisms are widely applicable to detecting damage to a range of objects. Such objects may include, but are not limited to: houses, apartments, hotel rooms, real property, personal property, equipment, jewelry, furniture, offices, people, and animals.

Figure 1:
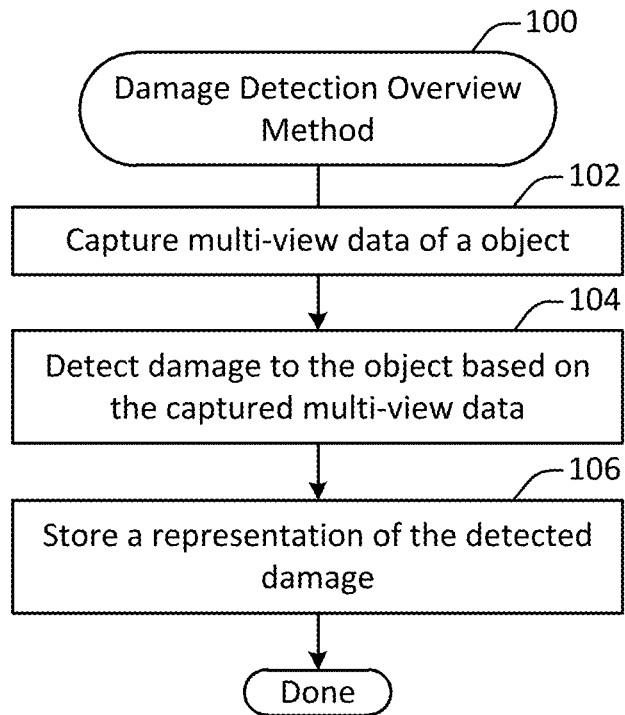
FIG. 1 illustrates one example of a damage detection method, performed in accordance with one or more embodiments.

FIG. 1 illustrates a method 100 for damage detection. According to various embodiments, the method 100 may be performed at a mobile computing device such as a smart phone. The smart phone may be in communication with a remote server. Alternately, or additionally, some or all of the method 100 may be performed at a remote computing device such as a server. The method 100 may be used to detect damage to any of various types of objects. However, for the purpose of illustration, many examples discussed herein will be described with reference to vehicles.

At 102, multi-view data of an object is captured. According to various embodiments, the multi-view data may include images captured from different viewpoints. For example, a user may walk around a vehicle and capture images from different angles. In some configurations, the multi-view data may include data from various types of sensors. For example, the multi-view data may include data from more than one camera. As another example, the multi-view data may include data from a depth sensor. As another example, the multi-view data may include data collected from an inertial measurement unit (IMU). IMU data may include position information, acceleration information, rotation information, or other such data collected from one or more accelerometers or gyroscopes.

In particular embodiments, the multi-view data may be aggregated to construct a multi-view representation. Additional details regarding multi-view data collection, multi-view representation construction, and other features are discussed in co-pending and commonly assigned U.S. patent application Ser. No. 15/934,624, "Conversion of an Interactive Multi-view Image Data Set into a Video", by Holzer et al., filed Mar. 23, 2018, which is hereby incorporated by reference in its entirety and for all purposes.

At 104, damage to the object is detected based on the captured multi-view data. In some implementations, the damage may be detected by evaluating some or all of the multi-view data with a neural network, by comparing some or all of the multi-view data with reference data, and/or any other relevant operations for damage detection. Additional details regarding damage detection are discussed throughout the application.

At 106, a representation of the detected damage is stored on a storage medium or transmitted via a network. According to various embodiments, the representation may include some or all of a variety of information. For example, the representation may include an estimated dollar value. As another example, the representation may include a visual depiction of the damage. As still another example, a list of damaged parts may be provided. Alternatively, or additionally, the damaged parts may be highlighted in a 3D CAD model.

In some embodiments, a visual depiction of the damage may include an image of actual damage. For example, once the damage is identified at 104, one or more portions of the multi-view data that include images of the damaged portion of the object may be selected and/or cropped.

In some implementations, a visual depiction of the damage may include an abstract rendering of the damage. An abstract rendering may include a heatmap that shows the probability and/or severity of damage using a color scale. Alternatively, or additionally, an abstract rendering may represent damage using a top-down view or other transformation. By presenting damage on a visual transformation of the object, damage (or lack thereof) to different sides of the object may be presented in a standardized manner.

Figure 2:
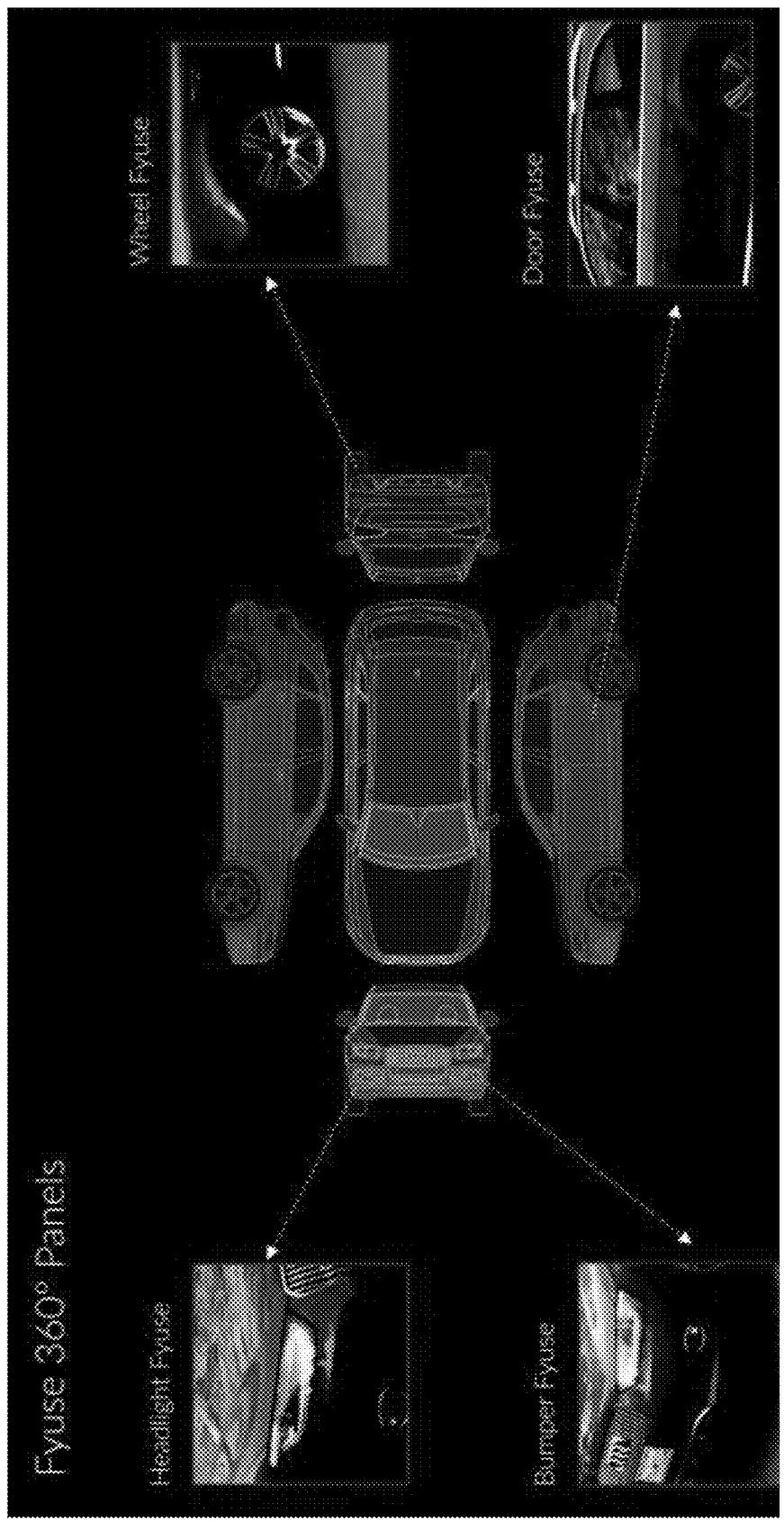
FIG. 2 illustrates an example of a damage representation, generated in accordance with one or more embodiments.

FIG. 2 presents an example of a damage representation, generated in accordance with one or more embodiments. The damage representation shown in FIG. 2 includes a top-down view of the vehicle, as well as views from other perspectives. Damage to the vehicle may be represented on the top-down view in various ways, for instance by the color red. In addition, the damage representation may include perspective view images of portions of the vehicle, such as those in which damage appears.

Figure 3:
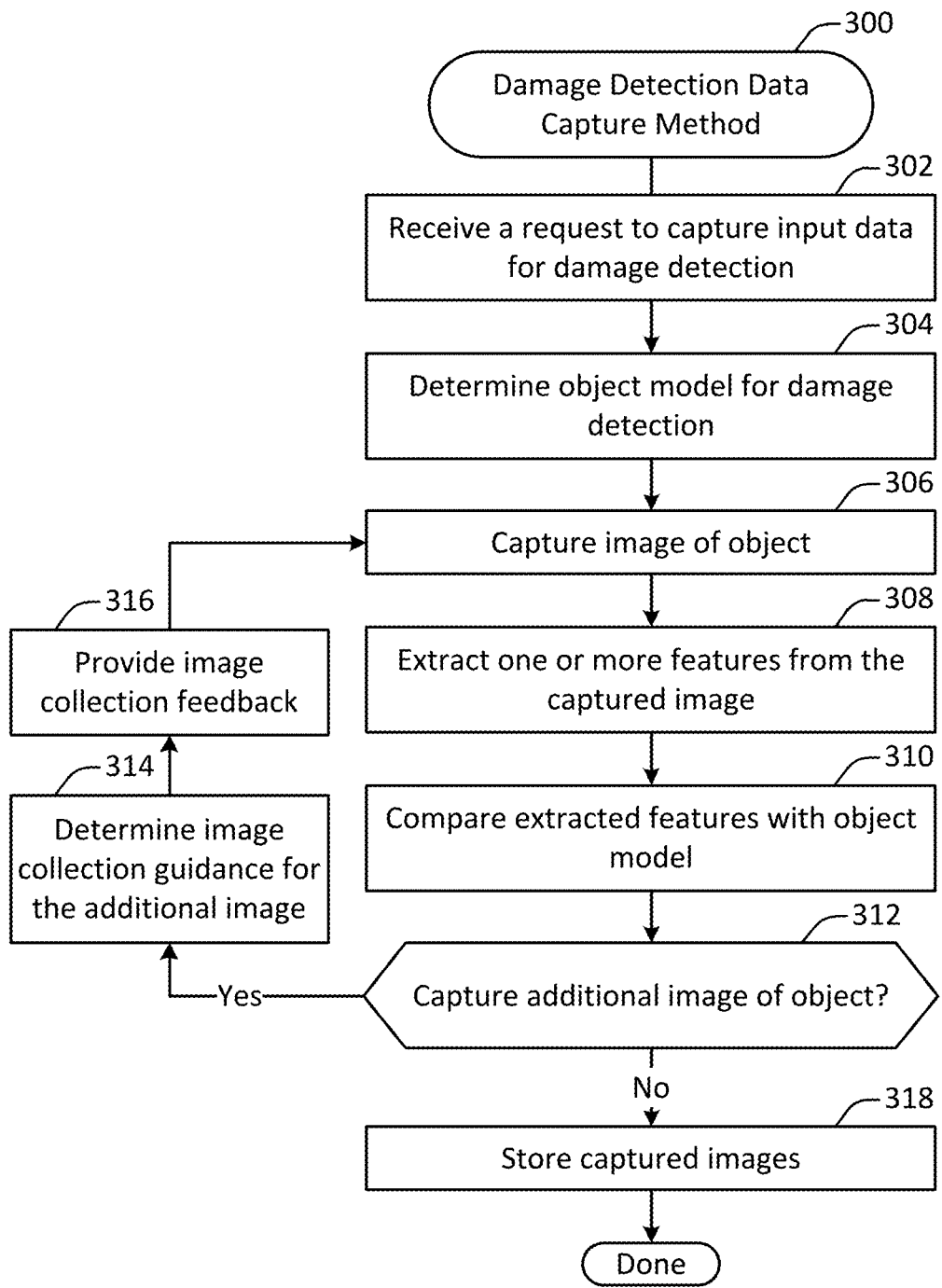
FIG. 3 illustrates one example of a damage detection data capture method, performed in accordance with various embodiments.

FIG. 3 illustrates a method 300 of damage detection data capture. According to various embodiments, the method 300 may be performed at a mobile computing device such as a smart phone. The smart phone may be in communication with a remote server. The method 300 may be used to detect damage to any of various types of objects. However, for the purpose of illustration, many examples discussed herein will be described with reference to vehicles.

A request to capture input data for damage detection for an object is received at 302. In some implementations, the request to capture input data may be received at a mobile computing device such as a smart phone. In particular embodiments, the object may be a vehicle such as a car, truck, or sports utility vehicle.

An object model for damage detection is determined at 304. According to various embodiments, the object model may include reference data for use in evaluating damage and/or collecting images of an object. For example, the object model may include one or more reference images of similar objects for comparison. As another example, the object model may include a trained neural network. As yet another example, the object model may include one or more reference images of the same object captured at an earlier point in time. As yet another example, the object model may include a 3D model (such as a CAD model) or a 3D mesh reconstruction of the corresponding vehicle.

In some embodiments, the object model may be determined based on user input. For example, the user may identify a vehicle in general or a car, truck, or sports utility vehicle in particular as the object type.

In some implementations, the object model may be determined automatically based on data captured as part of the method 300. In this case, the object model may be determined after the capturing of one or more images at 306.

At 306, an image of the object is captured. According to various embodiments, capturing the image of the object may involve receiving data from one or more of various sensors. Such sensors may include, but are not limited to, one or more cameras, depth sensors, accelerometers, and/or gyroscopes. The sensor data may include, but is not limited to, visual data, motion data, and/or orientation data. In some configurations, more than one image of the object may be captured. Alternatively, or additionally, video footage may be captured.

According to various embodiments, a camera or other sensor located at a computing device may be communicably coupled with the computing device in any of various ways. For example, in the case of a mobile phone or laptop, the camera may be physically located within the computing device. As another example, in some configurations a camera or other sensor may be connected to the computing device via a cable. As still another example, a camera or other sensor may be in communication with the computing device via a wired or wireless communication link.

According to various embodiments, as used herein the term "depth sensor" may be used to refer to any of a variety of sensor types that may be used to determine depth information. For example, a depth sensor may include a projector and camera operating in infrared light frequencies. As another example, a depth sensor may include a projector and camera operating in visible light frequencies. For instance, a line-laser or light pattern projector may project a visible light pattern onto an object or surface, which may then be detected by a visible light camera.

One or more features of the captured image or images are extracted at 308. In some implementations, extracting one or more features of the object may involve constructing a multi-view capture that presents the object from different viewpoints. If a multi-view capture has already been constructed, then the multi-view capture may be updated based on the new image or images captured at 306. Alternatively, or additionally, feature extraction may involve performing one or more operations such as object recognition, component identification, orientation detection, or other such steps.

At 310, the extracted features are compared with the object model. According to various embodiments, comparing the extracted features to the object model may involve making any comparison suitable for determining whether the captured image or images are sufficient for performing damage comparison. Such operations may include, but are not limited to: applying a neural network to the captured image or images, comparing the captured image or images to one or more reference images, and/or performing any of the operations discussed with respect to FIGS. 4 and 5.

A determination is made at 312 as to whether to capture an additional image of the object. In some implementations, the determination may be made at least in part based on an analysis of the one or more images that have already been captured.

In some embodiments, a preliminary damage analysis may be implemented using as input the one or more images that have been captured. If the damage analysis is inconclusive, then an additional image may be captured. Techniques for conducting damage analysis are discussed in additional detail with respect to the methods 400 and 500 shown in FIGS. 4 and 5.

In some embodiments, the system may analyze the captured image or images to determine whether a sufficient portion of the object has been captured in sufficient detail to support damage analysis. For example, the system may analyze the capture image or images to determine whether the object is depicted from all sides. As another example, the system may analyze the capture image or images to determine whether each panel or portion of the object is shown in a sufficient amount of detail. As yet another example, the system may analyze the capture image or images to determine whether each panel or portion of the object is shown from a sufficient number of viewpoints.

If the determination is made to capture an additional image, then at 314 image collection guidance for capturing the additional image is determined. In some implementations, the image collection guidance may include any suitable instructions for capturing an additional image that may assist in changing the determination made at 312. Such guidance may include an indication to capture an additional image from a targeted viewpoint, to capture an additional image of a designated portion of the object, or to capture an additional image at a different level of clarity or detail. For example, if possible damage is detected, then feedback may be provided to capture additional detail at the damaged location.

At 316, image collection feedback is provided. According to various embodiments, the image collection feedback may include any suitable instructions or information for assisting a user in collecting additional images. Such guidance may include, but is not limited to, instructions to collect an image at a targeted camera position, orientation, or zoom level. Alternatively, or additionally, a user may be presented with instructions to capture a designated number of images or an image of a designated portion of the object.

For example, a user may be presented with a graphical guide to assist the user in capturing an additional image from a target perspective. As another example, a user may be presented with written or verbal instructions to guide the user in capturing an additional image. Additional techniques for determining and providing recording guidance as well as other related features are described in co-pending and commonly assigned U.S. patent application Ser. No. 15/992,546, titled "Providing Recording Guidance in Generating a Multi-View Interactive Digital Media Representation", filed May 30, 2018 by Holzer et al.

When it is determined to not capture an additional image of the object, then at 318 the captured image or images are stored. In some implementations, the captured images may be stored on a storage device and used to perform damage detection, as discussed with respect to the methods 400 and 500 in FIGS. 4 and 5. Alternatively, or additionally, the images may be transmitted to a remote location via a network interface.

Figure 4:
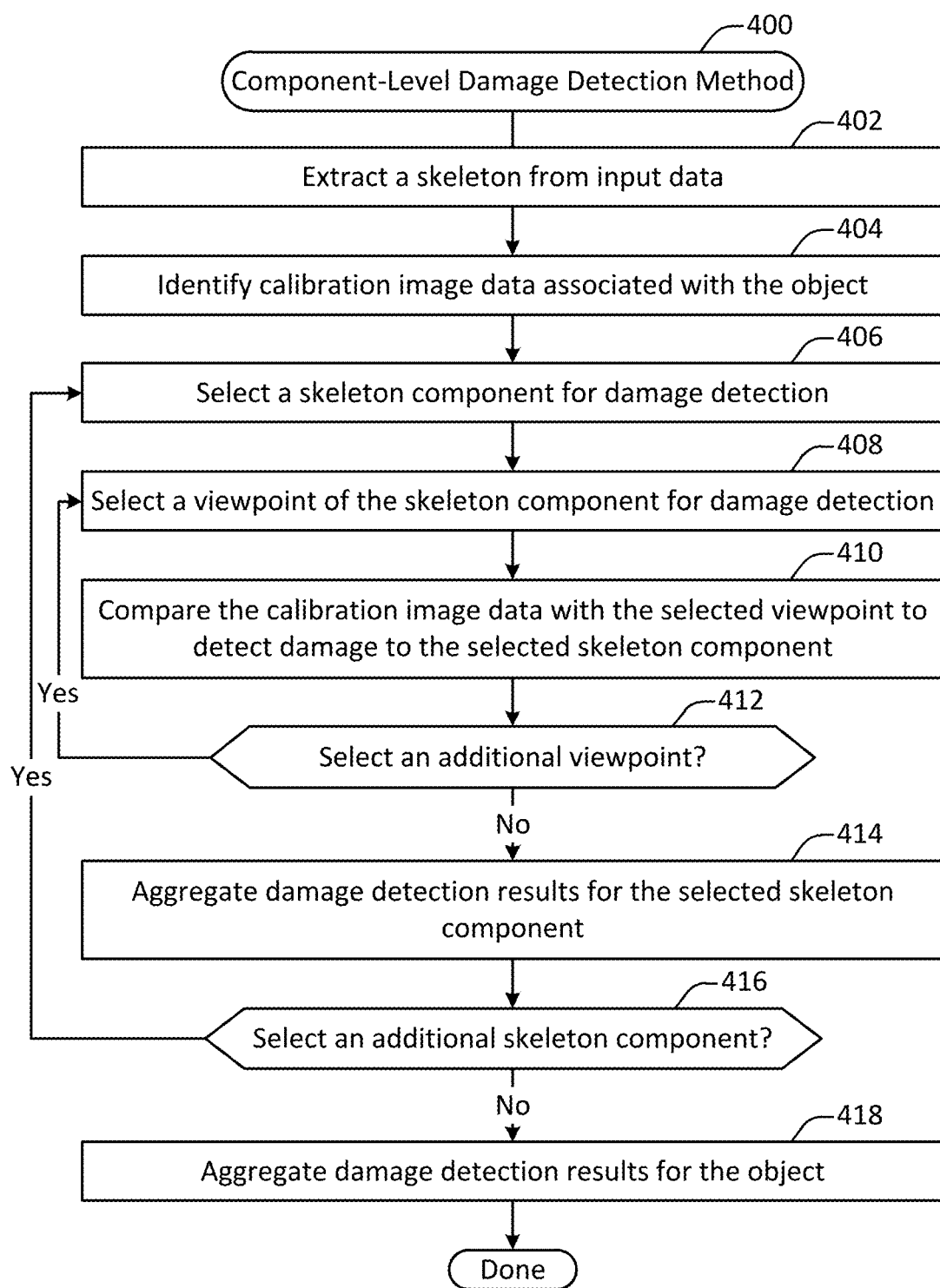
FIG. 4 illustrates a method for component-level damage detection, performed in accordance with various embodiments.

FIG. 4 illustrates a method 400 for component-level damage detection. According to various embodiments, the method 400 may be performed at a mobile computing device such as a smart phone. The smart phone may be in communication with a remote server. The method 400 may be used to detect damage to any of various types of objects. However, for the purpose of illustration, many examples discussed herein will be described with reference to vehicles.

A skeleton is extracted from input data at 402. According to various embodiments, the input data may include visual data collected as discussed with respect to the method 300 shown in FIG. 3. Alternatively, or additionally, the input data may include previously collected visual data, such as visual data collected without the use of recording guidance.

In some implementations, the input data may include one or more images of the object captured from different perspectives. Alternatively, or additionally, the input data may include video data of the object. In addition to visual data, the input data may also include other types of data, such as IMU data.

According to various embodiments, skeleton detection may involve one or more of a variety of techniques. Such techniques may include, but are not limited to: 2D skeleton detection using machine learning, 3D pose estimation, and 3D reconstruction of a skeleton from one or more 2D skeletons and/or poses. Additional details regarding skeleton detection and other features are discussed in co-pending and commonly assigned U.S. patent application Ser. No. 15/427,026, titled "Skeleton Detection and Tracking via Client-server Communication" by Holzer et al, filed Feb. 7, 2017, which is hereby incorporated by reference in its entirety and for all purposes.

Calibration image data associated with the object is identified at 404. According to various embodiments, the calibration image data may include one or more reference images of similar objects or of the same object at an earlier point in time. Alternatively, or additionally, the calibration image data may include a neural network used to identify damage to the object.

A skeleton component is selected for damage detection at 406. In some implementations, a skeleton component may represent a panel of the object. In the case of a vehicle, for example, a skeleton component may represent a door panel, a window, or a headlight. Skeleton components may be selected in any suitable order, such as sequentially, randomly, in parallel, or by location on the object.

According to various embodiments, when a skeleton component is selected for damage detection, a multi-view capture of the skeleton component may be constructed. Constructing a multi-view capture of the skeleton component may involve identifying different images in the input data that capture the skeleton component from different viewpoints. The identified images may then be selected, cropped, and combined to produce a multi-view capture specific to the skeleton component.

A viewpoint of the skeleton component is selected for damage detection at 404. In some implementations, each viewpoint included in the multi-view capture of the skeleton component may be analyzed independently. Alternatively, or additionally, more than one viewpoint may be analyzed simultaneously, for instance by providing the different viewpoints as input data to a machine learning model trained to identify damage to the object. In particular embodiments, the input data may include other types of data, such as 3D visual data or data captured using a depth sensor or other type of sensor.

According to various embodiments, one or more alternatives to skeleton analysis at 402-410 may be used. For example, an object part (e.g., vehicle component) detector may be used to directly estimate the object parts. As another example, an algorithm such as a neural network may be used to map an input image to a top-down view of an object such as a vehicle (and vice versa) in which the components are defined. As yet another example, an algorithm such as a neural network that classifies the pixels of an input image as a specific component can be used to identify the components. As still another example, component-level detectors may be used to identify specific components of the object. As yet another alternative, a 3D reconstruction of the vehicle may be computed and a component classification algorithm may be run on that 3D model. The resulting classification can then be back-projected into each image. As still another alternative, a 3D reconstruction of the vehicle can be computed and fitted to an existing 3D CAD model of the vehicle in order to identify the single components.

At 410, the calibration image data is compared with the selected viewpoint to detect damage to the selected skeleton component. According to various embodiments, the comparison may involve applying a neural network to the input data. Alternatively, or additionally, an image comparison between the selected viewpoint and one or more reference images of the object captured at an earlier point in time may be performed.

A determination is made at 412 as to whether to select an additional viewpoint for analysis. According to various embodiments, additional viewpoints may be selected until all available viewpoints are analyzed. Alternatively, viewpoints may be selected until the probability of damage to the selected skeleton component has been identified to a designated degree of certainty.

Damage detection results for the selected skeleton component are aggregated at 414. According to various embodiments, damage detection results from different viewpoints to a single damage detection result per panel resulting in a damage result for the skeleton component. For example, a heatmap may be created that shows the probability and/or severity of damage to a vehicle panel such as a vehicle door. According to various embodiments, various types of aggregation approaches may be used. For example, results determined at 410 for different viewpoints may be averaged. As another example, different results may be used to "vote" on a common representation such as a top-down view. Then, damage may be reported if the votes are sufficiently consistent for the panel or object portion.

A determination is made at 416 as to whether to select an additional skeleton component for analysis. In some implementations, additional skeleton components may be selected until all available skeleton components are analyzed.

Figure 11:
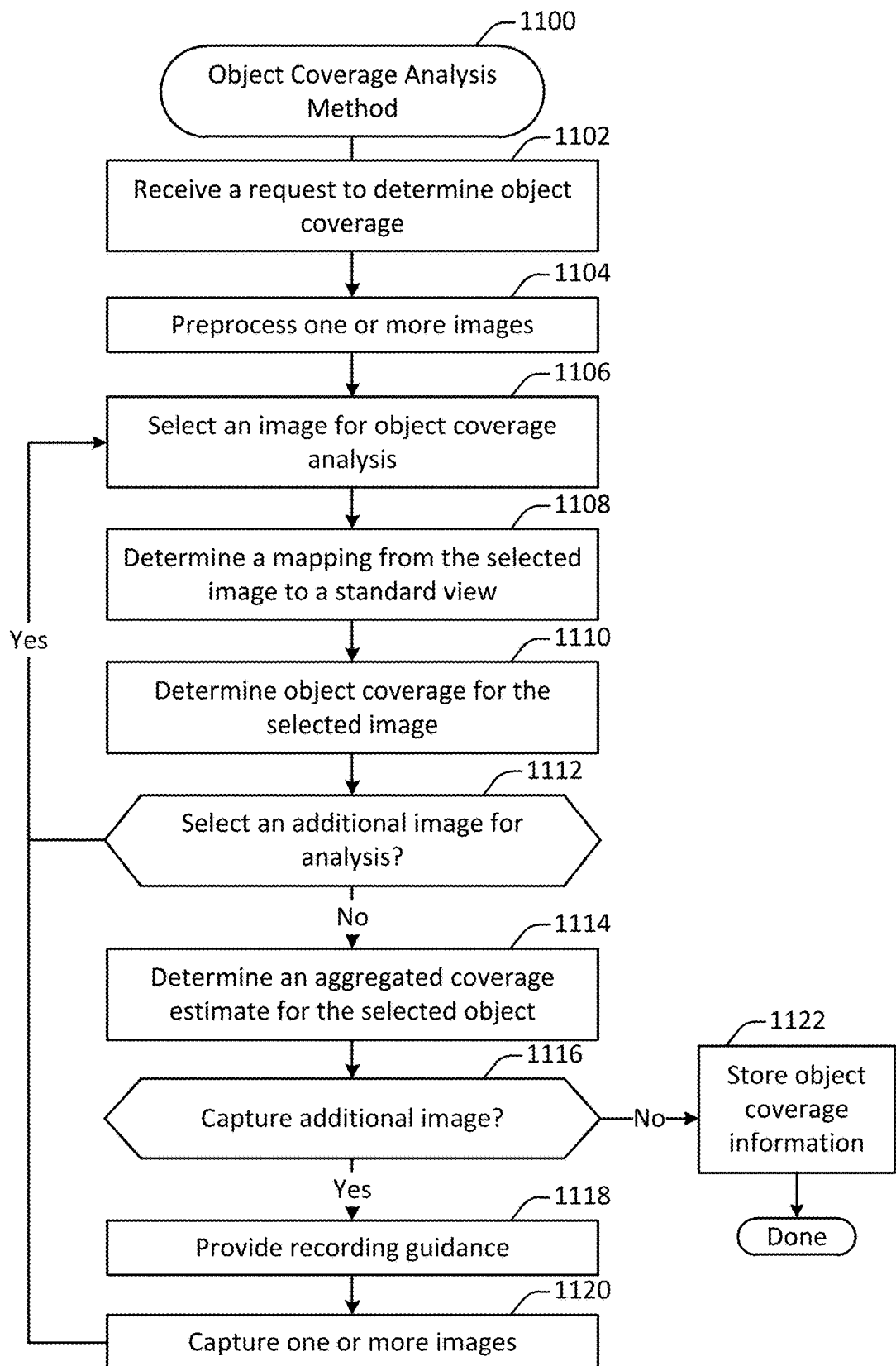
FIG. 11 illustrates a method for analyzing object coverage, performed in accordance with one or more embodiments.

Damage detection results for the object are aggregated at 414. According to various embodiments, damage detection results for different components may be aggregated into a single damage detection result for the object as a whole. For example, creating the aggregated damage results may involve creating a top-down view, as shown in FIG. 11. As another example, creating the aggregated damage results may involve identifying standardized or appropriate viewpoints of portions of the object identified as damaged, as shown in FIG. 11. As yet another example, creating the aggregated damage results may involve tagging damaged portions in a multi-view representation. As still another example, creating the aggregated damage results may involve overlaying a heatmap on a multi-view representation. As yet another example, creating the aggregated damage results may involve selecting affected parts and presenting them to the user. Presenting may be done as a list, as highlighted elements in a 3D CAD model, or in any other suitable fashion.

In particular embodiments, techniques and mechanisms described herein may involve a human to provide additional input. For example, a human may review damage results, resolve inconclusive damage detection results, or select damage result images to include in a presentation view. As another example, human review may be used to train one or more neural networks to ensure that the results computed are correct and are adjusted as necessary.

Figure 5:
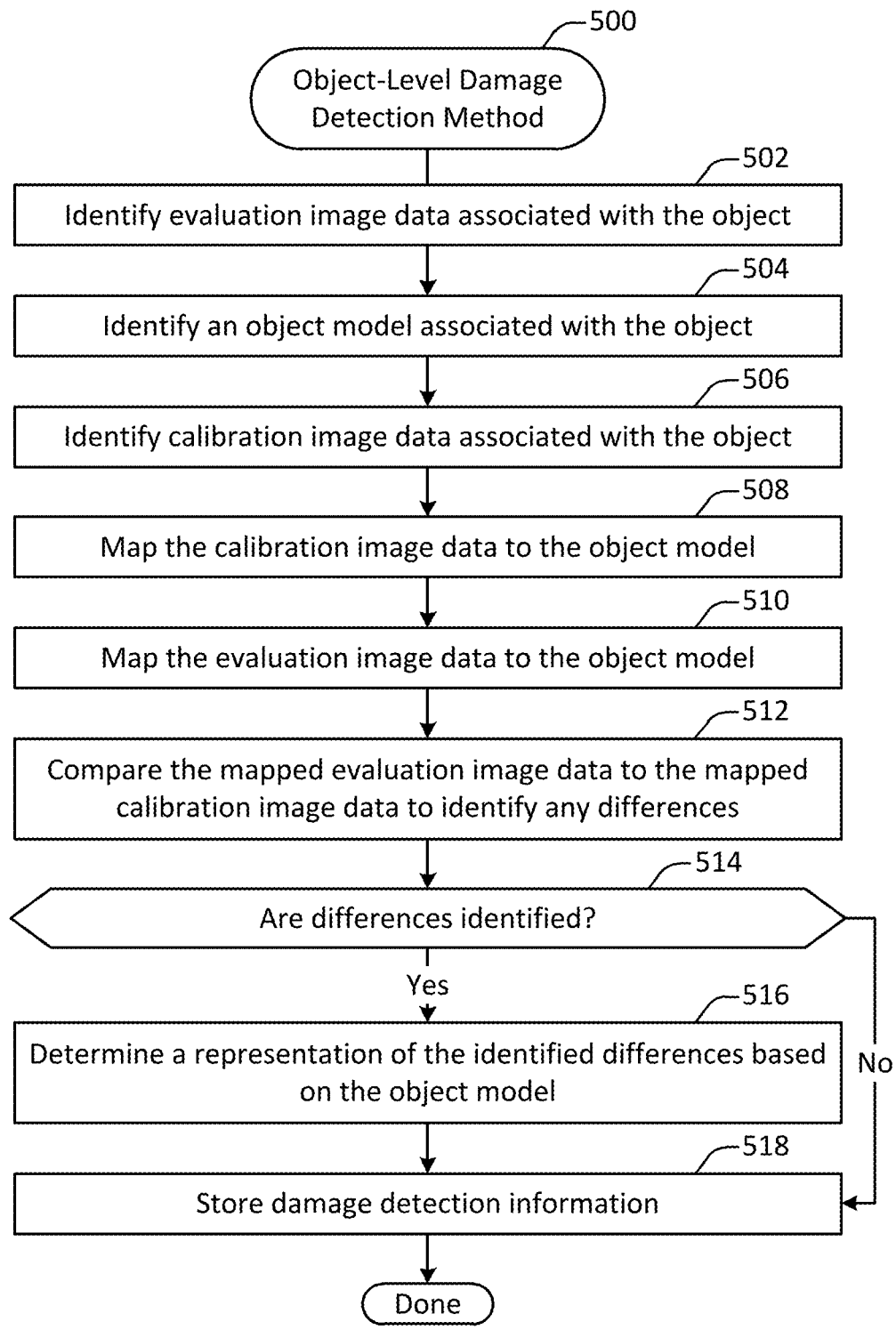
FIG. 5 illustrates an object-level damage detection method, performed in accordance with one or more embodiments.

FIG. 5 illustrates an object-level damage detection method 500, performed in accordance with one or more embodiments. The method 500 may be performed at a mobile computing device such as a smart phone. The smart phone may be in communication with a remote server. The method 500 may be used to detect damage to any of various types of objects.

Evaluation image data associated with the object is identified at 502. According to various embodiments, the evaluation image data may include single images captured from different viewpoints. As discussed herein, the single images may be aggregated into a multi-view capture, which may include data other than images, such as IMU data.

An object model associated with the object is identified at 504. In some implementations, the object model may include a 2D or 3D standardized mesh, model, or abstracted representation of the object. For instance, the evaluation image data may be analyzed to determine the type of object that is represented. Then, a standardized model for that type of object may be retrieved. Alternatively, or additionally, a user may select an object type or object model to use. The object model may include a top-down view of the object.

Calibration image data associated with the object is identified at 506. According to various embodiments, the calibration image data may include one or more reference images. The reference images may include one or more images of the object captured at an earlier point in time. Alternatively, or additionally, the reference images may include one or more images of similar objects. For example, a reference image may include an image of the same type of car as the car in the images being analyzed.

In some implementations, the calibration image data may include a neural network trained to identify damage. For instance, the calibration image data may be trained to analyze damage from the type of visual data included in the evaluation data.

The calibration data is mapped to the object model at 508. In some implementations, mapping the calibration data to the object model may involve mapping a perspective view of an object from the calibration images to a top-down view of the object.

The evaluation image data is mapped to the object model at 510. In some implementations, mapping the evaluation image data to the object model may involve determine a pixel-by-pixel correspondence between the pixels of the image data and the points in the object model. Performing such a mapping may involve determining the camera position and orientation for an image from IMU data associated with the image.

In some embodiments, a dense per-pixel mapping between an image and the top-down view may be estimated at 510. Alternatively, or additionally, location of center of an image may be estimated with respect to the top-down view. For example, a machine learning algorithm such as deep net may be used to map the image pixels to coordinates in the top-down view. As another example, joints of a 3D skeleton of the object may be estimated and used to define the mapping. As yet another example, component-level detectors may be used to identify specific components of the object.

In some embodiments, the location of one or more object parts within the image may be estimated. Those locations may then be used to map data from the images to the top-down view. For example, object parts may be classified on a pixel-wise basis. As another example, the center location of object parts may be determined. As another example, the joints of a 3D skeleton of an object may be estimated and used to define the mapping. As yet another example, component-level detectors may be used for specific object components.

In some implementations, images may be mapped in a batch via a neural network. For example, a neural network may receive as input a set of images of an object captured from different perspectives. The neural network may then detect damage to the object as a whole based on the set of input images.

The mapped evaluation image data is compared to the mapped calibration image data at 512 to identify any differences. According to various embodiments, the data may be compared by running a neural network on a multi-view representation as a whole. Alternatively, or additional, the evaluation and image data may be compared on an image-by-image basis.

If it is determined at 514 that differences are identified, then at 516 a representation of the identified differences is determined. According to various embodiments, the representation of the identified differences may involve a heatmap of the object as a whole. For example, a heatmap of a top-down view of a vehicle showing damage is illustrated in FIG. 2. Alternatively, one or more components that are damaged may be isolated and presented individually.

At 518, a representation of the detected damage is stored on a storage medium or transmitted via a network. In some implementations, the representation may include an estimated dollar value. Alternatively, or additionally, the representation may include a visual depiction of the damage. Alternatively, or additionally, affected parts may be presented as a list and/or highlighted in a 3D CAD model.

In particular embodiments, damage detection of an overall object representation may be combined with damage representation on one or more components of the object. For example, damage detection may be performed on a closeup of a component if an initial damage estimation indicates that damage to the component is likely.

Figure 6:
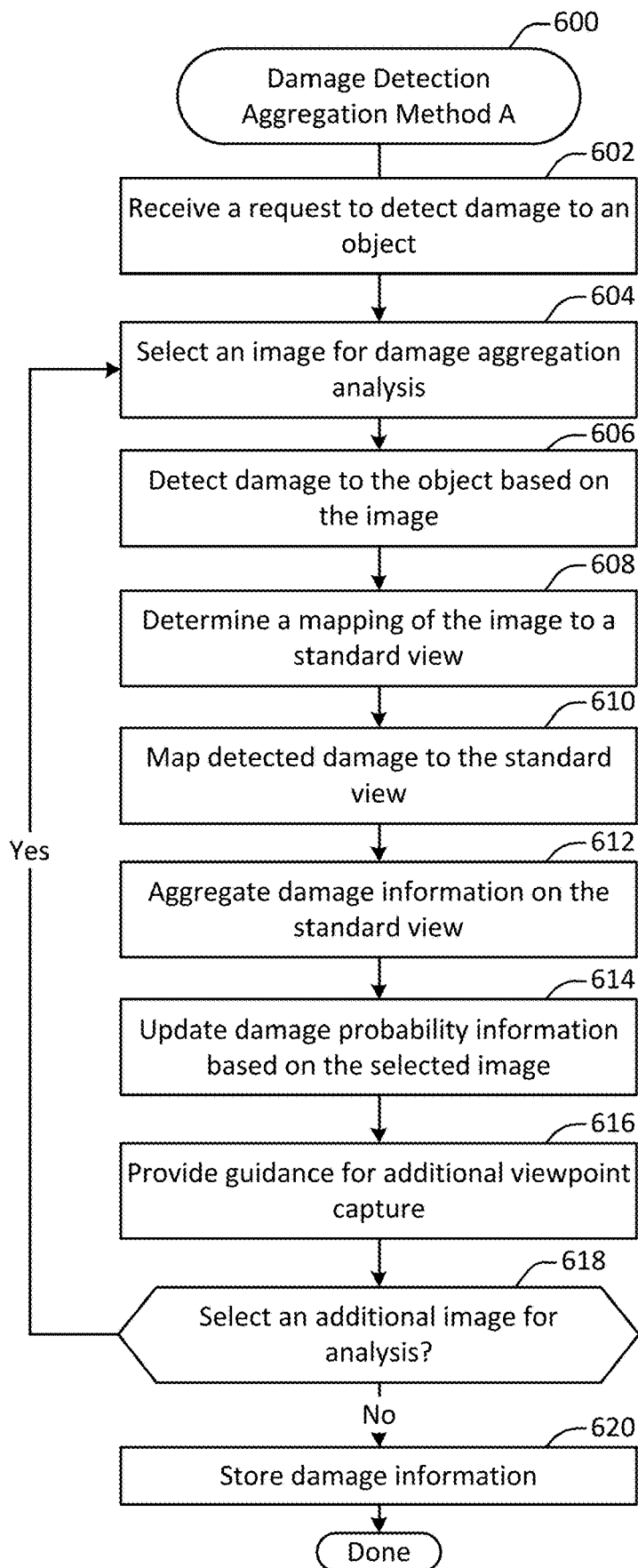
FIG. 6 illustrates one example of a damage detection aggregation method, performed in accordance with one or more embodiments.

FIG. 6 illustrates a method 600 for aggregating detected damage to an object, performed in accordance with one or more embodiments. According to various embodiments, the method 600 may be performed at a mobile computing device such as a smart phone. The smart phone may be in communication with a remote server. Alternately, or additionally, some or all of the method 600 may be performed at a remote computing device such as a server. The method 600 may be used to detect damage to any of various types of objects. However, for the purpose of illustration, many examples discussed herein will be described with reference to vehicles.

A request to detect damage to an object is received at 606. In some implementations, the request to detect damage may be received at a mobile computing device such as a smart phone. In particular embodiments, the object may be a vehicle such as a car, truck, or sports utility vehicle.

In some implementations, the request to detect damage may include or reference input data. The input data may include one or more images of the object captured from different perspectives. Alternatively, or additionally, the input data may include video data of the object. In addition to visual data, the input data may also include other types of data, such as IMU data.

An image is selected for damage aggregation analysis at 604. According to various embodiments, the image may be captured at a mobile computing device such as a mobile phone. In some instances, the image may be a view in a multi-view capture. A multi-view capture may include different images of the object captured from different perspectives. For instance, different images of the same object may be captured from different angles and heights relative to the object.

In some implementations, images may be selected in any suitable order. For example, images may be analyzed sequentially, in parallel, or in some other order. As another example, images may be analyzed live as they are captured by a mobile computing device, or in order of their capture.

In particular embodiments, selecting an image for analysis may involve capturing an image. According to various embodiments, capturing the image of the object may involve receiving data from one or more of various sensors. Such sensors may include, but are not limited to, one or more cameras, depth sensors, accelerometers, and/or gyroscopes. The sensor data may include, but is not limited to, visual data, motion data, and/or orientation data. In some configurations, more than one image of the object may be captured. Alternatively, or additionally, video footage may be captured.

At 606, damage to the object is detected. According to various embodiments, damage may be detected by applying a neural network to the selected image. The neural network may identify damage to the object included in the image. In particular embodiments, the damage may be represented as a heatmap. The damage information may identify the damage type and/or severity. For example, the damage information may identify damage as being light, moderate, or severe. As another example, the damage information may identify the damage as a dent or a scratch.

A mapping of the selected perspective view image to a standard view is determined at 608, and detected damage is mapped to the standard view at 610. In some embodiments, the standard view may be determined based on user input. For example, the user may identify a vehicle in general or a car, truck, or sports utility vehicle in particular as the object type.

In particular embodiments, a standard view may be determined by performing object recognition on the object represented in the perspective view image. The object type may then be used to select a standard image for that particular object type. Alternately, a standard view specific to the object represented in the perspective view may be retrieved. For example, a top-down view, 2D skeleton, or 3D model may be constructed for the object at an earlier point in time before damage has occurred.

In some embodiments, damage mapping may be performed by using the mapping of the selected perspective view image to the standard view to map the damage detected at 606 to the standard view. For example, heatmap colors may be mapped from the perspective view to their corresponding locations on the standard view. As another example, damage severity and/or type information may be mapped from the perspective view to the standard view in a similar fashion.

In some implementations, a standard view may be a top-down view of the object that shows the top and the sides of the object. A mapping procedure may then map each point in the image to a corresponding point in the top-down view. Alternately, or additionally, a mapping procedure may map each point in the top-down view to a corresponding point in the perspective view image.

In some embodiments, a neural network may estimate 2D skeleton joints for the image. Then, a predefined mapping may be used to map from the perspective view image to the standard image (e.g., the top-down view). For instance, the predefined mapping may be defined based on triangles determined by the 2D joints.

In some implementations, a neural network may predict a mapping between a 3D model (such as a CAD model) and the selected perspective view image. The damage may then be mapped to, and aggregated on, the texture map of the 3D model. In particular embodiments, the constructed and mapped 3D model may then be compared with a ground truth 3D model.

According to various embodiments, the ground truth 3D model may be a standard 3D model for all objects of the type represented, or may be constructed based on an initial set of perspective view images captured before damage is detected. Comparisons of the reconstructed 3D model to the expected 3D model may be used as an additional input source or weight during aggregate damage estimation. Such techniques may be used in conjunction with live, pre-recorded, or guided image selection and analysis.

According to various embodiments, skeleton detection may involve one or more of a variety of techniques. Such techniques may include, but are not limited to: 2D skeleton detection using machine learning, 3D pose estimation, and 3D reconstruction of a skeleton from one or more 2D skeletons and/or poses. Additional details regarding skeleton detection and other features are discussed in co-pending and commonly assigned U.S. patent application Ser. No. 15/427, 026, titled "Skeleton Detection and Tracking via Client-server Communication" by Holzer et al, filed Feb. 7, 2017, which is hereby incorporated by reference in its entirety and for all purposes.

Damage information is aggregated on the standard view at 616. According to various embodiments, aggregating damage on the standard view may involve combining the damage mapped at operation 610 with damage mapped for other perspective view images. For example, damage values for the same component from different perspective view images may be summed, averaged, or otherwise combined.

In some implementations, aggregating damage on the standard view may involve creating a heatmap or other visual representation on the standard view. For example, damage to a portion of the object may be represented by changing the color of that portion of the object in the standard view.

According to various embodiments, aggregating damage on the standard view may involve mapping damage back to one or more perspective view images. For instance, damage to a portion of the object may be determined by aggregating damage detection information from several perspective view images. That aggregated information may then be mapped back to the perspective view images. Once mapped back, the aggregated information may be included as a layer or overlay in an independent image and/or a multi-view capture of the object.

Damage probability information is updated based on the selected image at 614. According to various embodiments, the damage probability information may identify a degree of certainty with which detected damage is ascertained. For instance, in a given perspective view it may be difficult to determine with certainty whether a particular image of an object portion depicts damage to the object or glare from a reflected light source. Accordingly, detected damage may be assigned a probability or other indication of certainty. However, the probability may be resolved to a value closer to zero or one with analysis of different perspective views of the same object portion.

In particular embodiments, the probability information for aggregated damage information in standard view may be updated based on from which views the damage was detected. For example, damage likelihood may increase if it is detected from multiple viewpoints. As another example, damage likelihood may increase if it is detected from one or more close-up views. As another example, damage likelihood may decrease if damage is only detected in one viewpoint but not in others. As yet another example, different results may be used to "vote" on a common representation.

If the determination is made to capture an additional image, then at 616 guidance for additional viewpoint capture is provided. In some implementations, the image collection guidance may include any suitable instructions for capturing an additional image that may assist in resolving uncertainty. Such guidance may include an indication to capture an additional image from a targeted viewpoint, to capture an additional image of a designated portion of the object, or to capture an additional image at a different level of clarity or detail. For example, if possible damage is detected, then feedback may be provided to capture additional detail at the damaged location.

In some implementations, the guidance for additional viewpoint capture may be provided so as to resolve damage probability information as discussed with respect to the operation 614. For example, if the damage probability information is very high (e.g., 90+%) or very low (e.g., 10–%) for a given object component, additional viewpoint capture may be unnecessary. However, if damage probability information is relatively indeterminate (e.g., 50%), then capturing an additional image may help to resolve the damage probability.

In particular embodiments, the thresholds for determining whether to provide guidance for an additional image may be strategically determined based on any of a variety of considerations. For example, the threshold may be determined based on the number of images of the object or object component that have been previously captured. As another example, the threshold may be specified by a systems administrator.

According to various embodiments, the image collection feedback may include any suitable instructions or information for assisting a user in collecting additional images. Such guidance may include, but is not limited to, instructions to collect an image at a targeted camera position, orientation, or zoom level. Alternatively, or additionally, a user may be presented with instructions to capture a designated number of images or an image of a designated portion of the object.

For example, a user may be presented with a graphical guide to assist the user in capturing an additional image from a target perspective. As another example, a user may be presented with written or verbal instructions to guide the user in capturing an additional image. Additional techniques for determining and providing recording guidance as well as other related features are described in co-pending and commonly assigned U.S. patent application Ser. No. 15/992,546, titled "Providing Recording Guidance in Generating a Multi-View Interactive Digital Media Representation", filed May 30, 2018 by Holzer et al.

At 618, a determination is made as to whether to select an additional image for analysis. In some implementations, the determination may be made at least in part based on an analysis of the one or more images that have already been captured. If the damage analysis is inconclusive, then an additional image may be captured for analysis. Alternately, each available image may be analyzed.

In some embodiments, the system may analyze the captured image or images to determine whether a sufficient portion of the object has been captured in sufficient detail to support damage analysis. For example, the system may analyze the capture image or images to determine whether the object is depicted from all sides. As another example, the system may analyze the capture image or images to determine whether each panel or portion of the object is shown in a sufficient amount of detail. As yet another example, the system may analyze the capture image or images to determine whether each panel or portion of the object is shown from a sufficient number of viewpoints.

When it is determined to not select an additional image for analysis, then at 660 the damage information is stored. For example, the damage information may be stored on a storage device. Alternatively, or additionally, the images may be transmitted to a remote location via a network interface.

In particular embodiments, the operations shown in FIG. 6 may be performed in an order different than that shown. For example, damage to the object may be detected at 606 after mapping an image to a standard view at 610. In this way, the damage detection procedure may be tailored to the particular portion of the object reflected in the image.

In some implementations, the method shown in FIG. 6 may include one or more operations other than those shown in FIG. 6. For example, the damage detection operation discussed with respect to 606 may include one or more procedures for identifying the object or object component included in the selected image. Such a procedure may include, for instance, a neural network trained to identify object components.

Figure 7:
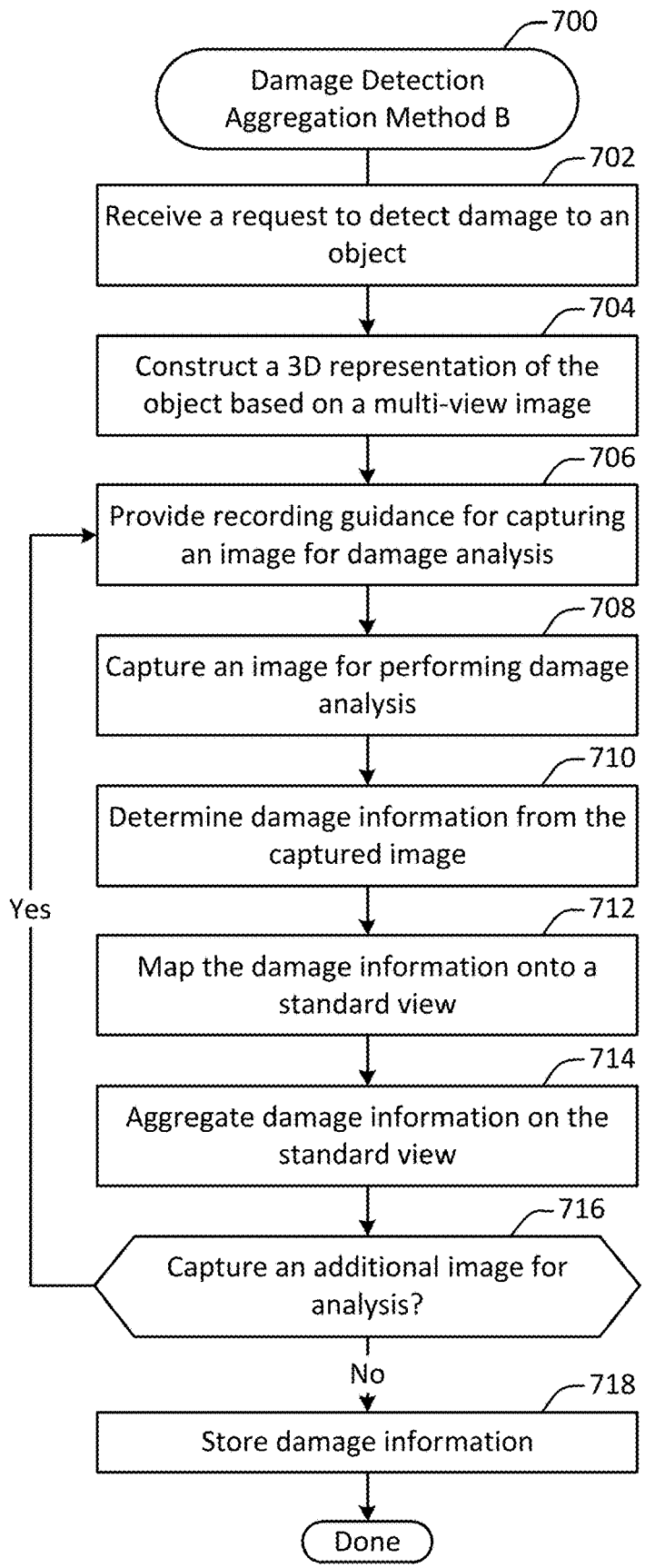
FIG. 7 illustrates a particular example of a damage detection aggregation method, performed in accordance with one or more embodiments.

FIG. 7 illustrates a method 700 for aggregating detected damage to an object, performed in accordance with one or more embodiments. According to various embodiments, the method 700 may be performed at a mobile computing device such as a smart phone. The smart phone may be in communication with a remote server. The method 700 may be used to detect damage to any of various types of objects. However, for the purpose of illustration, many examples discussed herein will be described with reference to vehicles.

FIG. 7 may be used to perform live aggregation of damage detection. By doing a live aggregation of damage detection, the system may obtain a better estimate on which parts of a car are damaged and which aren't. Additionally, based on this the system can guide the user directly to capture more data in order to improve the estimate. According to various embodiments, one or more of the operations discussed with respect to FIG. 7 may be substantially similar to corresponding operations discussed with respect to FIG. 6.

A request to detect damage to an object is received at 702. In some implementations, the request to detect damage may be received at a mobile computing device such as a smart phone. In particular embodiments, the object may be a vehicle such as a car, truck, or sports utility vehicle.

In some implementations, the request to detect damage may include or reference input data. The input data may include one or more images of the object captured from different perspectives. Alternatively, or additionally, the input data may include video data of the object. In addition to visual data, the input data may also include other types of data, such as IMU data.

A 3D representation of the object based on a multi-view image is determined at 704. According to various embodiments, the multi-view representation may be predetermined and retrieved at 704. Alternately, the multi-view representation may be created at 704. For instance, the multi-view representation may be created based on input data collected at a mobile computing device.

In some implementations, the multi-view representation may be a 360-degree view of the object. Alternately, the multi-view representation may be a partial representation of the object. According to various embodiments, the multi-view representation may be used to construct a 3D representation of the object. For example, 3D skeleton detection may be performed on the multi-view representation including a plurality of images.

At 706, recording guidance for capturing an image for damage analysis is provided. In some implementations, the recording guidance may guide a user to position a camera to one or more specific positions. Images may then be captured from these positions. The recording guidance may be provided in any of a variety of ways. For example, the user may be guided to position the camera to align with one or more perspective view images in a pre-recorded multi-view capture of a similar object. As another example, the user may be guided to position the camera to align with one or more perspective views of a three-dimensional model.

An image for performing damage analysis is captured at 708. According to various embodiments, the recording guidance may be provided as part of a live session for damage detection and aggregation. The recording guidance may be used to align the live camera view at the mobile computing device with the 3D representation.

In some implementations, recording guidance may be used to guide a user to capture a specific part of an object in a specific way. For example, recording guidance may be used to guide a user to capture a closeup of the left front door of a vehicle.

Damage information from the captured image is determined at 710. According to various embodiments, damage may be detected by applying a neural network to the selected image. The neural network may identify damage to the object included in the image. In particular embodiments, the damage may be represented as a heatmap. The damage information may identify the damage type and/or severity. For example, the damage information may identify damage as being light, moderate, or severe. As another example, the damage information may identify the damage as a dent or a scratch.

The damage information is mapped onto a standard view at 712. According to various embodiments, mobile device and/or camera alignment information may be used to map damage detection data onto a 3D representation. Alternately, or additionally, a 3D representation may be used to map detected damage onto the top-down view. For example, a pre-recorded multi-view capture, predetermined 3D model, or dynamically determined 3D model may be used to create a mapping from one or more perspective view images to the standard view.

The damage information is aggregated on the standard view at 714. In some implementations, aggregating damage on the standard view may involve creating a heatmap or other visual representation on the standard view. For example, damage to a portion of the object may be represented by changing the color of that portion of the object in the standard view.

According to various embodiments, aggregating damage on the standard view may involve mapping damage back to one or more perspective view images. For instance, damage to a portion of the object may be determined by aggregating damage detection information from several perspective view images. That aggregated information may then be mapped back to the perspective view images. Once mapped back, the aggregated information may be included as a layer or overlay in an independent image and/or a multi-view capture of the object.

At 716, a determination is made as to whether to capture an additional image for analysis. According to various embodiments, additional images may be captured for analysis until enough data is captured that the degree of certainty about detected damage falls above or below a designated threshold. Alternately, additional images may be captured for analysis until the device stops recording.

When it is determined to not select an additional image for analysis, then at 718 the damage information is stored. For example, the damage information may be stored on a storage device. Alternatively, or additionally, the images may be transmitted to a remote location via a network interface.

In particular embodiments, the operations shown in FIG. 7 may be performed in an order different than that shown. For example, damage to the object may be detected at 710 after mapping an image to a standard view at 712. In this way, the damage detection procedure may be tailored to the particular portion of the object reflected in the image.

In some implementations, the method shown in FIG. 7 may include one or more operations other than those shown in FIG. 7. For example, the damage detection operation discussed with respect to 710 may include one or more procedures for identifying the object or object component included in the selected image. Such a procedure may include, for instance, a neural network trained to identify object components.

Figure 8:
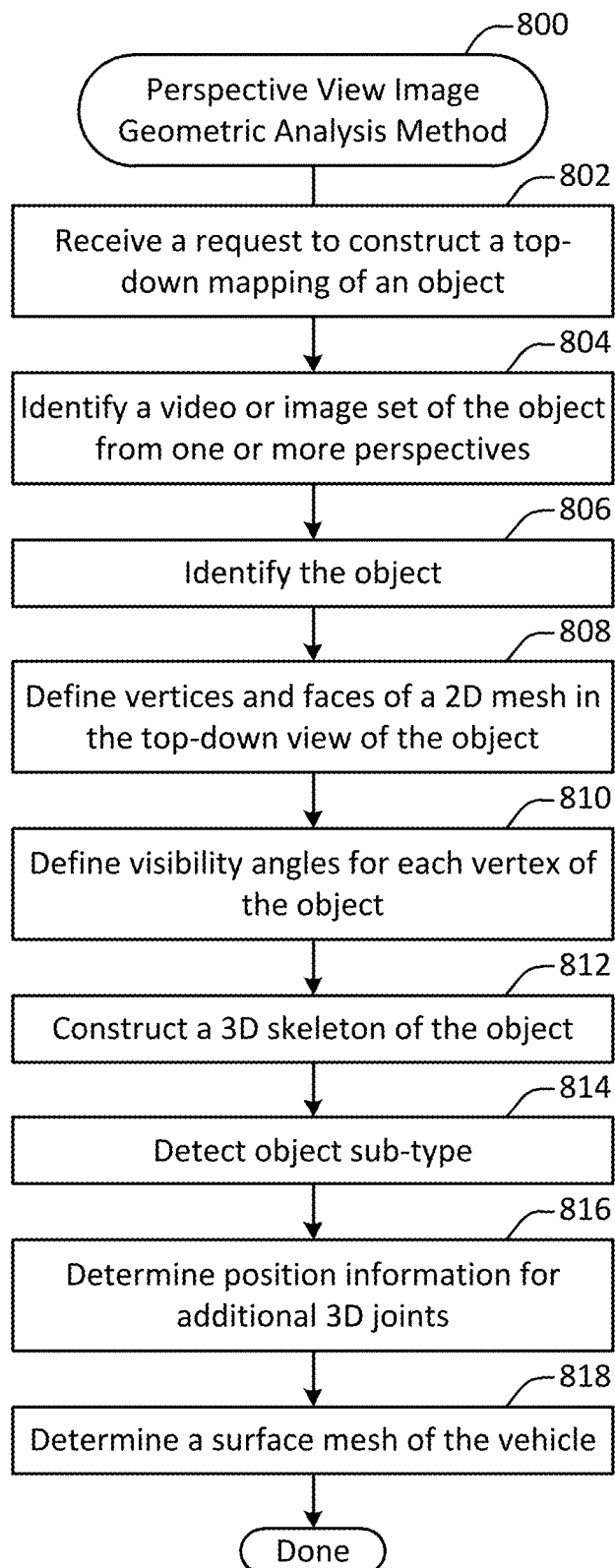
FIG. 8 illustrates one example of a method for performing geometric analysis of a perspective view image, performed in accordance with one or more embodiments.

FIG. 8 illustrates one example of a method 800 for performing geometric analysis of a perspective view image, performed in accordance with one or more embodiments. The method 800 may be performed on any suitable computing device. For example, the method 800 may be performed on a mobile computing device such as a smart phone. Alternately, or additionally, the method 800 may be performed on a remote server in communication with a mobile computing device.

A request to construct a top-down mapping of an object is received at 802. According to various embodiments, the request may be received at a user interface. At 804, a video or image set of the object captured from one or more perspectives is identified. The video or image set is referred to herein as "source data". According to various embodiments, the source data may include a 360-degree view of the object. Alternately, the source data may include a view that has less than 360-degree coverage.

In some embodiments, the source data may include data captured from a camera. For example, the camera may be located on a mobile computing device such a mobile phone. As another example, one or more traditional cameras may be used to capture such information.

In some implementations, the source data may include data collected from an inertial measurement unit (IMU). IMU data may include information such as camera location, camera angle, device velocity, device acceleration, or any of a wide variety of data collected from accelerometers or other such sensors.

The object is identified at 806. In some implementations, the object may be identified based on user input. For example, a user may identify the object as a vehicle or person via a user interface component such as a drop-down menu.

In some embodiments, the object may be identified based on image recognition. For example, the source data may be analyzed to determine that the subject of the source data is a vehicle, a person, or another such object. The source data may include a variety of image data. However, in case of a multi-view capture the source data focuses in a particular object from different viewpoints, the image recognition procedure may identify commonalities between the different perspective views to isolate the object that is the subject of the source data from other objects that are present in some portion of the source data but not in other portions of the source data.

At 808, vertices and faces of a 2D mesh are defined in the top-down view of the object. According to various embodiments, each face may represent a part of the object surface that could be approximated as being planar. For example, when a vehicle is captured in the source data, the vehicle's door panel or roof may be represented as a face in a 2D mesh because the door and roof are approximately planar despite being slightly curved.

In some embodiments, vertices and faces of a 2D mesh may be identified by analyzing the source data. Alternately, or additionally, the identification of the object at 206 may allow for the retrieval of a predetermined 2D mesh. For example, a vehicle object may be associated with a default 2D mesh that may be retrieved upon request.

Visibility angles are determined for each vertex of the object at 810. According to various embodiments, a visibility angle indicates the range of object angles with respect to the camera for which the vertex is visible. In some embodiments, visibility angles of a 2D mesh may be identified by analyzing the source data. Alternately, or additionally, the identification of the object at 806 may allow for the retrieval of predetermined visibility angle along with a predetermined 2D mesh. For example, a vehicle object may be associated with a default 2D mesh with associated visibility angle that may be retrieved upon request.

A 3D skeleton of the object is constructed at 812. According to various embodiments, constructing a 3D skeleton may involve any of a variety of operations. For example, 2D skeleton detection may be performed on every frame using a machine learning procedure. As another example, 3D camera pose estimation may be performed to determine a location and angle of the camera with respect to the object for a particular frame. As yet another example, a 3D skeleton may be reconstructed from 2D skeletons and or poses. Additional details regarding skeleton detection are discussed in co-pending and commonly assigned U.S. patent application Ser. No. 15/427,026, titled "Skeleton Detection and Tracking via Client-server Communication" by Holzer et al, filed Feb. 7, 2017, which is hereby incorporated by reference in its entirety and for all purposes.

Figure 9:
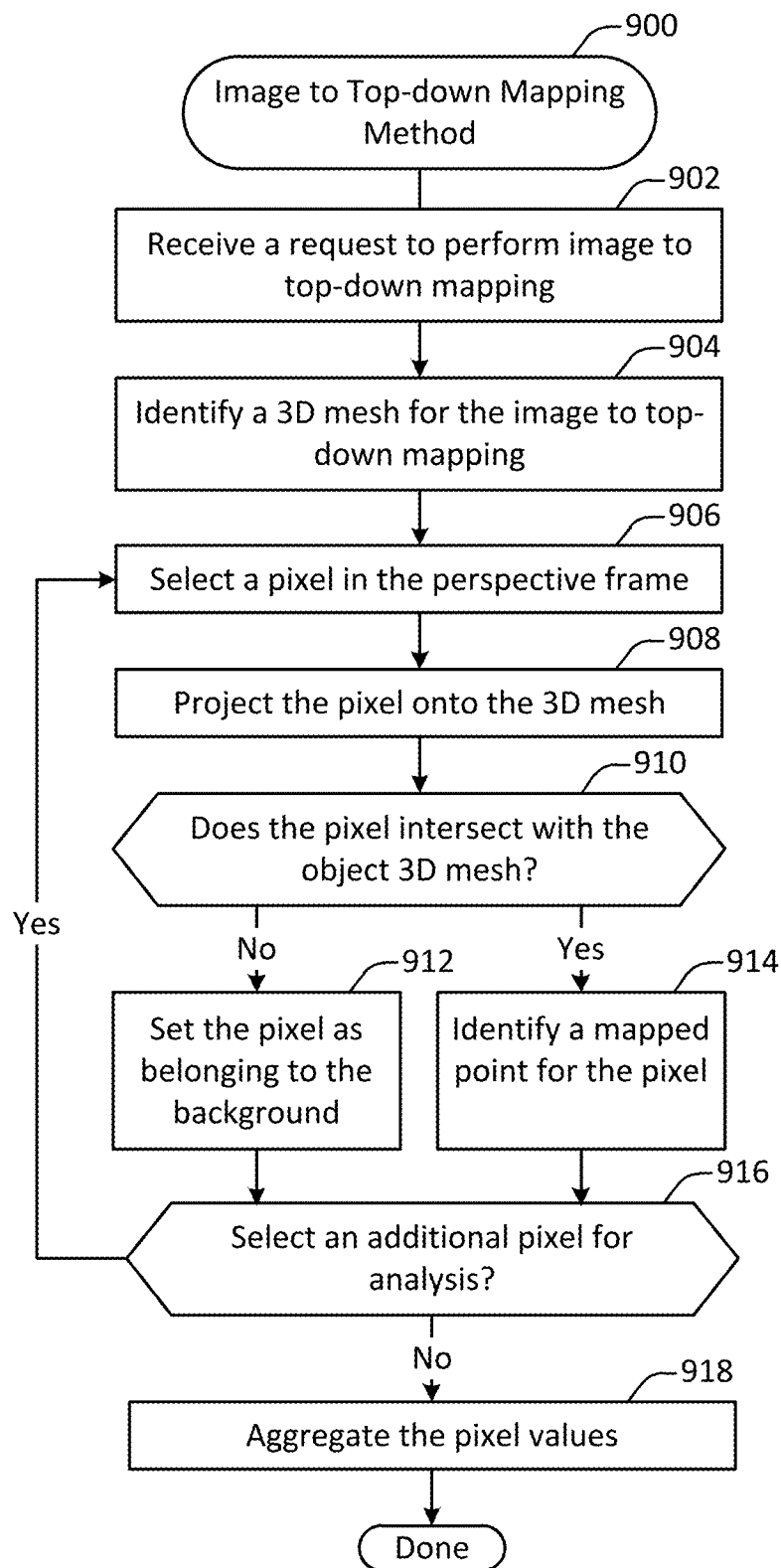
FIG. 9 illustrates one example of a method for performing perspective image to top-down view mapping, performed in accordance with one or more embodiments.

FIG. 9 illustrates one example of a method 900 for performing perspective image to top-down view mapping, performed in accordance with one or more embodiments. In some embodiments, the method 900 may be performed to map each pixel of an object represented in a perspective view to the corresponding point in a predefined top-down view of that class of objects.

The method 900 may be performed on any suitable computing device. For example, the method 900 may be performed on a mobile computing device such as a smart phone. Alternately, or additionally, the method 900 may be performed on a remote server in communication with a mobile computing device.

A request to construct a top-down mapping of an object is received at 902. According to various embodiments, the request may be generated after the performance of geometric analysis as discussed with respect to the method 800 shown in FIG. 8. The request may identify one or more images for which to perform the top-down mapping.

A 3D mesh for the image to top-down mapping is identified at 904. The 3D mesh may provide a three-dimensional representation of the object and serve as an intervening representation between the actual perspective view image and the top-down view.

At 906, a pixel in the perspective frame is selected for analysis. According to various embodiments, pixels may be selected in any suitable order. For example, pixels may be selected sequentially. As another example, pixels may be selected based on characteristics such as location or color. Such a selection process may facilitate faster analysis by focusing the analysis on portions of the image most likely to be present in the 3D mesh.

The pixel is projected onto the 3D mesh at 908. In some implementations, projecting the pixel onto the 3D mesh may involve simulating a camera ray passing by the pixel position in the image plan and into the 3D mesh. Upon simulating such a camera ray, barycentric coordinates of the intersection point with respect to the vertices of the intersection face may be extracted.

A determination is made at 910 as to whether the pixel intersects with the object 3D mesh. If the pixel does not intersect with the object 3D mesh, then at 912 the pixel is set as belonging to the background. If instead the pixel does intersect with the object 3D mesh, then at 914 a mapped point is identified for the pixel. According to various embodiments, a mapped point may be identified by applying the barycentric coordinates as weights for the vertices of the corresponding intersection face in the top-down image.

In some embodiments, a machine learning approach may be used to perform image to top-down mapping on a single image. For example, a machine learning algorithm such as deep net may be run on the perspective image as a whole. The machine learning algorithm may identify 2D locations of each pixel (or a subset of them) in the top-down image.

In some implementations, a machine learning approach may be used to perform top-down to image mapping. For example, given a perspective image and a point of interest in the top-down image, the machine learning algorithm may be run on the perspective image for identifying the top-down locations of its points. Then, the point of interest in the top-down image may be mapped to the perspective image.

In some embodiments, mapping the point of interest in the top-down image to the perspective image may involve first selecting the points in the perspective image whose top-down mapping is closest to the interest point. Then, the selected points in the perspective image may be interpolated.

Figure 13:
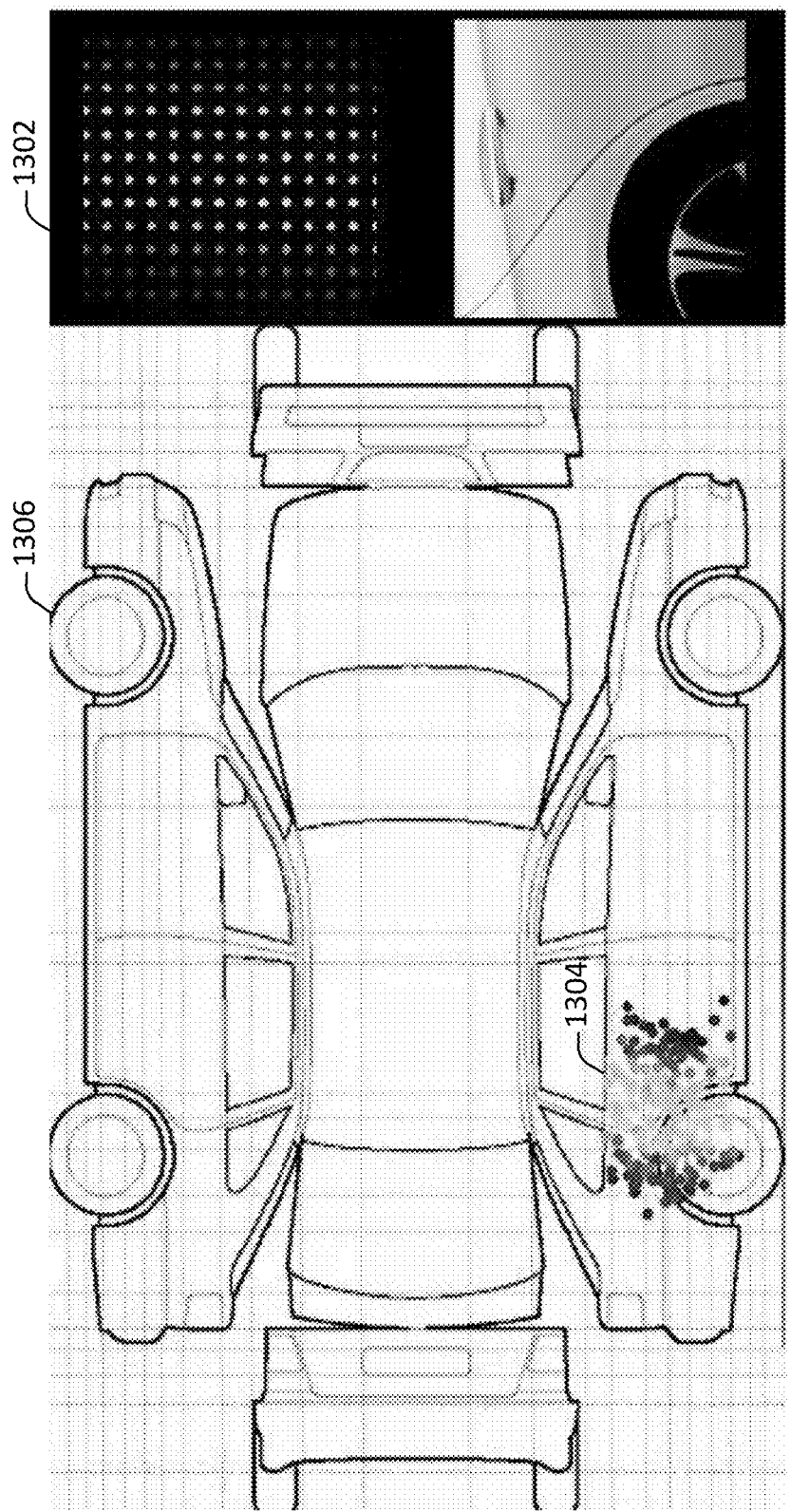
FIG. 13, FIG. 14, and FIG. 15 illustrate images processed in accordance with one or more embodiments.
Figure 14:
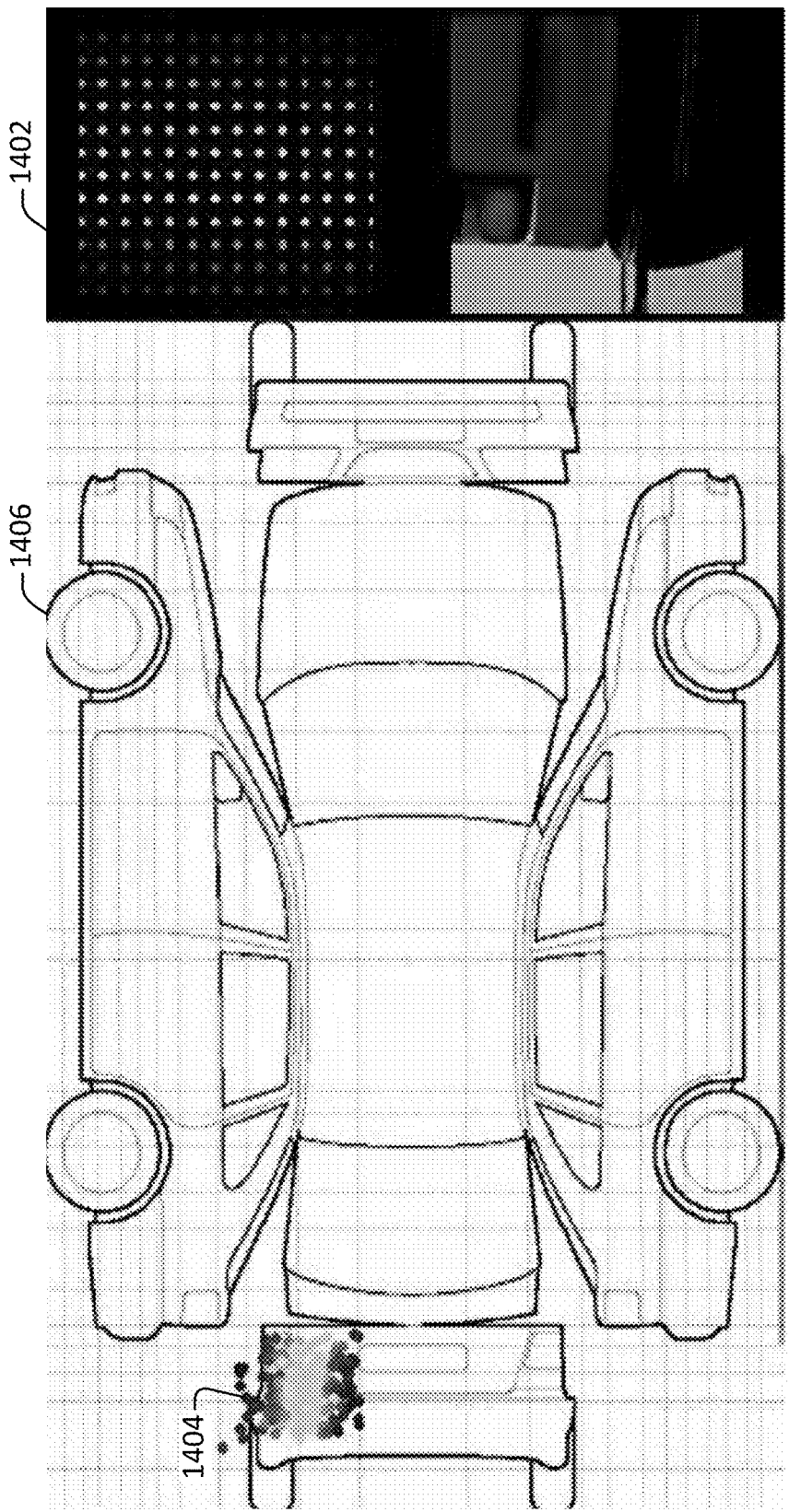
Figure 15:
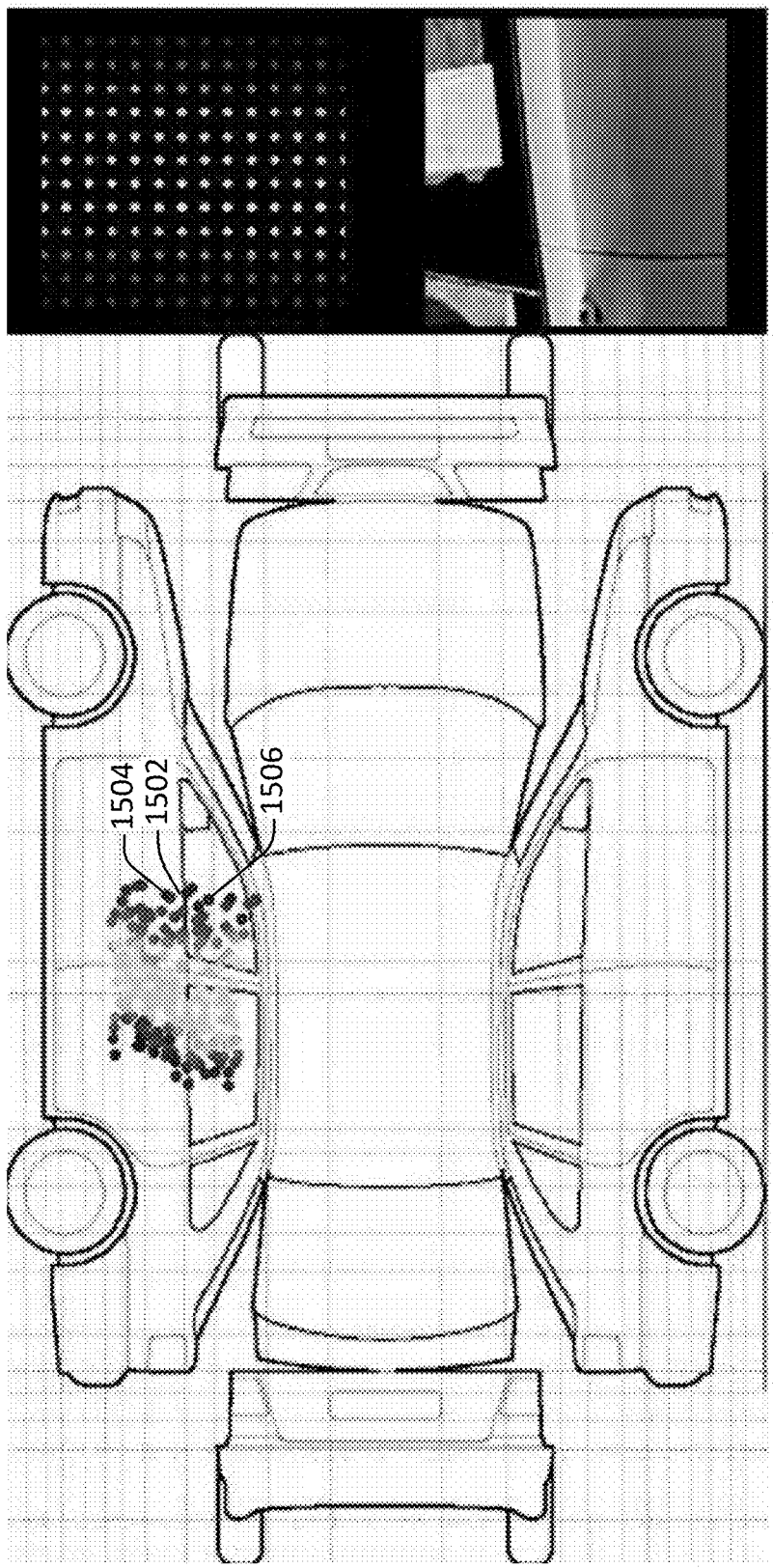

Examples of an image to top-down mapping are shown in FIGS. 13, 14, and 15. The locations of pixels in images of vehicle components are represented by colored dots. These dot locations are mapped from fixed locations 1302 in the perspective view to corresponding locations 1304 on the top-down view 1306. FIG. 14 shows a similar arrangement, with fixed locations 1402 in the perspective view mapped to corresponding locations 1404 in the top-down view 1406. For example, in FIG. 13, the color coding corresponds to the location of the points in the image. A similar procedure may be performed in reverse to map from the top-down view to the perspective view.

In some implementations, a point of interest may be mapped as a weighted average of nearby points. For example, in FIG. 15, the mapping of any particular point, such as 1502, may depend on the value of nearby points, such as 1504 and 1506, drawn from the mapped location in perspective view.

Returning to FIG. 9, as an alternative to operations 906-910, the projections of the 3D skeleton joints faces may be used together with the corresponding joints and faces in the top-down view to directly define image transformations that map pixel information from the perspective views into the top-down view and vice versa.

A determination is made at 916 as to whether to select an additional pixel for analysis. According to various embodiments, analysis may continue until all pixels or a suitable number of pixels are mapped. As discussed with respect to operation 906, pixels may be analyzed in sequence, in parallel, or in any suitable order.

Optionally, the computed pixel values are aggregated at 918. According to various embodiments, aggregating the computing pixel values may involve, for example, storing a cohesive pixel map on a storage device or memory module.

According to various embodiments, one or more of the operations shown in FIG. 9 may be omitted. For example, a pixel may be ignored rather than setting it as a background pixel at 912. In some implementations, one or more of the operations may be performed in an order different from that shown in FIG. 9. For example, pixel values may be aggregated cumulatively during pixel analysis. As another example, pixel values may be determined in parallel.

Figure 10:
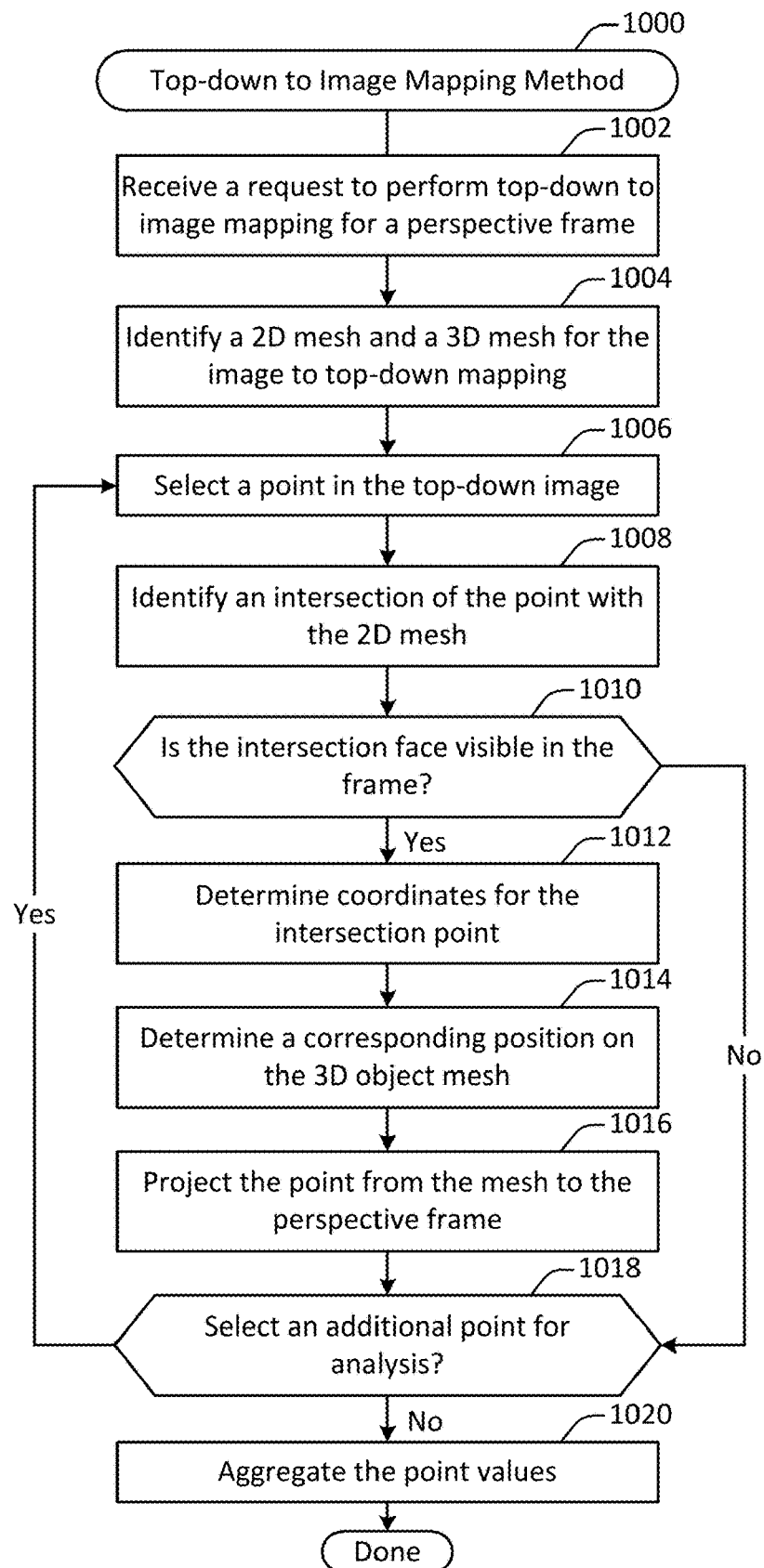
FIG. 10 illustrates one example of a method for performing top-down view to perspective image mapping, performed in accordance with one or more embodiments.

FIG. 10 illustrates one example of a method 1000 for performing top-down view to perspective image mapping, performed in accordance with one or more embodiments. According to various embodiments, top-down to image mapping refers to finding in a perspective image the position points from a top-down image.

The method 1000 may be performed on any suitable computing device. For example, the method 1000 may be performed on a mobile computing device such as a smart phone. Alternately, or additionally, the method 1000 may be performed on a remote server in communication with a mobile computing device.

At 1002, a request to perform top-down to image mapping is received for a perspective frame. At 1004, a 2D mesh and 3D mesh are identified. for the perspective image to top-down mapping. A 3D mesh is also referred to herein as a 3D skeleton.

At 1006, a point in the top-down image is selected for analysis. According to various embodiments, points may be selected in any suitable order. For example, points may be selected sequentially. As another example, points may be selected based on characteristics such as location. For example, points may be selected within a designated face before moving on to the next face of the top-down image.

At 1008, an intersection of the point with the 2D mesh is identified. A determination is then made at 1010 as to whether the intersection face is visible in the frame. According to various embodiments, the determination may be made in part by checking one or more visibility ranges determined in the preliminary step for the vertices of the intersection face. If the intersection face is not visible, then the point may be discarded.

If the intersection face is visible, then at 1012 coordinates for the intersection point are determined. According to various embodiments, determining coordinate points may involve, for example, extracting barycentric coordinates for the point with respect to the vertices of the intersection face.

A corresponding position on the 3D object mesh is determined at 1014. According to various embodiments, the position may be determined by applying the barycentric coordinates as weights for the vertices of the corresponding intersection face in the object 3D mesh.

The point is projected from the mesh to the perspective frame at 1016. In some implementations, projecting the point may involve evaluating the camera pose and/or the object 3D mesh for the frame. For example, the camera pose may be used to determine an angle and/or position of the camera to facilitate the point projection.

FIG. 11 illustrates a method for analyzing object coverage, performed in accordance with one or more embodiments. According to various embodiments, the method 1100 may be performed at a mobile computing device such as a smart phone. The smart phone may be in communication with a remote server. The method 1100 may be used to detect coverage in a set of images and/or a multi-view representation of any of various types of objects. However, for the purpose of illustration, many examples discussed herein will be described with reference to vehicles.

A request to determine coverage of an object is received at 1102. In some implementations, the request to determine coverage may be received at a mobile computing device such as a smart phone. In particular embodiments, the object may be a vehicle such as a car, truck, or sports utility vehicle.

In some implementations, the request to determine coverage may include or reference input data. The input data may include one or more images of the object captured from different perspectives. Alternatively, or additionally, the input data may include video data of the object. In addition to visual data, the input data may also include other types of data, such as IMU data.

One or more images are pre-processed at 1104. According to various embodiments, one or more images may be pre-processed in order to perform operations such as skeleton detection, object recognition, or 3D mesh reconstruction. For some such operations, input data from more than one perspective view image may be used.

In some implementations, skeleton detection may involve one or more of a variety of techniques. Such techniques may include, but are not limited to: 2D skeleton detection using machine learning, 3D pose estimation, and 3D reconstruction of a skeleton from one or more 2D skeletons and/or poses. Additional details regarding skeleton detection and other features are discussed in co-pending and commonly assigned U.S. patent application Ser. No. 15/427,026, titled "Skeleton Detection and Tracking via Client-server Communication" by Holzer et al, filed Feb. 7, 2017, which is hereby incorporated by reference in its entirety and for all purposes.

According to various embodiments, a 3D representation of an object such as a 3D mesh, potentially with an associated texture map, may be reconstructed. Alternately, the 3D representation may be a mesh based on a 3D skeleton that has a mapping to the top-down mapping defined. When generating a 3D mesh representation, per-frame segmentation and/or space carving based on estimated 3D poses of the cameras corresponding to those frames may be performed. In the case of a 3D skeleton, such operations may be performed using a neural network that directly estimates a 3D skeleton for a given frame or from a neural network that estimates 2D skeleton joint locations for each frame and then use poses for all camera viewpoints to triangulate the 3D skeleton.

According to various embodiments, a standard 3D model may be used for all objects of the type represented, or may be constructed based on an initial set of perspective view images captured before damage is detected. Such techniques may be used in conjunction with live, pre-recorded, or guided image selection and analysis.

An image is selected for object coverage analysis at 1106. According to various embodiments, the image may be captured at a mobile computing device such as a mobile phone. In some instances, the image may be a view in a multi-view capture. A multi-view capture may include different images of the object captured from different perspectives. For instance, different images of the same object may be captured from different angles and heights relative to the object.

In some implementations, images may be selected in any suitable order. For example, images may be analyzed sequentially, in parallel, or in some other order. As another example, images may be analyzed live as they are captured by a mobile computing device, or in order of their capture.

In particular embodiments, selecting an image for analysis may involve capturing an image. According to various embodiments, capturing the image of the object may involve receiving data from one or more of various sensors. Such sensors may include, but are not limited to, one or more cameras, depth sensors, accelerometers, and/or gyroscopes. The sensor data may include, but is not limited to, visual data, motion data, and/or orientation data. In some configurations, more than one image of the object may be captured. Alternatively, or additionally, video footage may be captured.

A mapping of the selected perspective view image to a standard view is determined at 1108. In some embodiments, the standard view may be determined based on user input.

For example, the user may identify a vehicle in general or a car, truck, or sports utility vehicle in particular as the object type.

In some implementations, a standard view may be a top-down view of the object that shows the top and the sides of the object. A mapping procedure may then map each point in the image to a corresponding point in the top-down view. Alternately, or additionally, a mapping procedure may map each point in the top-down view to a corresponding point in the perspective view image.

According to various embodiments, a standard view may be determined by performing object recognition. The object type may then be used to select a standard image for that particular object type. Alternately, a standard view specific to the object represented in the perspective view may be retrieved. For example, a top-down view, 2D skeleton, or 3D model may be constructed for the object.

In some embodiments, a neural network may estimate 2D skeleton joints for the image. Then, a predefined mapping may be used to map from the perspective view image to the standard image (e.g., the top-down view). For instance, the predefined mapping may be defined based on triangles determined by the 2D joints.

In some implementations, a neural network may predict a mapping between a 3D model (such as a CAD model) and the selected perspective view image. The coverage may then be mapped to, and aggregated on, the texture map of the 3D model.

Object coverage for the selected image is determined at 1110. According to various embodiments, object coverage may be determined by analyzing the portion of the standard view on which the perspective view image has been mapped.

As another example, an object or top-down image of an object may be divided into a number of components or portions. A vehicle, for instance, may be divided into doors, a windshield, wheels, and other such parts. For each part to which at least a portion of the perspective view image has been mapped, a determination may be made as to whether the part is sufficiently covered by the image. This determination may involve operations such as determining whether any sub-portions of the object component are lacking a designated number of mapped pixels.

In particular embodiments, object coverage may be determined by identifying an area that includes some or all of the mapped pixels. The identified area may then be used to aggregate coverage across different images.

In some embodiments, a grid or other set of guidelines may be overlaid on the top-down view. The grid may be composed of identical rectangles or other shapes. Alternately, the grid may be composed of portions of different sizes. For example, in the image shown in FIG. 14, portions of the object that include greater variation and detail, such as the headlights, are associated with relatively smaller grid portions.

In some implementations, grid density may represent a tradeoff between various considerations. For example, if the grid is too fine, then false negative errors may occur because noise in perspective view image mapping may mean many grid cells are incorrectly identified as not being represented in the perspective view image because no pixels are mapped to the grid cell. However, if the grid is too coarse, then false positive errors may occur because relatively many pixels may map to a large grid portion even if a subportion of the large grid portion is not adequately represented.

In particular embodiments, the size of a grid portion may be strategically determined based on characteristics such as the image resolution, computing device processing power, number of images, level of detail in the object, feature size at a particular object portion, or other such considerations.

In particular embodiments, an indication of coverage evaluation may be determined for the selected image for each grid portion. The indication of coverage evaluation may include one or more components. For example, the indication of coverage evaluation may include a primary value such as a probability value identifying a probability that a given grid portion is represented in the selected image. As another example, the indication of coverage evaluation may include a secondary value such as an uncertainty value or standard error value identifying a degree of uncertainty surrounding the primary value. A value included in an indication of coverage may be modeled as a continuous, discrete, or binary value.

In particular embodiments, an uncertainty value or standard error value may be used to aggregate across different frames. For example, a low degree of confidence about the coverage of the front right door from a particular image would lead to a high uncertainty value, which may lead to a lower weight attributed to the particular image while determining aggregate coverage of the front right door.

In some implementations, the indication of coverage evaluation for a selected image and a given grid portion may be affected by any of a variety of considerations. For example, a given grid portion may be associated with a relatively higher probability of coverage in a selected image if the selected image includes a relatively higher number of pixels that map to the given grid portion. As another example, a pixel may be up-weighted in terms of its effect on coverage estimation if the image or image portion in which the pixel is included is captured from a relatively closer distance to the object. As yet another example, a pixel may be down-weighted in terms of its effect on coverage estimation if the image or image portion in which the pixel is included is captured from an oblique angle. In contrast, a pixel may be up-weighted in terms of its effect on coverage estimation if the image or image portion in which the pixel is included is captured from angle closer to 90 degrees.

In particular embodiments, a probability value and an uncertainty value for a grid may depend on factors such as the number and probability of pixel values assigned to the grid cell. For example, if N pixels end up in a grid cell with their associated scores, the probability of coverage may be modeled as the mean probability score of the N pixels, while the uncertainty value may be modeled as the standard deviation of the N pixels. As another example, if N pixels end up in a grid cell with their associated scores, the probability of coverage may be modeled as N times the mean probability score of the N pixels, while the uncertainty value may be modeled as the standard deviation of the N pixels.

At 1112, a determination is made as to whether to select an additional image for analysis. According to various embodiments, each image may be analyzed in sequence, in parallel, or in any suitable order. Alternately, or additionally, images may be analyzed until one or more component-level and/or aggregate coverage levels meet a designated threshold.

An aggregated coverage estimate is determined for the selected object at 1114. In some embodiments, determining an aggregated coverage estimate may involve overlaying on the standard view of the object different pixel mappings determined at 1108 for different images. Then, the same types of techniques discussed with respect to operation 1110 may be performed on the overlaid standard view image. However, such techniques may suffer from the drawback that pixel mappings may be noisy, so different images may randomly have some number of pixels mapped to the same object portion.

According to various embodiments, determining an aggregated coverage estimate may involve combining coverage areas determined at 1110 for different images. For example, for each grid portion a determination may be made as to whether any image captures the grid portion with a probability that exceeds a designated threshold. As another example, a weighted average of the coverage indications may be determined for each grid portion to aggregate the image-level coverage estimations.

In some implementations, determining an aggregated coverage estimate may involve evaluating different object components. A determination may be made for each component as to whether the component has been captured in a sufficient level of detail or clarity. For example, different grid portions associated with an object component such as a wheel or a door may be combined to determine a coverage indication for the component as a whole. As another example, grid-level heatmaps may be smoothed out over a given object component to determine a component-level object coverage estimate.

In some implementations, determining an aggregated coverage estimate may involve determining an object-level coverage estimate. For example, a determination may be made as to whether the mapped pixels from all perspective views are sufficiently dense over all or designated portions of the object.

In some implementations, determining an aggregated coverage estimate may involve determining whether a portion of the object has been captured from a designated perspective or at a designated distance. For example, an image or image portion of an object portion captured from a distance outside a designated distance range and/or a designated angular range may be down-weighted or ignored when determining image coverage.

In some implementations, the aggregated coverage estimate may be implemented as a heat map. The heat map may be on the grid level, or may be smoothed out.

In some embodiments, the aggregated coverage estimate may be modulated in one or more ways. For example, a coverage estimate may be computed specifically for visual data captured within, below, or above a designated coverage range. As another example, a coverage estimate may be computed specifically for visual data captured within, below, or above a designated angular distance of the object surface relative to the camera.

In particular embodiments, a modulated coverage estimate may be generated and stored in a way that is adjustable. For example, a user may slide a slider affordance in a user interface to adjust the minimum distance, maximum distance, minimum angle, and/or maximum angle for evaluating coverage.

A determination is made at 1116 as to whether to capture an additional image. If the determination is made to capture an additional image, then at 1118 guidance for additional viewpoint capture is provided. At 1120, one or more images are captured based on the recording guidance. In some implementations, the image collection guidance may include any suitable instructions for capturing an additional image that may assist in improving coverage. Such guidance may include an indication to capture an additional image from a targeted viewpoint, to capture an additional image of a designated portion of the object, or to capture an additional image at a different level of clarity or detail. For example, if coverage of a particular portion of the object is inadequate or missing, then feedback may be provided to capture additional detail at the object portion for which coverage is lacking.

In some implementations, the guidance for additional viewpoint capture may be provided so as to improve object coverage as discussed with respect to the operation 1110 and 1114. For example, if the coverage of an object or object portion is very high, additional viewpoint capture may be unnecessary. However, if the coverage of the object or a portion of the object is low, then capturing an additional image may help to improve the coverage In particular embodiments, one or more thresholds for determining whether to provide guidance for an additional image may be strategically determined based on any of a variety of considerations. For example, the threshold may be determined based on the number of images of the object or object component that have been previously captured. As another example, the threshold may be specified by a systems administrator. As yet another example, additional images may be captured until images from each of a set of designated perspective viewpoints have been captured.

According to various embodiments, the image collection feedback may include any suitable instructions or information for assisting a user in collecting additional images. Such guidance may include, but is not limited to, instructions to collect an image at a targeted camera position, orientation, or zoom level. Alternatively, or additionally, a user may be presented with instructions to capture a designated number of images or an image of a designated portion of the object.

For example, a user may be presented with a graphical guide to assist the user in capturing an additional image from a target perspective. As another example, a user may be presented with written or verbal instructions to guide the user in capturing an additional image. Additional techniques for determining and providing recording guidance as well as other related features are described in co-pending and commonly assigned U.S. patent application Ser. No. 15/992,546, titled "Providing Recording Guidance in Generating a Multi-View Interactive Digital Media Representation", filed May 30, 2018 by Holzer et al.

In some embodiments, the system may analyze the captured image or images to determine whether a sufficient portion of the object has been captured in sufficient detail to support damage analysis. For example, the system may analyze the capture image or images to determine whether the object is depicted from all sides. As another example, the system may analyze the capture image or images to determine whether each panel or portion of the object is shown in a sufficient amount of detail. As yet another example, the system may analyze the capture image or images to determine whether each panel or portion of the object is shown from a sufficient number of viewpoints.

When it is determined to not select an additional image for analysis, then at 1122 the coverage information is stored. For example, the coverage information may be stored on a storage device. Alternatively, or additionally, the images may be transmitted to a remote location via a network interface.

In some implementations, the method shown in FIG. 11 may include one or more operations other than those shown in FIG. 11. For example, the method 1100 may include one or more procedures for identifying the object or object component included in the selected image. Such a procedure may include, for instance, a neural network trained to identify object components.

In particular embodiments techniques and mechanisms described herein may be used in conjunction with damage detection analysis. According to various embodiments, damage may be detected by applying a neural network to the selected image. The neural network may identify damage to the object included in the image. In particular embodiments, the damage may be represented as a heatmap. The damage information may identify the damage type and/or severity. For example, the damage information may identify damage as being light, moderate, or severe. As another example, the damage information may identify the damage as a dent or a scratch. Detected damage may then be mapped from the perspective view to the standard view.

According to various embodiments, damage information may be aggregated on the standard view. Aggregating damage on the standard view may involve combining the damage mapped for one perspective view with damage mapped for other perspective view images. For example, damage values for the same component from different perspective view images may be summed, averaged, or otherwise combined.

According to various embodiments, the damage probability information may be determined. Damage probability information may identify a degree of certainty with which detected damage is ascertained. For instance, in a given perspective view it may be difficult to determine with certainty whether a particular image of an object portion depicts damage to the object or glare from a reflected light source. Accordingly, detected damage may be assigned a probability or other indication of certainty. However, the probability may be resolved to a value closer to zero or one with analysis of different perspective views of the same object portion.

Figure 12:
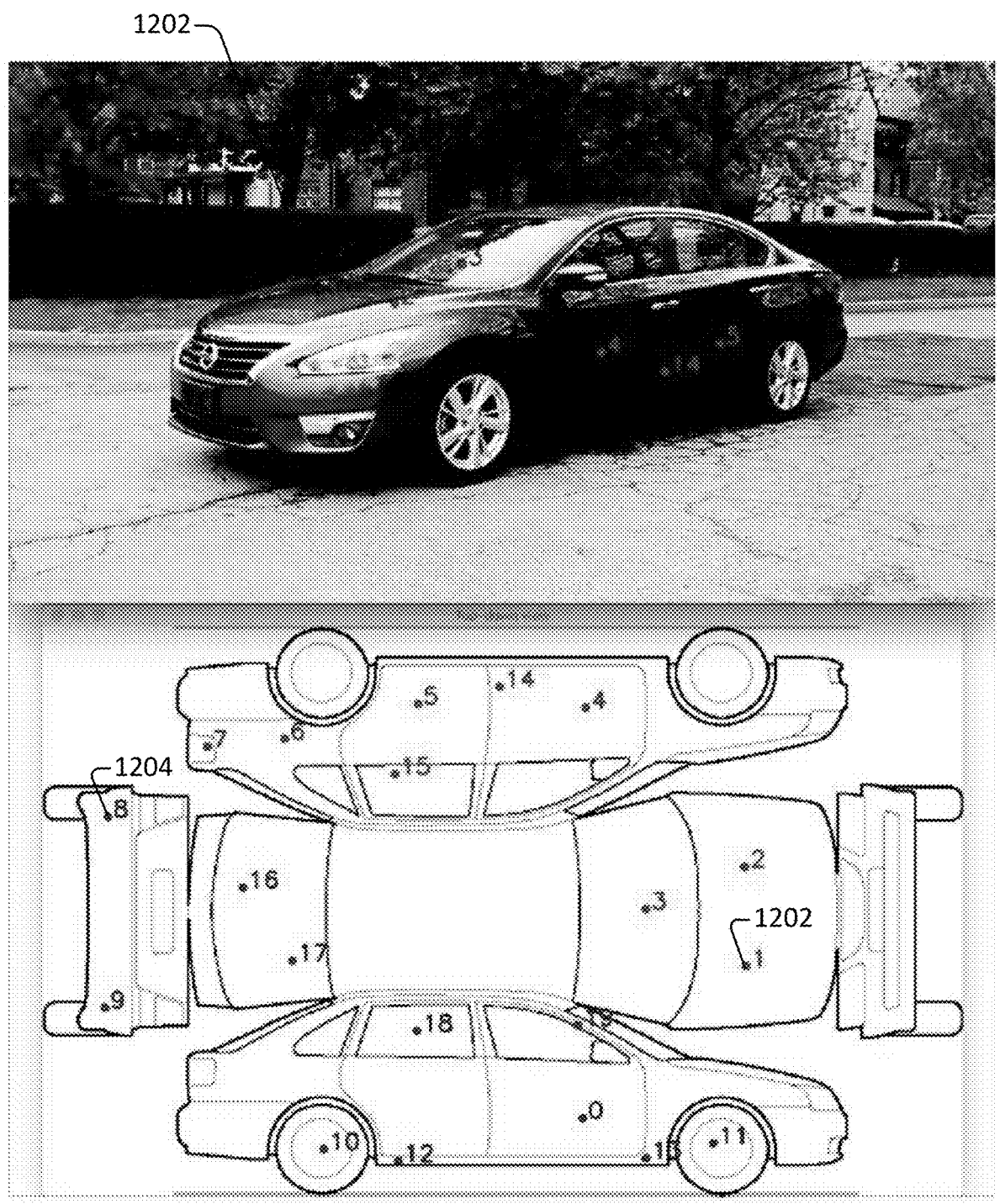
FIG. 12 illustrates an example of the mapping of 20 points from the top-down image of a vehicle to a perspective frame, generated in accordance with one or more embodiments.

FIG. 12 illustrates an example of the mapping of 20 points from the top-down image of a vehicle to a perspective frame. In FIG. 12, points in red such as point 1 1202 are identified as visible in the perspective frame and are thus correctly mapped, while points in blue such as point 8 1204 are not mapped since they are not visible in the perspective view.

Figure 16:
FIGS. 16 and 17 illustrate examples perspective view images on which damage has been detected, processed in accordance with one or more embodiments.
Figure 17:
Figure 18:
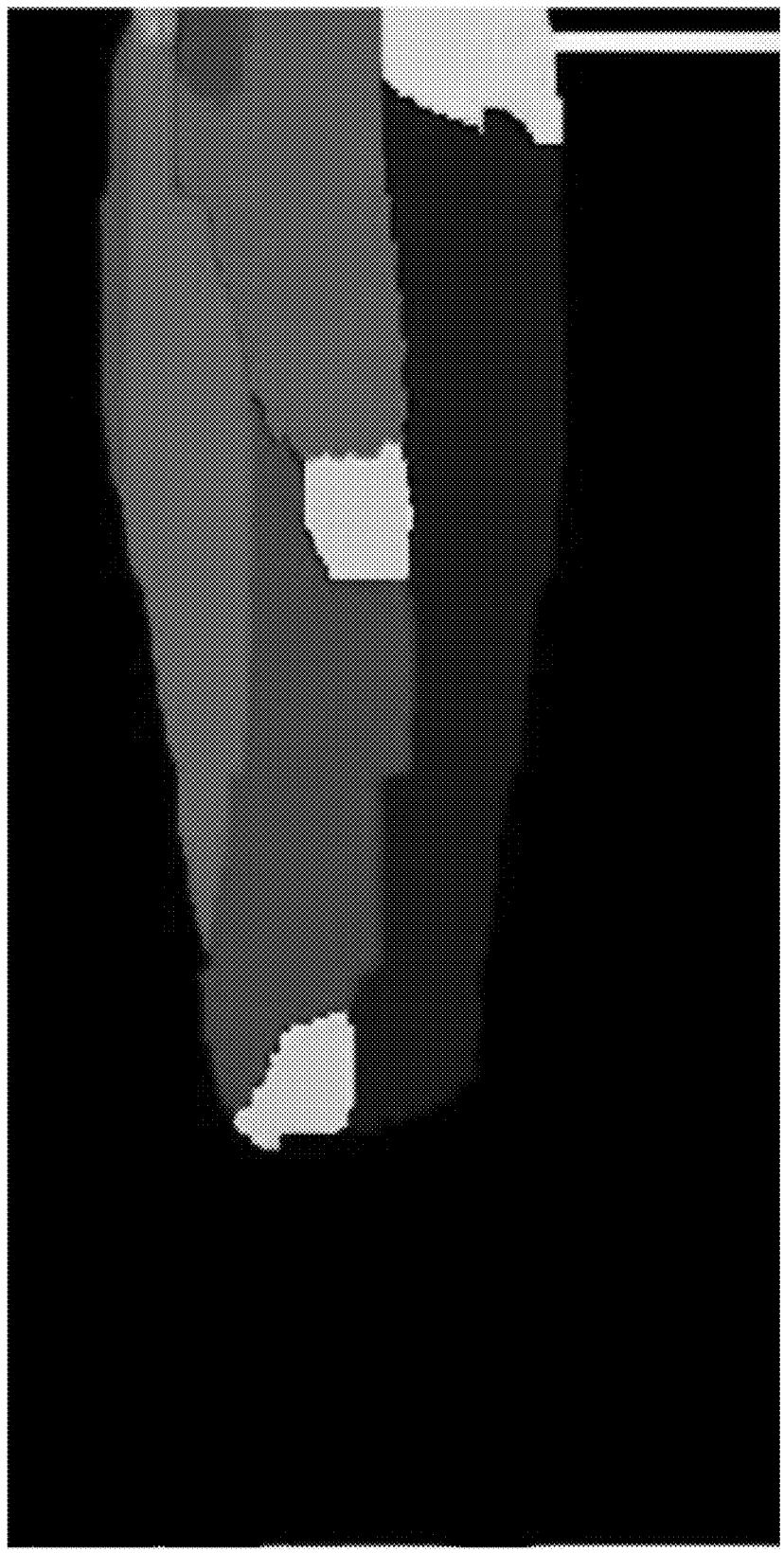
FIG. 18 illustrates a particular example of a 2D image of a 3D model on which damage has been mapped, processed in accordance with one or more embodiments.
Figure 19:
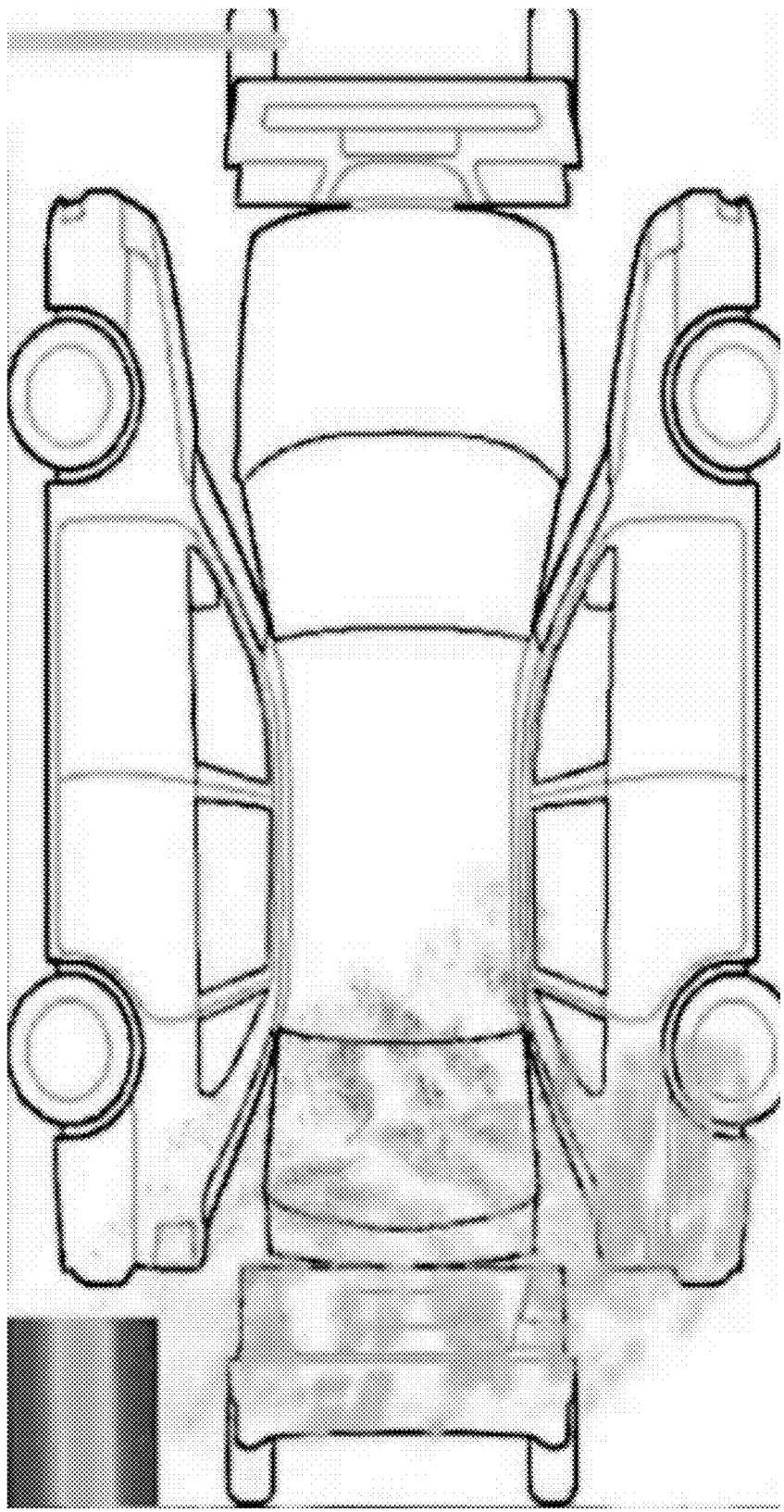
FIG. 19 illustrates one example of a top-down image on which damage has been mapped and represented as a heatmap in accordance with one or more embodiments.
Figure 20:
FIG. 20 illustrates a particular example of a perspective view image, processed in accordance with one or more embodiments.
Figure 21:
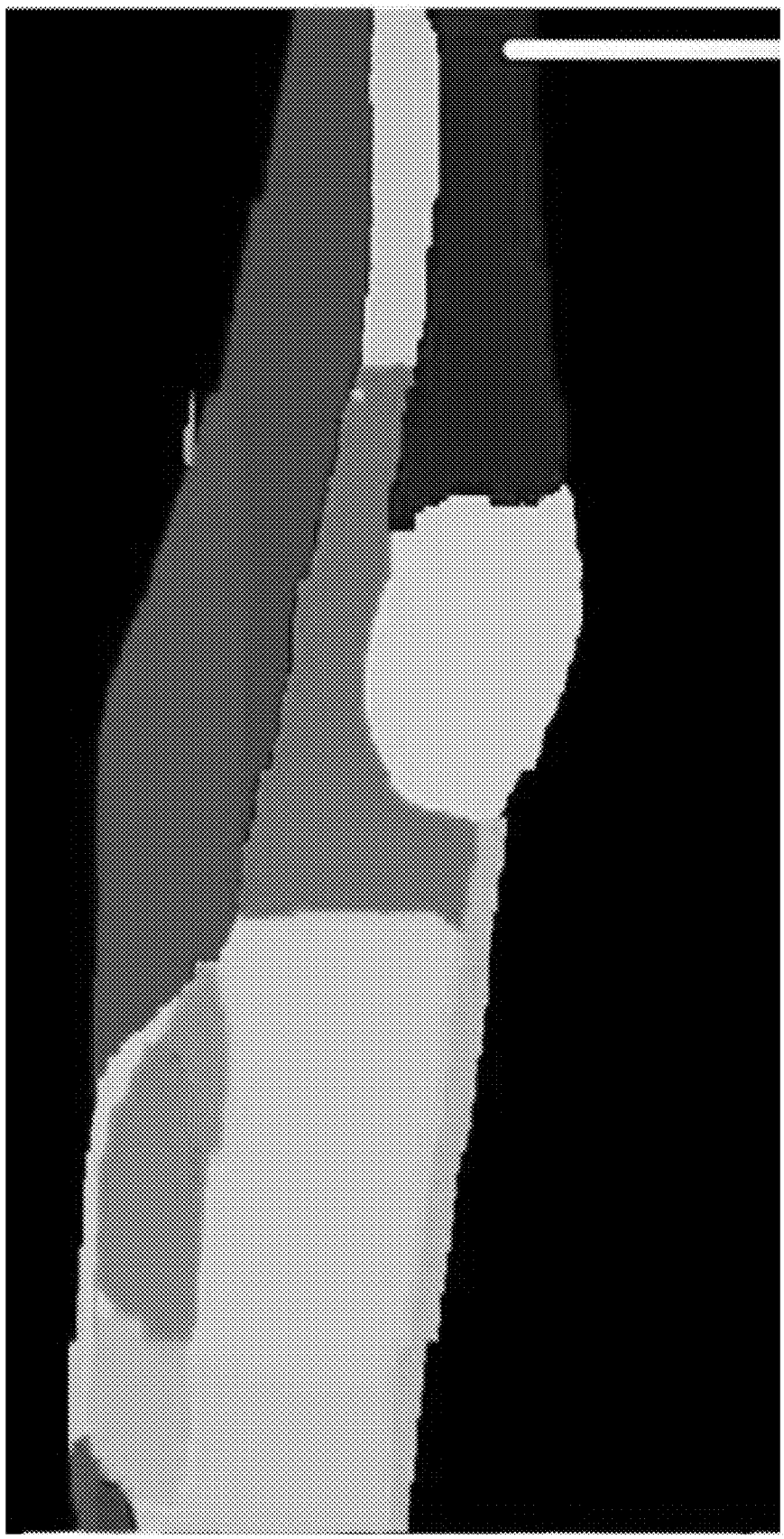
FIG. 21 illustrates one example of a 3D model of a perspective view image, analyzed in accordance with one or more embodiments.
Figure 22:
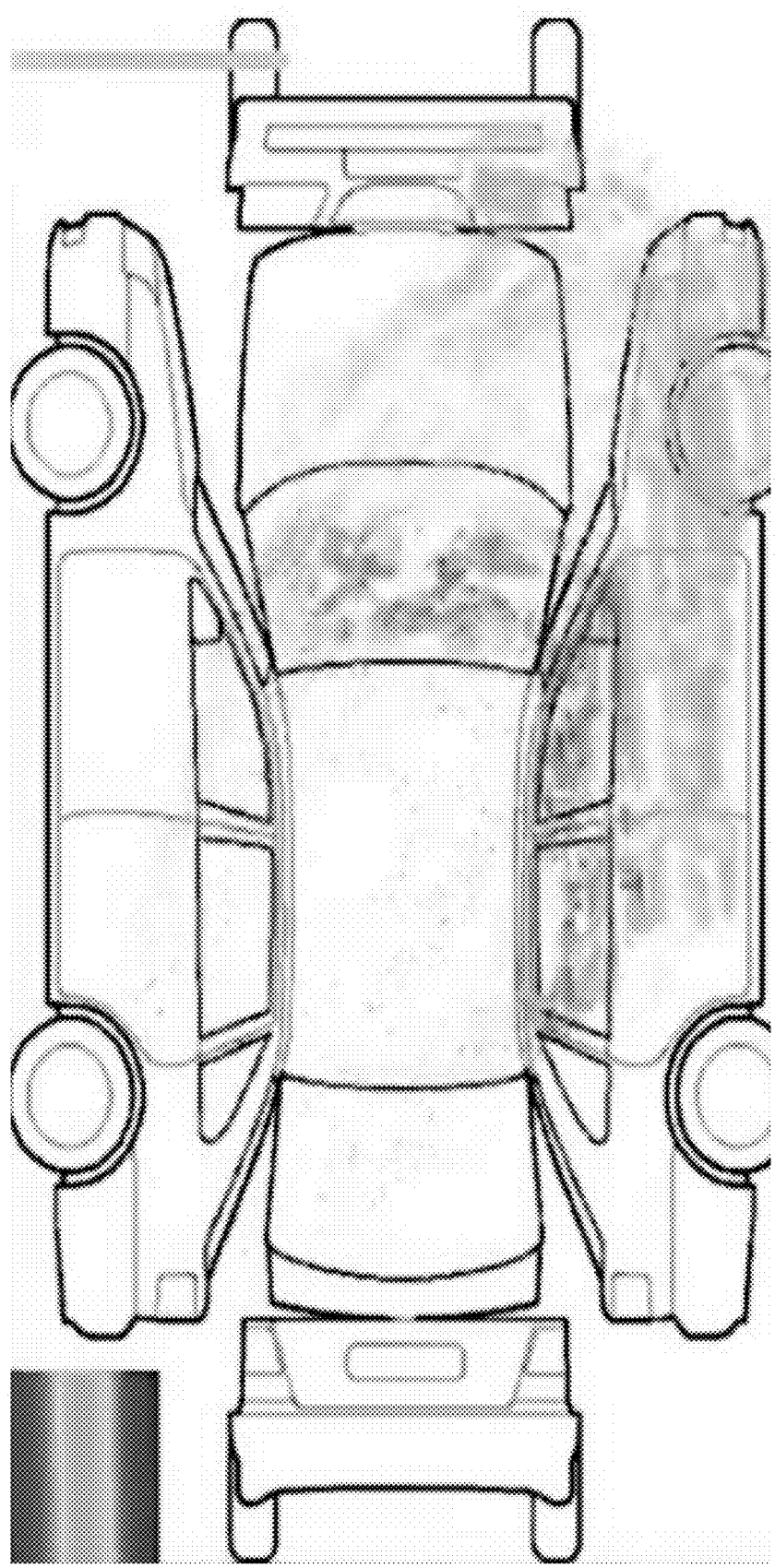
FIG. 22 illustrates one example a top-down image on which damage has been mapped and represented as a heatmap, processed in accordance with one or more embodiments.

FIGS. 16-23 show various images and user interfaces that may be generated, analyzed, or presented in conjunction with techniques and mechanisms described herein, according to one or more embodiments. FIG. 16 shows a perspective view image on which damage has been detected. The detected damage is represented with a heatmap. FIG. 17 shows a different perspective view image. FIG. 18 shows a 2D image of a 3D model on which damage has been mapped. The damage is represented in FIG. 18 as red. FIG. 19 shows a top-down image on which damage has been mapped and represented as a heatmap. FIG. 20 shows a different perspective view image. FIG. 21 shows a 3D model of the perspective view image. In FIG. 21, different surfaces of the object are represented by different colors. FIG. 22 shows a top-down image on which damage has been mapped and represented as a heatmap.

Figure 23:
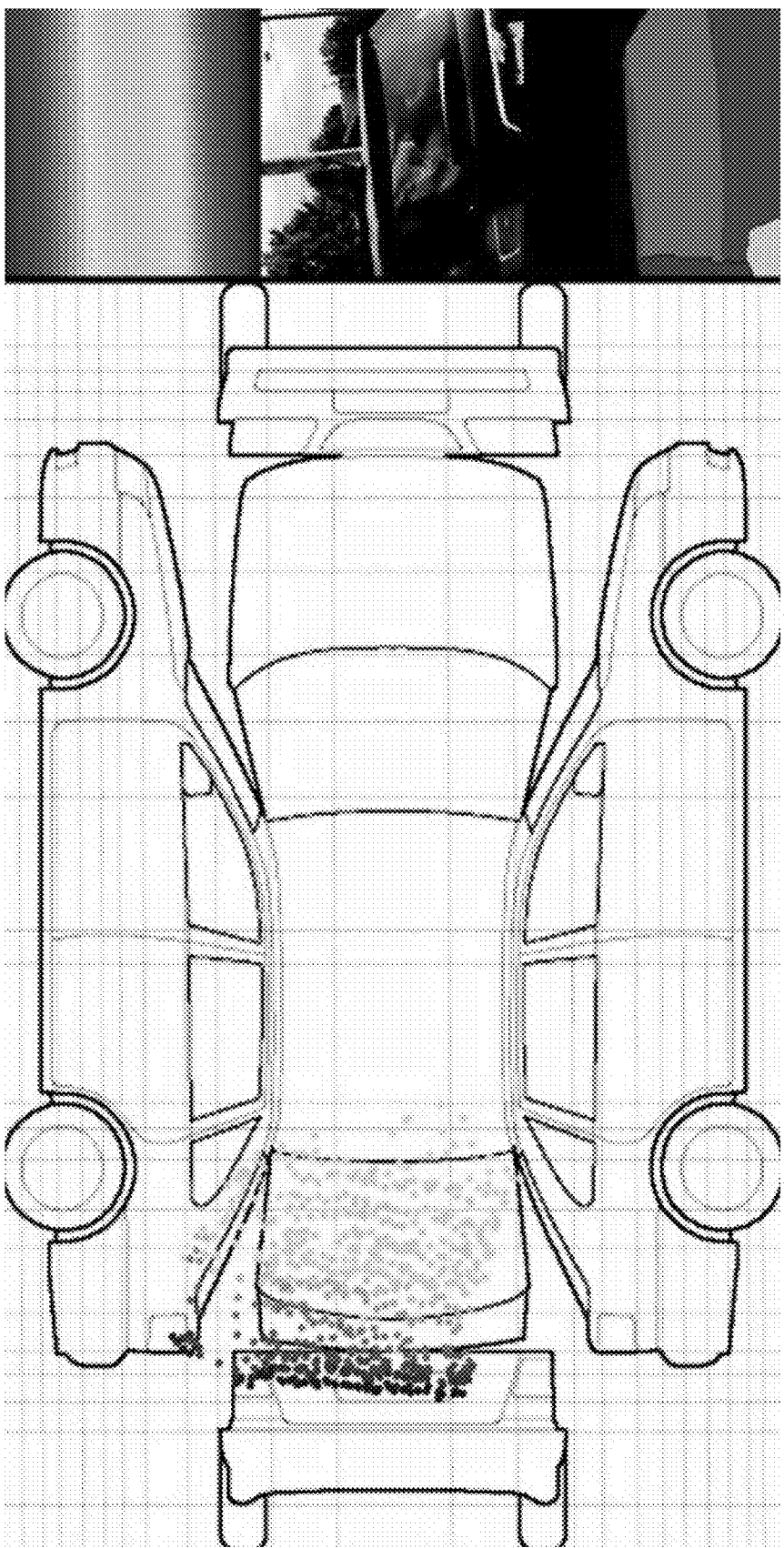
FIG. 23 illustrates a particular example of a top-down image that has been mapped to a perspective view image, processed in accordance with one or more embodiments.

FIG. 23 shows a different top-down image that has been mapped to a perspective view image. In FIG. 23, the middle image on the right is the input image, the upper image on the right indicates the color-coded location of each pixel in the input image, and the image on the left shows how the pixels in the input image are mapped onto the top-down view. The lower image on the right shows color coded object components, such as a rear windshield and lower rear door panel.

Various embodiments described herein relate generally to systems and methods for analyzing the spatial relationship between multiple images and video together with location information data, for the purpose of creating a single representation, a MVIDMR, which eliminates redundancy in the data, and presents a user with an interactive and immersive active viewing experience. According to various embodiments, active is described in the context of providing a user with the ability to control the viewpoint of the visual information displayed on a screen.

In particular example embodiments, augmented reality (AR) is used to aid a user in capturing the multiple images used in a MVIDMR. For example, a virtual guide can be inserted into live image data from a mobile. The virtual guide can help the user guide the mobile device along a desirable path useful for creating the MVIDMR. The virtual guide in the AR images can respond to movements of the mobile device. The movement of mobile device can be determined from a number of different sources, including but not limited to an Inertial Measurement Unit and image data.

Various aspects also relate generally to systems and methods for providing feedback when generating a MVIDMR. For example, object recognition may be used to recognize an object present in a MVIDMR. Then, feedback such as one or more visual indicators may be provided to guide the user in collecting additional MVIDMR data to collect a high-quality MVIDMR of the object. As another example, a target view may be determined for a MVIDMR, such as the terminal point when capturing a 360-degree MVIDMR. Then, feedback such as one or more visual indicators may be provided to guide the user in collecting additional MVIDMR data to reach the target view.

Figure 24:
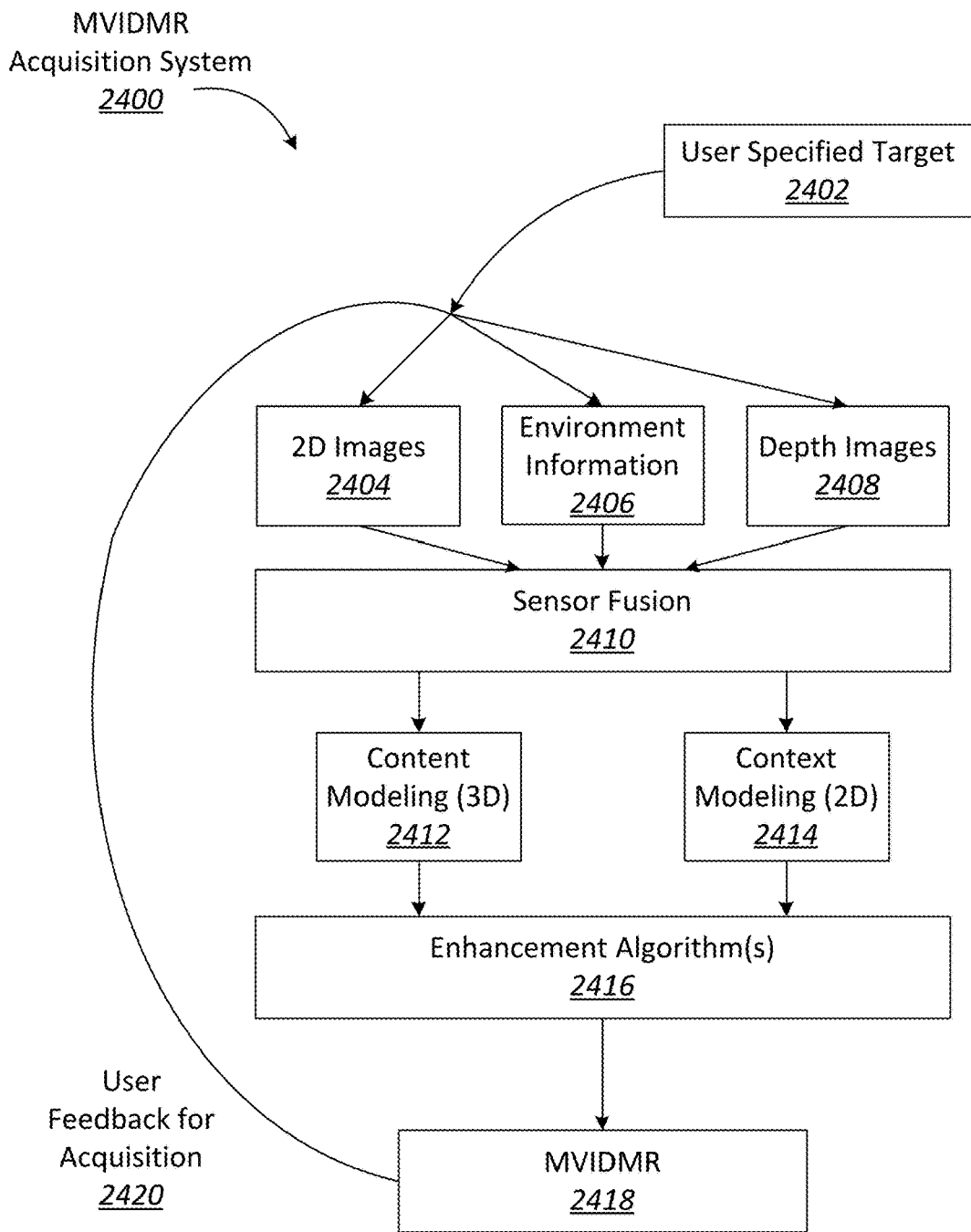
FIG. 24 illustrates an example of a MVIDMR acquisition system, configured in accordance with one or more embodiments.

FIG. 24 shows an example of a MVIDMR acquisition system 2400, configured in accordance with one or more embodiments. The MVIDMR acquisition system 2400 is depicted in a flow sequence that can be used to generate a MVIDMR. According to various embodiments, the data used to generate a MVIDMR can come from a variety of sources.

In particular, data such as, but not limited to two-dimensional (2D) images 2404 can be used to generate a MVIDMR. These 2D images can include color image data streams such as multiple image sequences, video data, etc., or multiple images in any of various formats for images, depending on the application. As will be described in more detail below with respect to FIGS. 7A-11B, during an image capture process, an AR system can be used. The AR system can receive and augment live image data with virtual data. In particular, the virtual data can include guides for helping a user direct the motion of an image capture device.

Another source of data that can be used to generate a MVIDMR includes environment information 2406. This environment information 2406 can be obtained from sources such as accelerometers, gyroscopes, magnetometers, GPS, WiFi, IMU-like systems (Inertial Measurement Unit systems), and the like. Yet another source of data that can be used to generate a MVIDMR can include depth images 2408. These depth images can include depth, 3D, or disparity image data streams, and the like, and can be captured by devices such as, but not limited to, stereo cameras, time-of-flight cameras, three-dimensional cameras, and the like.

In some embodiments, the data can then be fused together at sensor fusion block 2410. In some embodiments, a MVIDMR can be generated a combination of data that includes both 2D images 2404 and environment information 2406, without any depth images 2408 provided. In other embodiments, depth images 2408 and environment information 2406 can be used together at sensor fusion block 2410. Various combinations of image data can be used with environment information at 2406, depending on the application and available data.

In some embodiments, the data that has been fused together at sensor fusion block 2410 is then used for content modeling 2412 and context modeling 2414. The subject matter featured in the images can be separated into content and context. The content can be delineated as the object of interest and the context can be delineated as the scenery surrounding the object of interest. According to various embodiments, the content can be a three-dimensional model, depicting an object of interest, although the content can be a two-dimensional image in some embodiments. Furthermore, in some embodiments, the context can be a two-dimensional model depicting the scenery surrounding the object of interest. Although in many examples the context can provide two-dimensional views of the scenery surrounding the object of interest, the context can also include three-dimensional aspects in some embodiments. For instance, the context can be depicted as a "flat" image along a cylindrical "canvas," such that the "flat" image appears on the surface of a cylinder. In addition, some examples may include three-dimensional context models, such as when some objects are identified in the surrounding scenery as three-dimensional objects. According to various embodiments, the models provided by content modeling 2412 and context modeling 2414 can be generated by combining the image and location information data.

According to various embodiments, context and content of a MVIDMR are determined based on a specified object of interest. In some embodiments, an object of interest is automatically chosen based on processing of the image and location information data. For instance, if a dominant object is detected in a series of images, this object can be selected as the content. In other examples, a user specified target 2402 can be chosen, as shown in FIG. 24. It should be noted, however, that a MVIDMR can be generated without a user-specified target in some applications.

In some embodiments, one or more enhancement algorithms can be applied at enhancement algorithm(s) block 2416. In particular example embodiments, various algorithms can be employed during capture of MVIDMR data, regardless of the type of capture mode employed. These algorithms can be used to enhance the user experience. For instance, automatic frame selection, stabilization, view interpolation, filters, and/or compression can be used during capture of MVIDMR data. In some embodiments, these enhancement algorithms can be applied to image data after acquisition of the data. In other examples, these enhancement algorithms can be applied to image data during capture of MVIDMR data.

According to various embodiments, automatic frame selection can be used to create a more enjoyable MVIDMR. Specifically, frames are automatically selected so that the transition between them will be smoother or more even. This automatic frame selection can incorporate blur- and over-exposure-detection in some applications, as well as more uniformly sampling poses such that they are more evenly distributed.

In some embodiments, stabilization can be used for a MVIDMR in a manner similar to that used for video. In particular, keyframes in a MVIDMR can be stabilized for to produce improvements such as smoother transitions, improved/enhanced focus on the content, etc. However, unlike video, there are many additional sources of stabilization for a MVIDMR, such as by using IMU information, depth information, computer vision techniques, direct selection of an area to be stabilized, face detection, and the like.

For instance, IMU information can be very helpful for stabilization. In particular, IMU information provides an estimate, although sometimes a rough or noisy estimate, of the camera tremor that may occur during image capture. This estimate can be used to remove, cancel, and/or reduce the effects of such camera tremor.

In some embodiments, depth information, if available, can be used to provide stabilization for a MVIDMR. Because points of interest in a MVIDMR are three-dimensional, rather than two-dimensional, these points of interest are more constrained and tracking/matching of these points is simplified as the search space reduces. Furthermore, descriptors for points of interest can use both color and depth information and therefore, become more discriminative. In addition, automatic or semi-automatic content selection can be easier to provide with depth information. For instance, when a user selects a particular pixel of an image, this selection can be expanded to fill the entire surface that touches it. Furthermore, content can also be selected automatically by using a foreground/background differentiation based on depth. According to various embodiments, the content can stay relatively stable/visible even when the context changes.

According to various embodiments, computer vision techniques can also be used to provide stabilization for MVIDMRs. For instance, keypoints can be detected and tracked. However, in certain scenes, such as a dynamic scene or static scene with parallax, no simple warp exists that can stabilize everything. Consequently, there is a trade-off in which certain aspects of the scene receive more attention to stabilization and other aspects of the scene receive less attention. Because a MVIDMR is often focused on a particular object of interest, a MVIDMR can be content-weighted so that the object of interest is maximally stabilized in some examples.

Another way to improve stabilization in a MVIDMR includes direct selection of a region of a screen. For instance, if a user taps to focus on a region of a screen, then records a convex MVIDMR, the area that was tapped can be maximally stabilized. This allows stabilization algorithms to be focused on a particular area or object of interest.

In some embodiments, face detection can be used to provide stabilization. For instance, when recording with a front-facing camera, it is often likely that the user is the object of interest in the scene. Thus, face detection can be used to weight stabilization about that region. When face detection is precise enough, facial features themselves (such as eyes, nose, and mouth) can be used as areas to stabilize, rather than using generic keypoints. In another example, a user can select an area of image to use as a source for keypoints.

According to various embodiments, view interpolation can be used to improve the viewing experience. In particular, to avoid sudden "jumps" between stabilized frames, synthetic, intermediate views can be rendered on the fly. This can be informed by content-weighted keypoint tracks and IMU information as described above, as well as by denser pixel-to-pixel matches. If depth information is available, fewer artifacts resulting from mismatched pixels may occur, thereby simplifying the process. As described above, view interpolation can be applied during capture of a MVIDMR in some embodiments. In other embodiments, view interpolation can be applied during MVIDMR generation.

In some embodiments, filters can also be used during capture or generation of a MVIDMR to enhance the viewing experience. Just as many popular photo sharing services provide aesthetic filters that can be applied to static, two-dimensional images, aesthetic filters can similarly be applied to surround images. However, because a MVIDMR representation is more expressive than a two-dimensional image, and three-dimensional information is available in a MVIDMR, these filters can be extended to include effects that are ill-defined in two dimensional photos. For instance, in a MVIDMR, motion blur can be added to the background (i.e. context) while the content remains crisp. In another example, a drop-shadow can be added to the object of interest in a MVIDMR.

According to various embodiments, compression can also be used as an enhancement algorithm 2416. In particular, compression can be used to enhance user-experience by reducing data upload and download costs. Because MVIDMRs use spatial information, far less data can be sent for a MVIDMR than a typical video, while maintaining desired qualities of the MVIDMR. Specifically, the IMU, keypoint tracks, and user input, combined with the view interpolation described above, can all reduce the amount of data that must be transferred to and from a device during upload or download of a MVIDMR. For instance, if an object of interest can be properly identified, a variable compression style can be chosen for the content and context. This variable compression style can include lower quality resolution for background information (i.e. context) and higher quality resolution for foreground information (i.e. content) in some examples. In such examples, the amount of data transmitted can be reduced by sacrificing some of the context quality, while maintaining a desired level of quality for the content.

In the present embodiment, a MVIDMR 2418 is generated after any enhancement algorithms are applied. The MVIDMR can provide a multi-view interactive digital media representation. According to various embodiments, the MVIDMR can include three-dimensional model of the content and a two-dimensional model of the context. However, in some examples, the context can represent a "flat" view of the scenery or background as projected along a surface, such as a cylindrical or other-shaped surface, such that the context is not purely two-dimensional. In yet other examples, the context can include three-dimensional aspects.

According to various embodiments, MVIDMRs provide numerous advantages over traditional two-dimensional images or videos. Some of these advantages include: the ability to cope with moving scenery, a moving acquisition device, or both; the ability to model parts of the scene in three-dimensions; the ability to remove unnecessary, redundant information and reduce the memory footprint of the output dataset; the ability to distinguish between content and context; the ability to use the distinction between content and context for improvements in the user-experience; the ability to use the distinction between content and context for improvements in memory footprint (an example would be high quality compression of content and low quality compression of context); the ability to associate special feature descriptors with MVIDMRs that allow the MVIDMRs to be indexed with a high degree of efficiency and accuracy; and the ability of the user to interact and change the viewpoint of the MVIDMR. In particular example embodiments, the characteristics described above can be incorporated natively in the MVIDMR representation, and provide the capability for use in various applications. For instance, MVIDMRs can be used to enhance various fields such as e-commerce, visual search, 3D printing, file sharing, user interaction, and entertainment.

According to various example embodiments, once a MVIDMR 2418 is generated, user feedback for acquisition 2420 of additional image data can be provided. In particular, if a MVIDMR is determined to need additional views to provide a more accurate model of the content or context, a user may be prompted to provide additional views. Once these additional views are received by the MVIDMR acquisition system 2400, these additional views can be processed by the system 2400 and incorporated into the MVIDMR.

Figure 25:
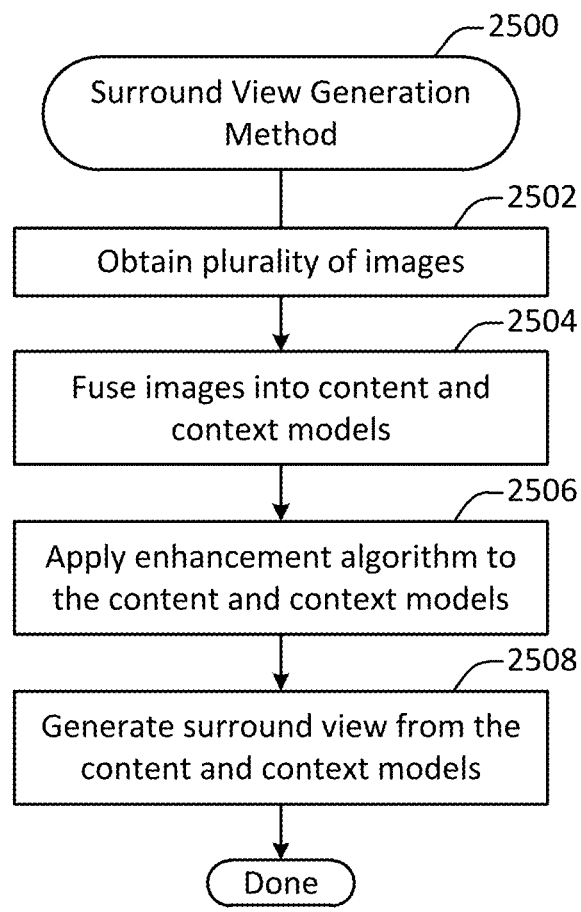
FIG. 25 illustrates one example of a method for generating a MVIDMR, performed in accordance with one or more embodiments.

FIG. 25 shows an example of a process flow diagram for generating a MVIDMR 2500. In the present example, a plurality of images is obtained at 2502. According to various embodiments, the plurality of images can include two-dimensional (2D) images or data streams. These 2D images can include location information that can be used to generate a MVIDMR. In some embodiments, the plurality of images can include depth images. The depth images can also include location information in various examples.

In some embodiments, when the plurality of images is captured, images output to the user can be augmented with the virtual data. For example, the plurality of images can be captured using a camera system on a mobile device. The live image data, which is output to a display on the mobile device, can include virtual data, such as guides and status indicators, rendered into the live image data. The guides can help a user guide a motion of the mobile device. The status indicators can indicate what portion of images needed for generating a MVIDMR have been captured. The virtual data may not be included in the image data captured for the purposes of generating the MVIDMR.

According to various embodiments, the plurality of images obtained at 2502 can include a variety of sources and characteristics. For instance, the plurality of images can be obtained from a plurality of users. These images can be a collection of images gathered from the internet from different users of the same event, such as 2D images or video obtained at a concert, etc. In some embodiments, the plurality of images can include images with different temporal information. In particular, the images can be taken at different times of the same object of interest. For instance, multiple images of a particular statue can be obtained at different times of day, different seasons, etc. In other examples, the plurality of images can represent moving objects. For instance, the images may include an object of interest moving through scenery, such as a vehicle traveling along a road or a plane traveling through the sky. In other instances, the images may include an object of interest that is also moving, such as a person dancing, running, twirling, etc.

In some embodiments, the plurality of images is fused into content and context models at 2504. According to various embodiments, the subject matter featured in the images can be separated into content and context. The content can be delineated as the object of interest and the context can be delineated as the scenery surrounding the object of interest. According to various embodiments, the content can be a three-dimensional model, depicting an object of interest, and the content can be a two-dimensional image in some embodiments.

According to the present example embodiment, one or more enhancement algorithms can be applied to the content and context models at 2506. These algorithms can be used to enhance the user experience. For instance, enhancement algorithms such as automatic frame selection, stabilization, view interpolation, filters, and/or compression can be used. In some embodiments, these enhancement algorithms can be applied to image data during capture of the images. In other examples, these enhancement algorithms can be applied to image data after acquisition of the data.

In the present embodiment, a MVIDMR is generated from the content and context models at 2508. The MVIDMR can provide a multi-view interactive digital media representation. According to various embodiments, the MVIDMR can include a three-dimensional model of the content and a two-dimensional model of the context. According to various embodiments, depending on the mode of capture and the viewpoints of the images, the MVIDMR model can include certain characteristics. For instance, some examples of different styles of MVIDMRs include a locally concave MVIDMR, a locally convex MVIDMR, and a locally flat MVIDMR. However, it should be noted that MVIDMRs can include combinations of views and characteristics, depending on the application.

Figure 26:
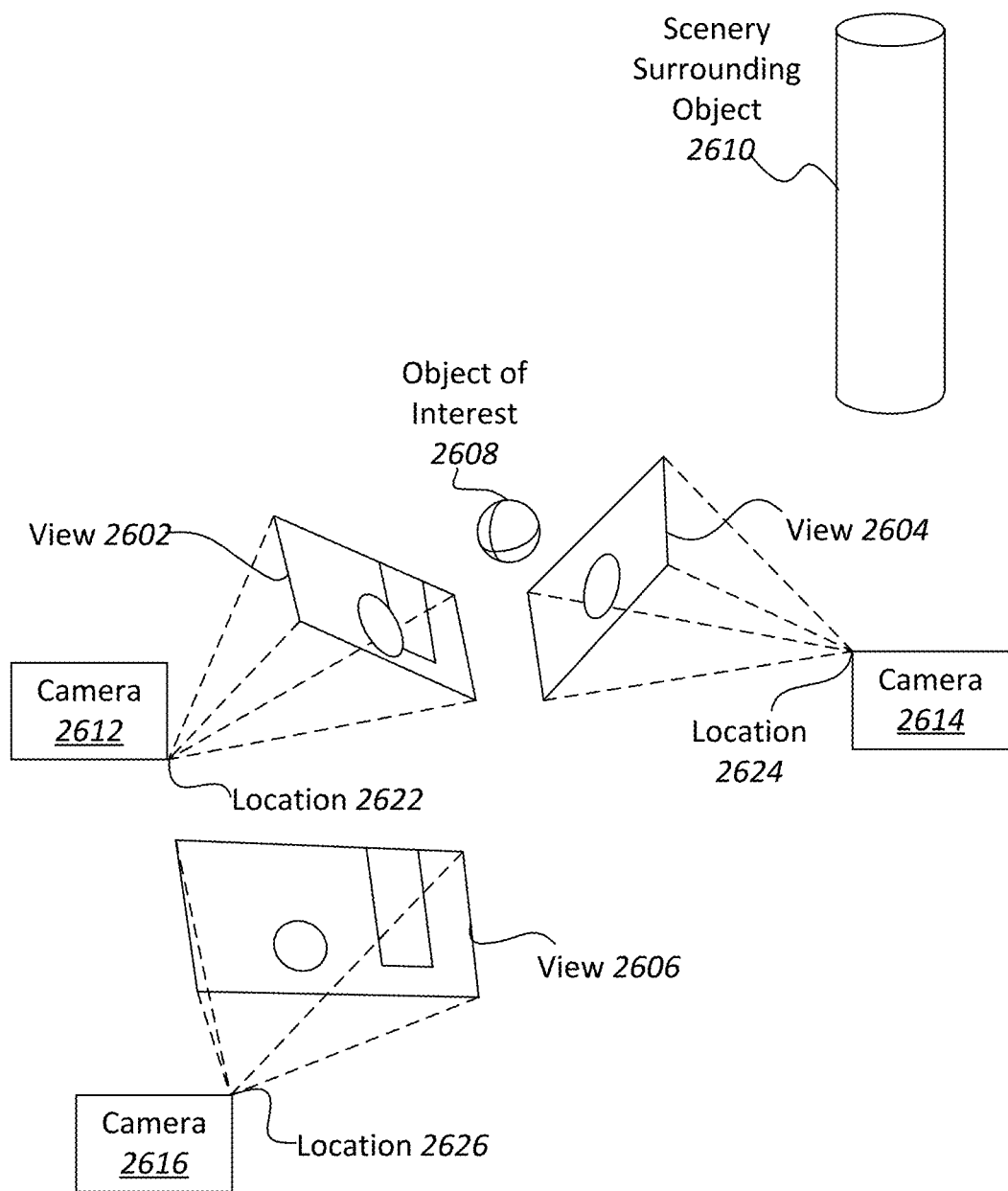
FIG. 26 illustrates one example of multiple camera views fused together into a three-dimensional (3D) model.

FIG. 26 shows an example of multiple camera views that can be fused together into a three-dimensional (3D) model to create an immersive experience. According to various embodiments, multiple images can be captured from various viewpoints and fused together to provide a MVIDMR. In some embodiments, three cameras 2612, 2614, and 2616 are positioned at locations 2622, 2624, and 2626, respectively, in proximity to an object of interest 2608. Scenery can surround the object of interest 2608 such as object 2610. Views 2602, 2604, and 2606 from their respective cameras 2612, 2614, and 2616 include overlapping subject matter. Specifically, each view 2602, 2604, and 2606 includes the object of interest 2608 and varying degrees of visibility of the scenery surrounding the object 2610. For instance, view 2602 includes a view of the object of interest 2608 in front of the cylinder that is part of the scenery surrounding the object 2610. View 2606 shows the object of interest 2608 to one side of the cylinder, and view 2604 shows the object of interest without any view of the cylinder.

In some embodiments, the various views 2602, 2604, and 2616 along with their associated locations 2622, 2624, and 2626, respectively, provide a rich source of information about object of interest 2608 and the surrounding context that can be used to produce a MVIDMR. For instance, when analyzed together, the various views 2602, 2604, and 2626 provide information about different sides of the object of interest and the relationship between the object of interest and the scenery. According to various embodiments, this information can be used to parse out the object of interest 2608 into content and the scenery as the context. Furthermore, various algorithms can be applied to images produced by these viewpoints to create an immersive, interactive experience when viewing a MVIDMR.

Figure 27:
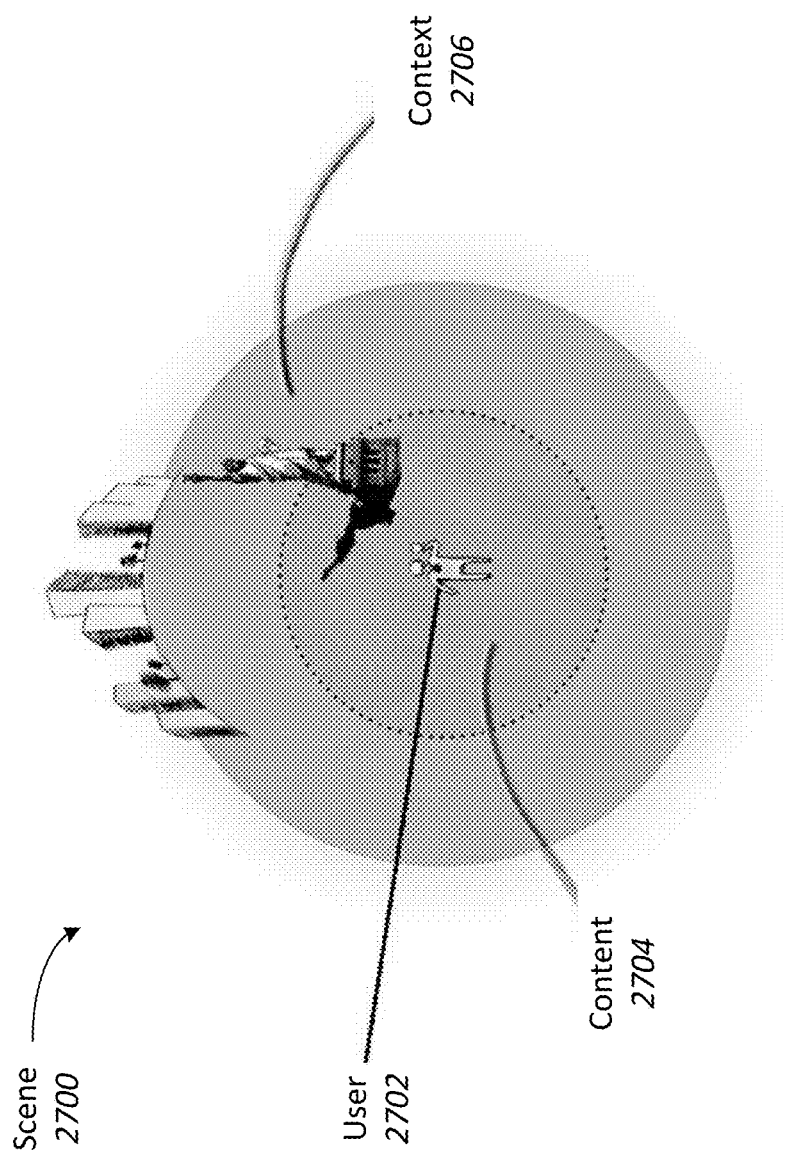
FIG. 27 illustrates one example of separation of content and context in a MVIDMR.

FIG. 27 illustrates one example of separation of content and context in a MVIDMR. According to various embodiments, a MVIDMR is a multi-view interactive digital media representation of a scene 2700. With reference to FIG. 27, shown is a user 2702 located in a scene 2700. The user 2702 is capturing images of an object of interest, such as a statue. The images captured by the user constitute digital visual data that can be used to generate a MVIDMR.

According to various embodiments of the present disclosure, the digital visual data included in a MVIDMR can be, semantically and/or practically, separated into content 2704 and context 2706. According to particular embodiments, content 2704 can include the object(s), person(s), or scene(s) of interest while the context 2706 represents the remaining elements of the scene surrounding the content 2704. In some embodiments, a MVIDMR may represent the content 2704 as three-dimensional data, and the context 2706 as a two-dimensional panoramic background. In other examples, a MVIDMR may represent both the content 2704 and context 2706 as two-dimensional panoramic scenes. In yet other examples, content 2704 and context 2706 may include three-dimensional components or aspects. In particular embodiments, the way that the MVIDMR depicts content 2704 and context 2706 depends on the capture mode used to acquire the images.

In some embodiments, such as but not limited to: recordings of objects, persons, or parts of objects or persons, where only the object, person, or parts of them are visible, recordings of large flat areas, and recordings of scenes where the data captured appears to be at infinity (i.e., there are no subjects close to the camera), the content 2704 and the context 2706 may be the same. In these examples, the MVIDMR produced may have some characteristics that are similar to other types of digital media such as panoramas. However, according to various embodiments, MVIDMRs include additional features that distinguish them from these existing types of digital media. For instance, a MVIDMR can represent moving data. Additionally, a MVIDMR is not limited to a specific cylindrical, spherical or translational movement. Various motions can be used to capture image data with a camera or other capture device. Furthermore, unlike a stitched panorama, a MVIDMR can display different sides of the same object.

Figures 28A, 28B:
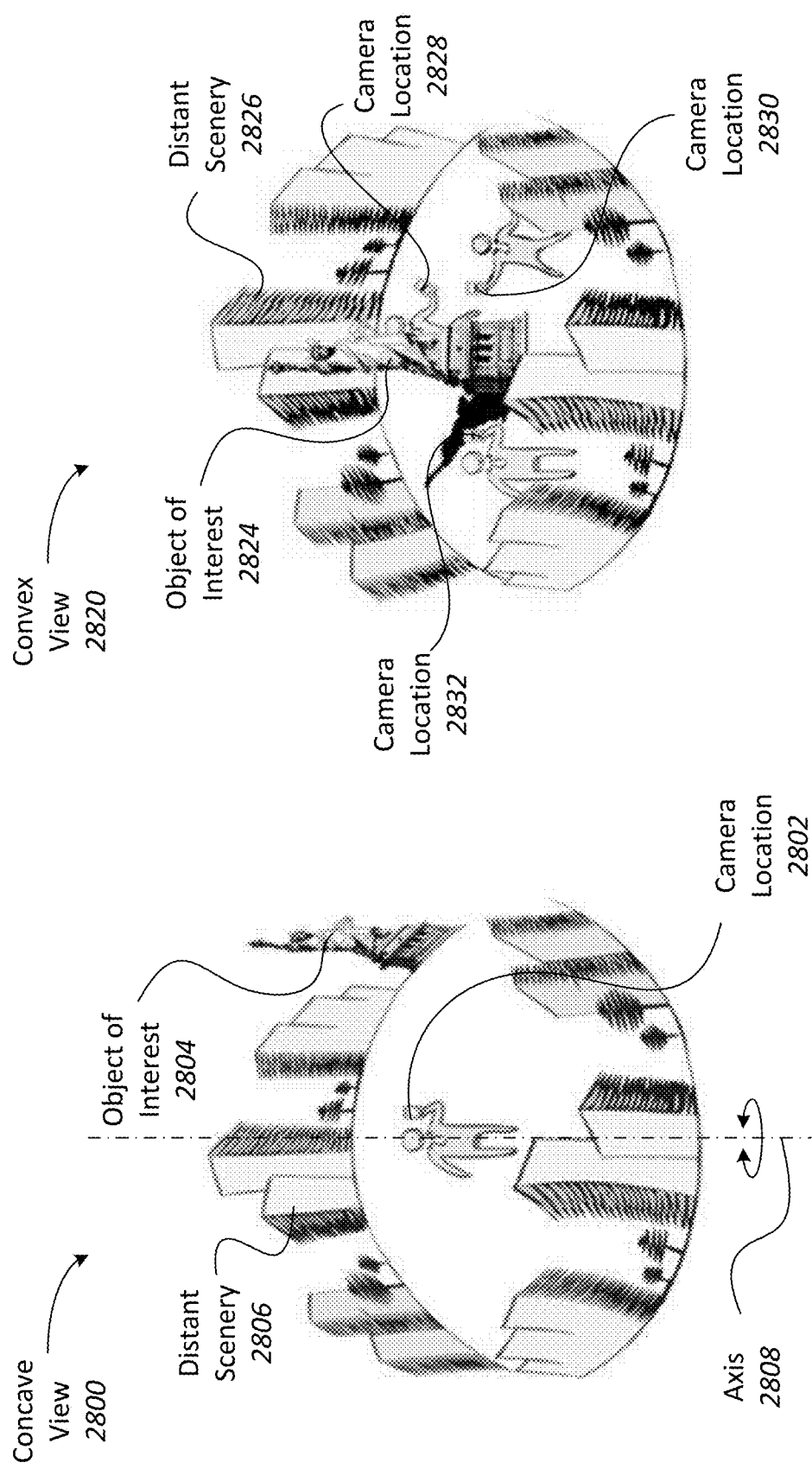
FIGS. 28A-28B illustrate examples of concave and convex views, where both views use a back-camera capture style.

FIGS. 28A-28B illustrate examples of concave and convex views, respectively, where both views use a back-camera capture style. In particular, if a camera phone is used, these views use the camera on the back of the phone, facing away from the user. In particular embodiments, concave and convex views can affect how the content and context are designated in a MVIDMR.

With reference to FIG. 28A, shown is one example of a concave view 2800 in which a user is standing along a vertical axis 2808. In this example, the user is holding a camera, such that camera location 2802 does not leave axis 2808 during image capture. However, as the user pivots about axis 2808, the camera captures a panoramic view of the scene around the user, forming a concave view. In this embodiment, the object of interest 2804 and the distant scenery 2806 are all viewed similarly because of the way in which the images are captured. In this example, all objects in the concave view appear at infinity, so the content is equal to the context according to this view.

With reference to FIG. 28B, shown is one example of a convex view 2820 in which a user changes position when capturing images of an object of interest 2824. In this example, the user moves around the object of interest 2824, taking pictures from different sides of the object of interest from camera locations 2828, 2830, and 2832. Each of the images obtained includes a view of the object of interest, and a background of the distant scenery 2826. In the present example, the object of interest 2824 represents the content, and the distant scenery 2826 represents the context in this convex view.

FIGS. 29A-30B illustrate examples of various capture modes for MVIDMRs. Although various motions can be used to capture a MVIDMR and are not constrained to any particular type of motion, three general types of motion can be used to capture particular features or views described in conjunction MVIDMRs. These three types of motion, respectively, can yield a locally concave MVIDMR, a locally convex MVIDMR, and a locally flat MVIDMR. In some embodiments, a MVIDMR can include various types of motions within the same MVIDMR.

Figure 29A:
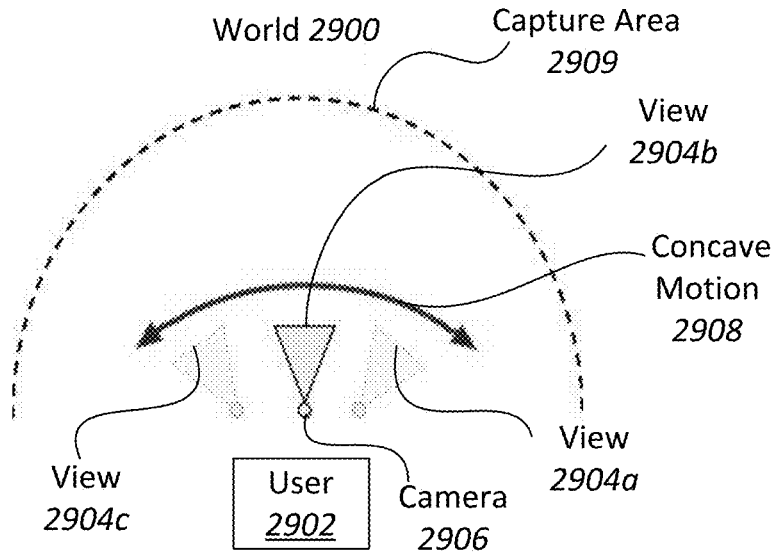
FIGS. 29A-29B illustrates one example of a back-facing, concave MVIDMR, generated in accordance with one or more embodiments.

With reference to FIG. 29A, shown is an example of a back-facing, concave MVIDMR being captured. According to various embodiments, a locally concave MVIDMR is one in which the viewing angles of the camera or other capture device diverge. In one dimension this can be likened to the motion required to capture a spherical 360 panorama (pure rotation), although the motion can be generalized to any curved sweeping motion in which the view faces outward. In the present example, the experience is that of a stationary viewer looking out at a (possibly dynamic) context.

In some embodiments, a user 2902 is using a back-facing camera 2906 to capture images towards world 2900, and away from user 2902. As described in various examples, a back-facing camera refers to a device with a camera that faces away from the user, such as the camera on the back of a smart phone. The camera is moved in a concave motion 2908, such that views 2904a, 2904b, and 2904c capture various parts of capture area 2909.

Figure 29B:
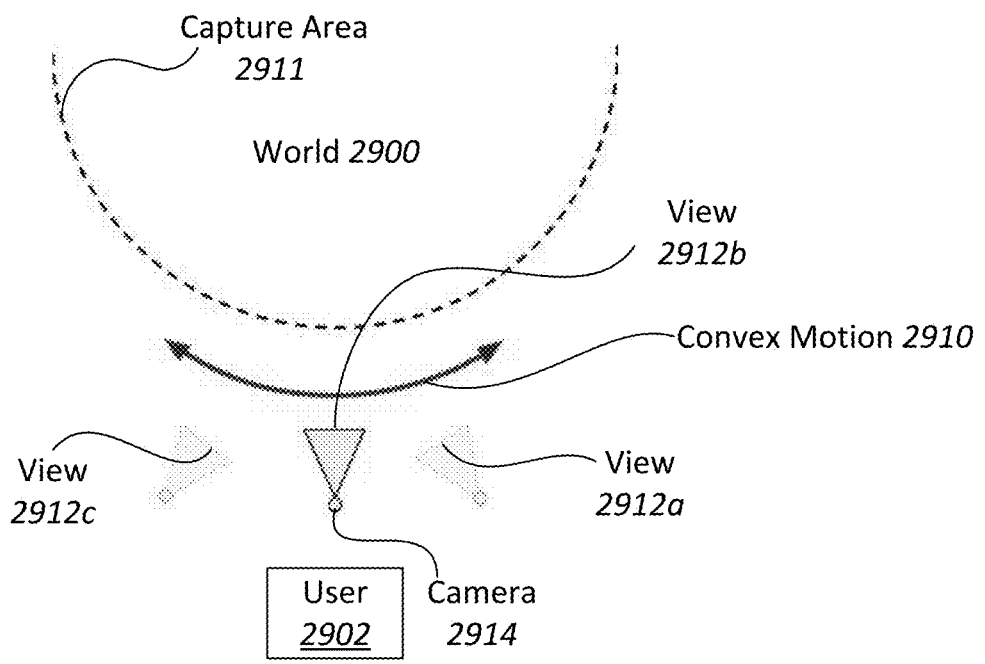

With reference to FIG. 29B, shown is an example of a back-facing, convex MVIDMR being captured. According to various embodiments, a locally convex MVIDMR is one in which viewing angles converge toward a single object of interest. In some embodiments, a locally convex MVIDMR can provide the experience of orbiting about a point, such that a viewer can see multiple sides of the same object. This object, which may be an "object of interest," can be segmented from the MVIDMR to become the content, and any surrounding data can be segmented to become the context. Previous technologies fail to recognize this type of viewing angle in the media-sharing landscape.

In some embodiments, a user 2902 is using a back-facing camera 2914 to capture images towards world 2900, and away from user 2902. The camera is moved in a convex motion 2910, such that views 2912a, 2912b, and 2912c capture various parts of capture area 2911. As described above, world 2900 can include an object of interest in some examples, and the convex motion 2910 can orbit around this object. Views 2912a, 2912b, and 2912c can include views of different sides of this object in these examples.

Figure 30A:
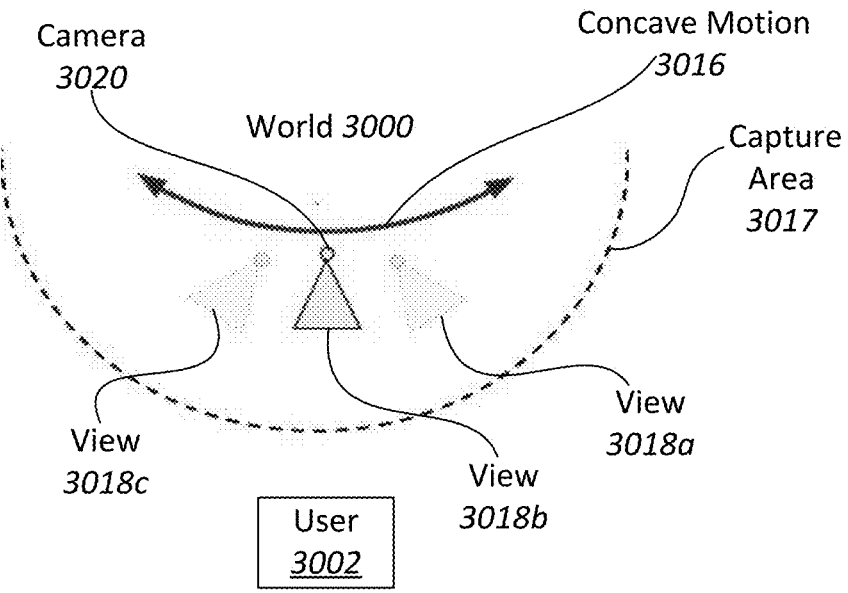
FIGS. 30A-30B illustrate examples of front-facing, concave and convex MVIDMRs generated in accordance with one or more embodiments.

With reference to FIG. 30A, shown is an example of a front-facing, concave MVIDMR being captured. As described in various examples, a front-facing camera refers to a device with a camera that faces towards the user, such as the camera on the front of a smart phone. For instance, front-facing cameras are commonly used to take "selfies" (i.e., self-portraits of the user).

In some embodiments, camera 3020 is facing user 3002. The camera follows a concave motion 3006 such that the views 3018a, 3018b, and 3018c diverge from each other in an angular sense. The capture area 3017 follows a concave shape that includes the user at a perimeter.

Figure 30B:
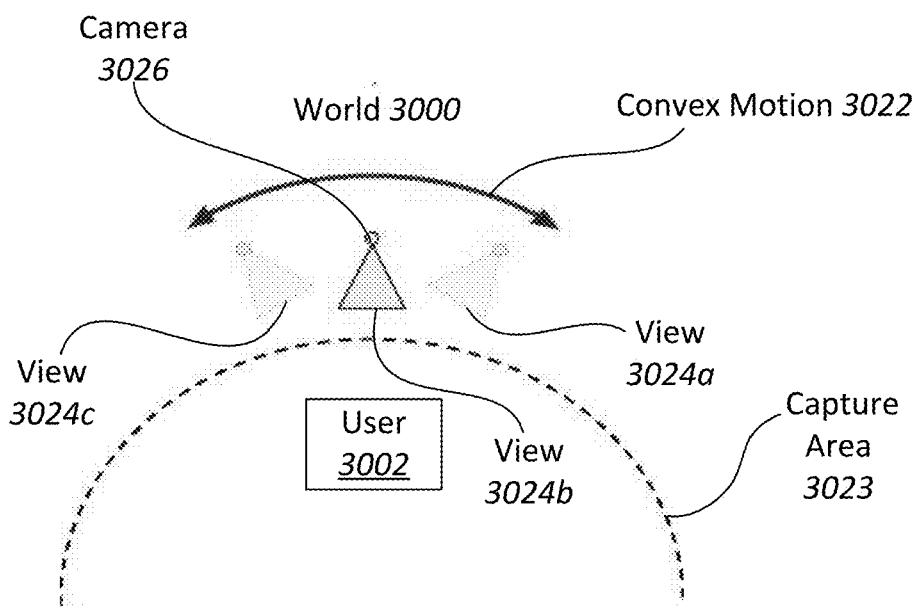

With reference to FIG. 30B, shown is an example of a front-facing, convex MVIDMR being captured. In some embodiments, camera 3026 is facing user 3002. The camera follows a convex motion 3022 such that the views 3024a, 3024b, and 3024c converge towards the user 3002. As described above, various modes can be used to capture images for a MVIDMR. These modes, including locally concave, locally convex, and locally linear motions, can be used during capture of separate images or during continuous recording of a scene. Such recording can capture a series of images during a single session.

In some embodiments, the augmented reality system can be implemented on a mobile device, such as a cell phone. In particular, the live camera data, which is output to a display on the mobile device, can be augmented with virtual objects. The virtual objects can be rendered into the live camera data. In some embodiments, the virtual objects can provide a user feedback when images are being captured for a MVIDMR.

Figure 31:
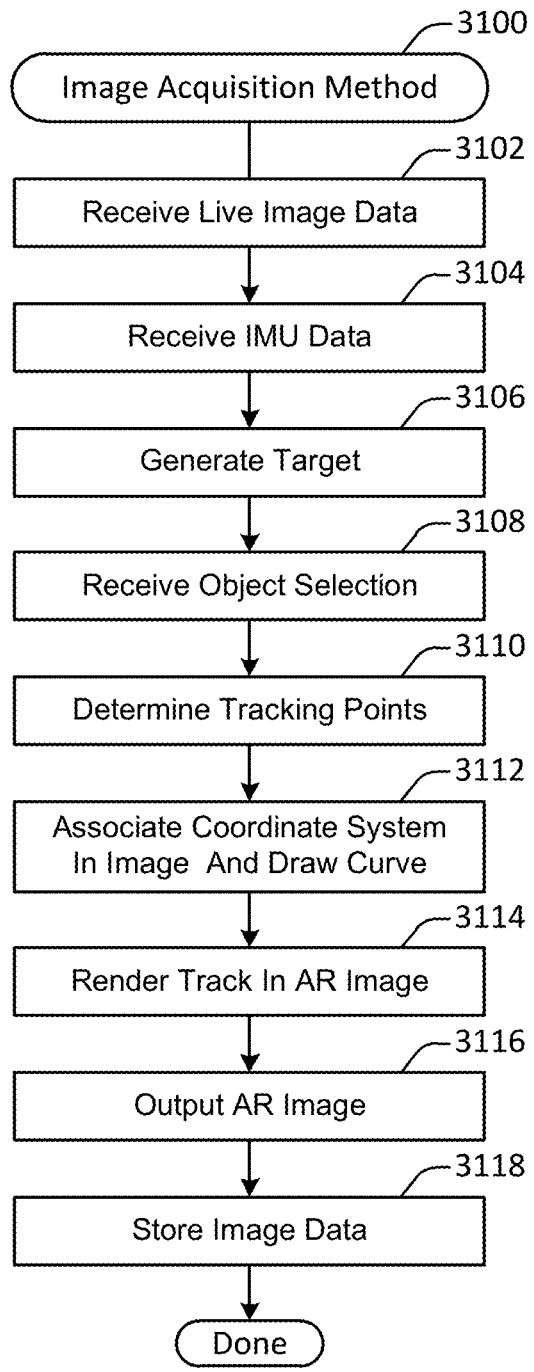
FIG. 31 illustrates one example of a method for generating virtual data associated with a target using live image data, performed in accordance with one or more embodiments.
Figure 32:
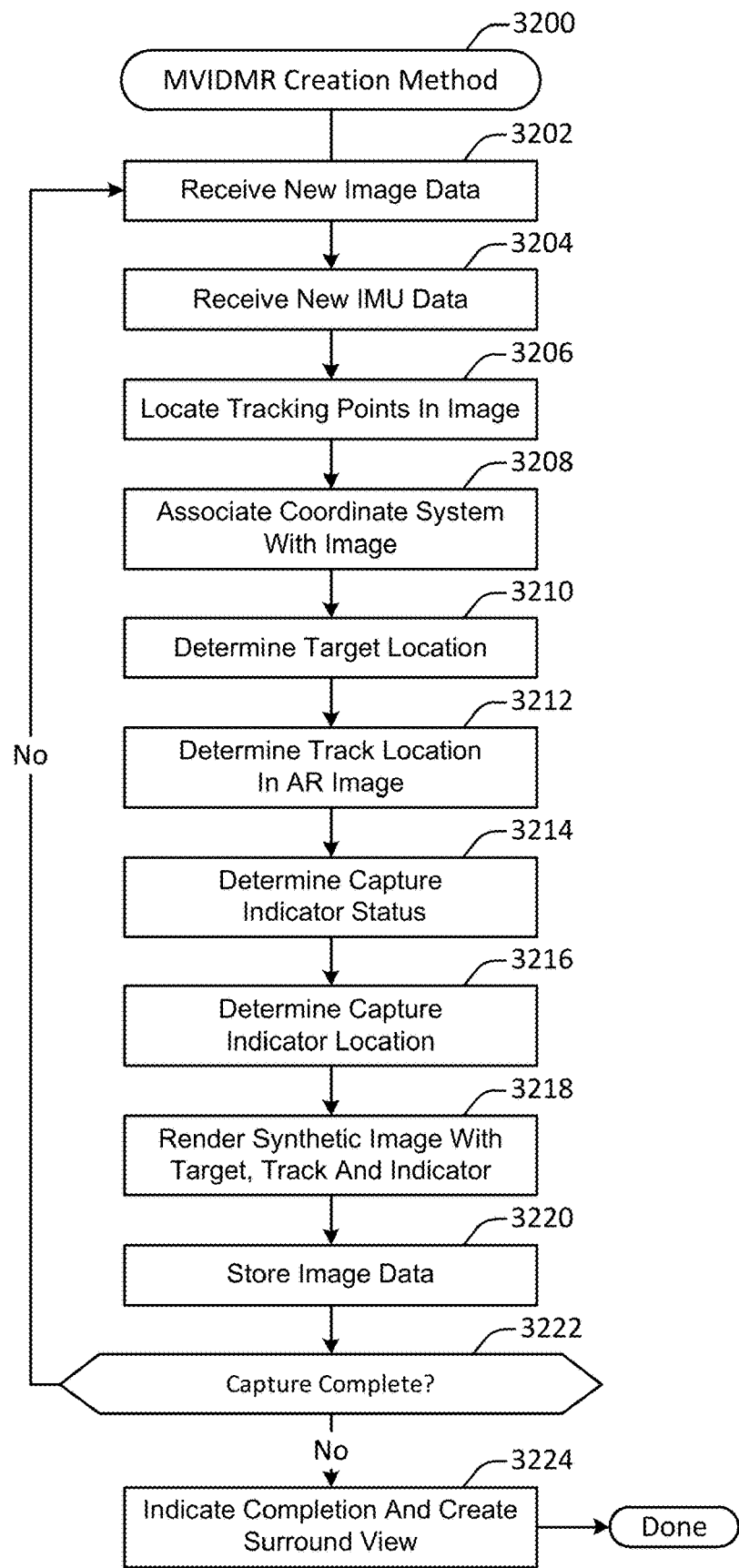
FIG. 32 illustrates one example of a method for generating MVIDMRs, performed in accordance with one or more embodiments.

FIGS. 31 and 32 illustrate an example of a process flow for capturing images in a MVIDMR using augmented reality. In 3102, live image data can be received from a camera system. For example, live image data can be received from one or more cameras on a hand-held mobile device, such as a smartphone. The image data can include pixel data captured from a camera sensor. The pixel data varies from frame to frame. In some embodiments, the pixel data can be 2-D. In other embodiments, depth data can be included with the pixel data.

In 3104, sensor data can be received. For example, the mobile device can include an IMU with accelerometers and gyroscopes. The sensor data can be used to determine an orientation of the mobile device, such as a tilt orientation of the device relative to the gravity vector. Thus, the orientation of the live 2-D image data relative to the gravity vector can also be determined. In addition, when the user applied accelerations can be separated from the acceleration due to gravity, it may be possible to determine changes in position of the mobile device as a function of time.

In particular embodiments, a camera reference frame can be determined. In the camera reference frame, one axis is aligned with a line perpendicular to the camera lens. Using an accelerometer on the phone, the camera reference frame can be related to an Earth reference frame. The earth reference frame can provide a 3-D coordinate system where one of the axes is aligned with the Earths' gravitational vector. The relationship between the camera frame and Earth reference frame can be indicated as yaw, roll and tilt/pitch. Typically, at least two of the three of yaw, roll and pitch are available typically from sensors available on a mobile device, such as smart phone's gyroscopes and accelerometers.

The combination of yaw-roll-tilt information from the sensors, such as a smart phone or tablets accelerometers and the data from the camera including the pixel data can be used to relate the 2-D pixel arrangement in the camera field of view to the 3-D reference frame in the real world. In some embodiments, the 2-D pixel data for each picture can be translated to a reference frame as if the camera where resting on a horizontal plane perpendicular to an axis through the gravitational center of the Earth where a line drawn through the center of lens perpendicular to the surface of lens is mapped to a center of the pixel data. This reference frame can be referred as an Earth reference frame. Using this calibration of the pixel data, a curve or object defined in 3-D space in the earth reference frame can be mapped to a plane associated with the pixel data (2-D pixel data). If depth data is available, i.e., the distance of the camera to a pixel. Then, this information can also be utilized in a transformation.

In alternate embodiments, the 3-D reference frame in which an object is defined doesn't have to be an Earth reference frame. In some embodiments, a 3-D reference in which an object is drawn and then rendered into the 2-D pixel frame of reference can be defined relative to the Earth reference frame. In another embodiment, a 3-D reference frame can be defined relative to an object or surface identified in the pixel data and then the pixel data can be calibrated to this 3-D reference frame.

As an example, the object or surface can be defined by a number of tracking points identified in the pixel data. Then, as the camera moves, using the sensor data and a new position of the tracking points, a change in the orientation of the 3-D reference frame can be determined from frame to frame. This information can be used to render virtual data in a live image data and/or virtual data into a MVIDMR.

Returning to FIG. 31, in 3106, virtual data associated with a target can be generated in the live image data. For example, the target can be cross hairs. In general, the target can be rendered as any shape or combinations of shapes. In some embodiments, via an input interface, a user may be able to adjust a position of the target. For example, using a touch screen over a display on which the live image data is output, the user may be able to place the target at a particular location in the synthetic image. The synthetic image can include a combination of live image data rendered with one or more virtual objects.

For example, the target can be placed over an object that appears in the image, such as a face or a person. Then, the user can provide an additional input via an interface that indicates the target is in a desired location. For example, the user can tap the touch screen proximate to the location where the target appears on the display. Then, an object in the image below the target can be selected. As another example, a microphone in the interface can be used to receive voice commands which direct a position of the target in the image (e.g., move left, move right, etc.) and then confirm when the target is in a desired location (e.g., select target).

In some instances, object recognition can be available. Object recognition can identify possible objects in the image. Then, the live images can be augmented with a number of indicators, such as targets, which mark identified objects. For example, objects, such as people, parts of people (e.g., faces), cars, wheels, can be marked in the image. Via an interface, the person may be able to select one of the marked objects, such as via the touch screen interface. In another embodiment, the person may be able to provide a voice command to select an object. For example, the person may be to say something like "select face," or "select car."

In 3108, the object selection can be received. The object selection can be used to determine an area within the image data to identify tracking points. When the area in the image data is over a target, the tracking points can be associated with an object appearing in the live image data.

In 3110, tracking points can be identified which are related to the selected object. Once an object is selected, the tracking points on the object can be identified on a frame to frame basis. Thus, if the camera translates or changes orientation, the location of the tracking points in the new frame can be identified and the target can be rendered in the live images so that it appears to stay over the tracked object in the image. This feature is discussed in more detail below. In particular embodiments, object detection and/or recognition may be used for each or most frames, for instance to facilitate identifying the location of tracking points.

In some embodiments, tracking an object can refer to tracking one or more points from frame to frame in the 2-D image space. The one or more points can be associated with a region in the image. The one or more points or regions can be associated with an object. However, the object doesn't have to be identified in the image. For example, the boundaries of the object in 2-D image space don't have to be known. Further, the type of object doesn't have to be identified. For example, a determination doesn't have to be made as to whether the object is a car, a person or something else appearing in the pixel data. Instead, the one or more points may be tracked based on other image characteristics that appear in successive frames. For instance, edge tracking, corner tracking, or shape tracking may be used to track one or more points from frame to frame.

One advantage of tracking objects in the manner described in the 2-D image space is that a 3-D reconstruction of an object or objects appearing in an image don't have to be performed. The 3-D reconstruction step may involve operations such as "structure from motion (SFM)" and/or "simultaneous localization and mapping (SLAM)." The 3-D reconstruction can involve measuring points in multiple images, and the optimizing for the camera poses and the point locations. When this process is avoided, significant computation time is saved. For example, avoiding the SLAM/SFM computations can enable the methods to be applied when objects in the images are moving. Typically, SLAM/SFM computations assume static environments.

In 3112, a 3-D coordinate system in the physical world can be associated with the image, such as the Earth reference frame, which as described above can be related to camera reference frame associated with the 2-D pixel data. In some embodiments, the 2-D image data can be calibrated so that the associated 3-D coordinate system is anchored to the selected target such that the target is at the origin of the 3-D coordinate system.

Then, in 3114, a 2-D or 3-D trajectory or path can be defined in the 3-D coordinate system. For example, a trajectory or path, such as an arc or a parabola can be mapped to a drawing plane which is perpendicular to the gravity vector in the Earth reference frame. As described above, based upon the orientation of the camera, such as information provided from an IMU, the camera reference frame including the 2-D pixel data can be mapped to the Earth reference frame. The mapping can be used to render the curve defined in the 3-D coordinate system into the 2-D pixel data from the live image data. Then, a synthetic image including the live image data and the virtual object, which is the trajectory or path, can be output to a display.

In general, virtual objects, such as curves or surfaces can be defined in a 3-D coordinate system, such as the Earth reference frame or some other coordinate system related to an orientation of the camera. Then, the virtual objects can be rendered into the 2-D pixel data associated with the live image data to create a synthetic image. The synthetic image can be output to a display.

In some embodiments, the curves or surfaces can be associated with a 3-D model of an object, such as person or a car. In another embodiment, the curves or surfaces can be associated with text. Thus, a text message can be rendered into the live image data. In other embodiments, textures can be assigned to the surfaces in the 3-D model. When a synthetic image is created, these textures can be rendered into the 2-D pixel data associated with the live image data.

When a curve is rendered on a drawing plane in the 3-D coordinate system, such as the Earth reference frame, one or more of the determined tracking points can be projected onto the drawing plane. As another example, a centroid associated with the tracked points can be projected onto the drawing plane. Then, the curve can be defined relative to one or more points projected onto the drawing plane. For example, based upon the target location, a point can be determined on the drawing plane. Then, the point can be used as the center of a circle or arc of some radius drawn in the drawing plane.

In 3114, based upon the associated coordinate system, a curve can be rendered into to the live image data as part of the AR system. In general, one or more virtual objects including plurality of curves, lines or surfaces can be rendered into the live image data. Then, the synthetic image including the live image data and the virtual objects can be output to a display in real-time.

In some embodiments, the one or more virtual object rendered into the live image data can be used to help a user capture images used to create a MVIDMR. For example, the user can indicate a desire to create a MVIDMR of a real object identified in the live image data. The desired MVIDMR can span some angle range, such as forty-five, ninety, one hundred eighty degrees or three hundred sixty degrees. Then, a virtual object can be rendered as a guide where the guide is inserted into the live image data. The guide can indicate a path along which to move the camera and the progress along the path. The insertion of the guide can involve modifying the pixel data in the live image data in accordance with coordinate system in 3112.

In the example above, the real object can be some object which appears in the live image data. For the real object, a 3-D model may not be constructed. Instead, pixel locations or pixel areas can be associated with the real object in the 2-D pixel data. This definition of the real object is much less computational expensive than attempting to construct a 3-D model of the real object in physical space.

The virtual objects, such as lines or surfaces can be modeled in the 3-D space. The virtual objects can be defined a priori. Thus, the shape of the virtual object doesn't have to be constructed in real-time, which is computational expensive. The real objects which may appear in an image are not known a priori. Hence, 3-D models of the real object are not typically available. Therefore, the synthetic image can include "real" objects which are only defined in the 2-D image space via assigning tracking points or areas to the real object and virtual objects which are modeled in a 3-D coordinate system and then rendered into the live image data.

Returning to FIG. 31, in 3116, AR image with one or more virtual objects can be output. The pixel data in the live image data can be received at a particular frame rate. In particular embodiments, the augmented frames can be output at the same frame rate as it received. In other embodiments, it can be output at a reduced frame rate. The reduced frame rate can lessen computation requirements. For example, live data received at 30 frames per second can be output at 15 frames per second. In another embodiment, the AR images can be output at a reduced resolution, such as 240*p* instead of 480p. The reduced resolution can also be used to reduce computational requirements.

In 3118, one or more images can be selected from the live image data and stored for use in a MVIDMR. In some embodiments, the stored images can include one or more virtual objects. Thus, the virtual objects can be become part of the MVIDMR. In other embodiments, the virtual objects are only output as part of the AR system. But, the image data which is stored for use in the MVIDMR may not include the virtual objects.

In yet other embodiments, a portion of the virtual objects output to the display as part of the AR system can be stored. For example, the AR system can be used to render a guide during the MVIDMR image capture process and render a label associated with the MVIDMR. The label may be stored in the image data for the MVIDMR. However, the guide may not be stored. To store the images without the added virtual objects, a copy may have to be made. The copy can be modified with the virtual data and then output to a display and the original stored or the original can be stored prior to its modification.

In FIG. 32, the method in FIG. 31 is continued. In 3222, new image data can be received. In 3224, new IMU data (or, in general sensor data) can be received. The IMU data can represent a current orientation of the camera. In 3226, the location of the tracking points identified in previous image data can be identified in the new image data.

The camera may have tilted and/or moved. Hence, the tracking points may appear at a different location in the pixel data. As described above, the tracking points can be used to define a real object appearing in the live image data. Thus, identifying the location of the tracking points in the new image data allows the real object to be tracked from image to image. The differences in IMU data from frame to frame and knowledge of the rate at which the frames are recorded can be used to help to determine a change in location of tracking points in the live image data from frame to frame.

The tracking points associated with a real object appearing in the live image data may change over time. As a camera moves around the real object, some tracking points identified on the real object may go out of view as new portions of the real object come into view and other portions of the real object are occluded. Thus, in 3226, a determination may be made whether a tracking point is still visible in an image. In addition, a determination may be made as to whether a new portion of the targeted object has come into view. New tracking points can be added to the new portion to allow for continued tracking of the real object from frame to frame.

In 3228, a coordinate system can be associated with the image. For example, using an orientation of the camera determined from the sensor data, the pixel data can be calibrated to an Earth reference frame as previously described. In 3230, based upon the tracking points currently placed on the object and the coordinate system a target location can be determined. The target can be placed over the real object which is tracked in live image data. As described above, a number and a location of the tracking points identified in an image can vary with time as the position of the camera changes relative to the camera. Thus, the location of the target in the 2-D pixel data can change. A virtual object representing the target can be rendered into the live image data. In particular embodiments, a coordinate system may be defined based on identifying a position from the tracking data and an orientation from the IMU (or other) data.

In 3232, a track location in the live image data can be determined. The track can be used to provide feedback associated with a position and orientation of a camera in physical space during the image capture process for a MVIDMR. As an example, as described above, the track can be rendered in a drawing plane which is perpendicular to the gravity vector, such as parallel to the ground. Further, the track can be rendered relative to a position of the target, which is a virtual object, placed over a real object appearing in the live image data. Thus, the track can appear to surround or partially surround the object. As described above, the position of the target can be determined from the current set of tracking points associated with the real object appearing in the image. The position of the target can be projected onto the selected drawing plane.

In 3234, a capture indicator status can be determined. The capture indicator can be used to provide feedback in regards to what portion of the image data used in a MVIDMR has been captured. For example, the status indicator may indicate that half of angle range of images for use in a MVIDMR has been captured. In another embodiment, the status indicator may be used to provide feedback in regards to whether the camera is following a desired path and maintaining a desired orientation in physical space. Thus, the status indicator may indicate the current path or orientation of the camera is desirable or not desirable. When the current path or orientation of the camera is not desirable, the status indicator may be configured to indicate what type of correction which is needed, such as but not limited to moving the camera more slowly, starting the capture process over, tilting the camera in a certain direction and/or translating the camera in a particular direction.

In 3236, a capture indicator location can be determined. The location can be used to render the capture indicator into the live image and generate the synthetic image. In some embodiments, the position of the capture indicator can be determined relative to a position of the real object in the image as indicated by the current set of tracking points, such as above and to left of the real object. In 3238, a synthetic image, i.e., a live image augmented with virtual objects, can be generated. The synthetic image can include the target, the track and one or more status indicators at their determined locations, respectively. In 3240, image data captured for the purposes of use in a MVIDMR can be captured. As described above, the stored image data can be raw image data without virtual objects or may include virtual objects.

In 3242, a check can be made as to whether images needed to generate a MVIDMR have been captured in accordance with the selected parameters, such as a MVIDMR spanning a desired angle range. When the capture is not complete, new image data may be received and the method may return to 3222. When the capture is complete, a virtual object can be rendered into the live image data indicating the completion of the capture process for the MVIDMR and a MVIDMR can be created. Some virtual objects associated with the capture process may cease to be rendered. For example, once the needed images have been captured the track used to help guide the camera during the capture process may no longer be generated in the live image data.

Figure 33A:
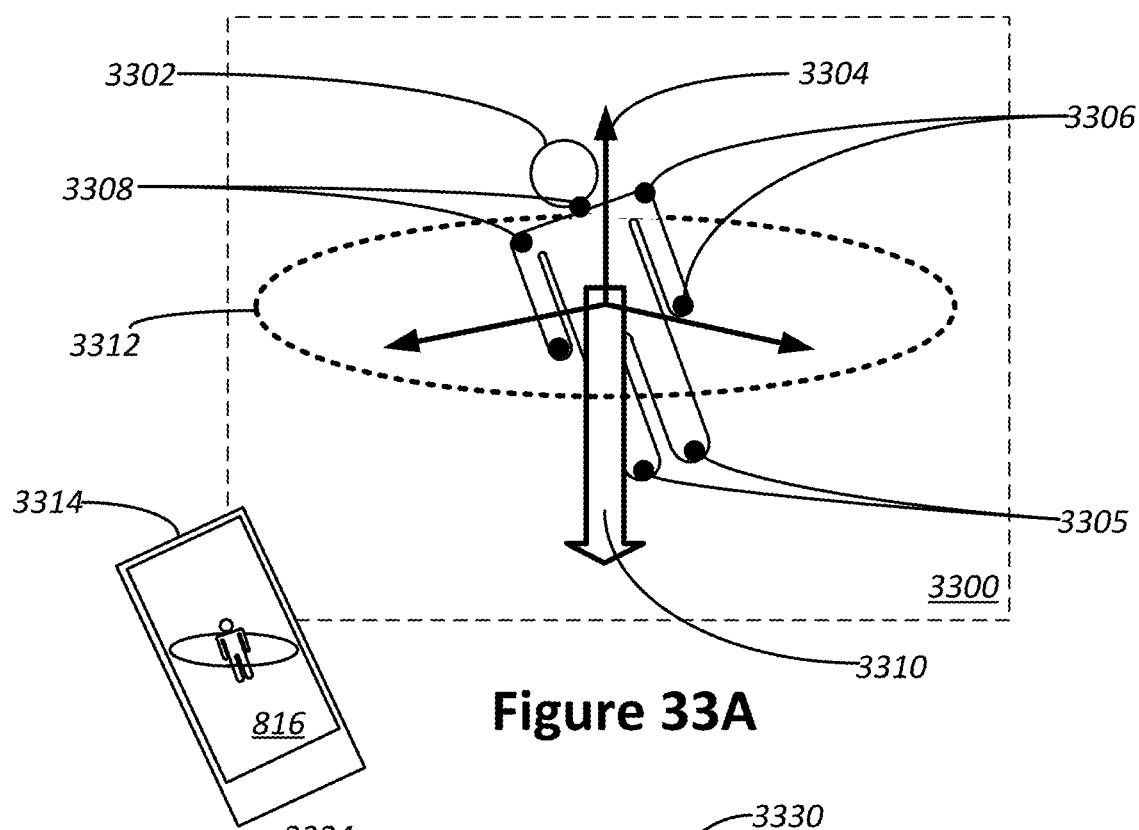
FIGS. 33A and 33B illustrate some aspects of generating an Augmented Reality (AR) image capture track for capturing images used in a MVIDMR.
Figure 33B:
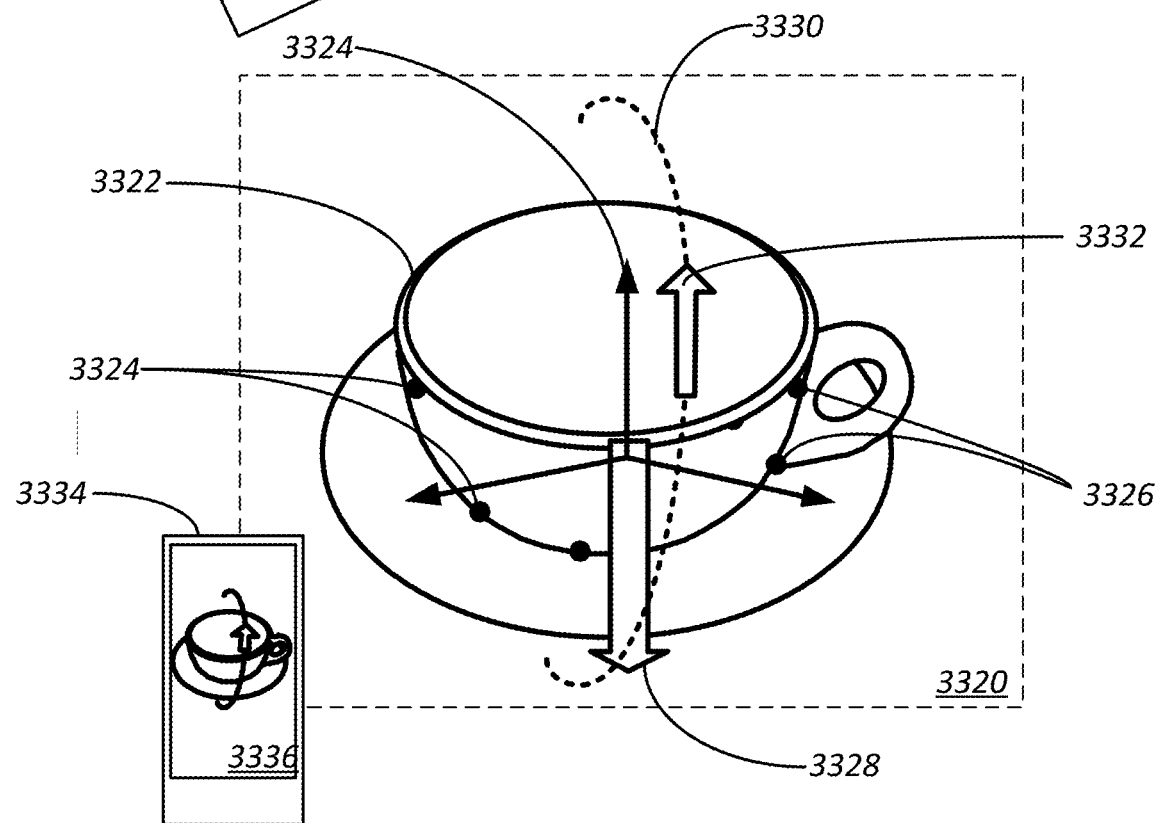

FIGS. 33A and 33B illustrate aspects of generating an Augmented Reality (AR) image capture track for capturing images used in a MVIDMR. In FIG. 33A, a mobile device 3314 with a display 3316 is shown. The mobile device can include at least one camera (not shown) with a field of view 3300. A real object 3302, which is a person, is selected in the field of view 3300 of the camera. A virtual object, which is a target (not shown), may have been used to help select the real object. For example, the target on a touch screen display of the mobile device 3314 may have been placed over the object 3302 and then selected.

The camera can include an image sensor which captures light in the field of view 3300. The data from the image sensor can be converted to pixel data. The pixel data can be modified prior to its output on display 3316 to generate a synthetic image. The modifications can include rendering virtual objects in the pixel data as part of an augmented reality (AR) system.

Using the pixel data and a selection of the object 3302, tracking points on the object can be determined. The tracking points can define the object in image space. Locations of a current set of tracking points, such as 3305, 3306 and 3308, which can be attached to the object 3302 are shown. As a position and orientation of the camera on the mobile device 3314, the shape and position of the object 3302 in the captured pixel data can change. Thus, the location of the tracking points in the pixel data can change. Thus, a previously defined tracking point can move from a first location in the image data to a second location. Also, a tracking point can disappear from the image as portions of the object are occluded.

Using sensor data from the mobile device 3314, an Earth reference frame 3-D coordinate system 3304 can be associated with the image data. The direction of the gravity vector is indicated by arrow 3310. As described above, in a particular embodiment, the 2-D image data can be calibrated relative to the Earth reference frame. The arrow representing the gravity vector is not rendered into the live image data. However, if desired, an indicator representative of the gravity could be rendered into the synthetic image.

A plane which is perpendicular to the gravity vector can be determined. The location of the plane can be determined using the tracking points in the image, such as 3305, 3306 and 3308. Using this information, a curve, which is a circle, is drawn in the plane. The circle can be rendered into to the 2-D image data and output as part of the AR system. As is shown on display 3316, the circle appears to surround the object 3302. In some embodiments, the circle can be used as a guide for capturing images used in a MVIDMR.

If the camera on the mobile device 3314 is rotated in some way, such as tilted, the shape of the object will change on display 3316. However, the new orientation of the camera can be determined in space including a direction of the gravity vector. Hence, a plane perpendicular to the gravity vector can be determined. The position of the plane and hence, a position of the curve in the image can be based upon a centroid of the object determined from the tracking points associated with the object 3302. Thus, the curve can appear to remain parallel to the ground, i.e., perpendicular to the gravity vector, as the camera 3314 moves. However, the position of the curve can move from location to location in the image as the position of the object and its apparent shape in the live images changes.

In FIG. 33B, a mobile device 3334 including a camera (not shown) and a display 3336 for outputting the image data from the camera is shown. A cup 3322 is shown in the field of view of camera 3320 of the camera. Tracking points, such as 3324 and 3326, have been associated with the object 3322. These tracking points can define the object 3322 in image space. Using the IMU data from the mobile device 3334, a reference frame has been associated with the image data. As described above, In some embodiments, the pixel data can be calibrated to the reference frame. The reference frame is indicated by the 3-D axes 3324 and the direction of the gravity vector is indicated by arrow 3328.

As described above, a plane relative to the reference frame can be determined. In this example, the plane is parallel to the direction of the axis associated with the gravity vector as opposed to perpendicular to the frame. This plane is used to proscribe a path for the MVIDMR which goes over the top of the object 3330. In general, any plane can be determined in the reference frame and then a curve, which is used as a guide, can be rendered into the selected plane.

Using the locations of the tracking points, in some embodiments a centroid of the object 3322 on the selected plane in the reference can be determined. A curve 3330, such as a circle, can be rendered relative to the centroid. In this example, a circle is rendered around the object 3322 in the selected plane.

The curve 3330 can serve as a track for guiding the camera along a particular path where the images captured along the path can be converted into a MVIDMR. In some embodiments, a position of the camera along the path can be determined. Then, an indicator can be generated which indicates a current location of the camera along the path. In this example, current location is indicated by arrow 3332.

The position of the camera along the path may not directly map to physical space, i.e., the actual position of the camera in physical space doesn't have to be necessarily determined. For example, an angular change can be estimated from the IMU data and optionally the frame rate of the camera. The angular change can be mapped to a distance moved along the curve where the ratio of the distance moved along the path 3330 is not a one to one ratio with the distance moved in physical space. In another example, a total time to traverse the path 3330 can be estimated and then the length of time during which images have been recorded can be tracked. The ratio of the recording time to the total time can be used to indicate progress along the path 3330.

The path 3330, which is an arc, and arrow 3332 are rendered into the live image data as virtual objects in accordance with their positions in the 3-D coordinate system associated with the live 2-D image data. The cup 3322, the circle 3330 and the arrow 3332 are shown output to display 3336. The orientation of the curve 3330 and the arrow 3332 shown on display 3336 relative to the cup 3322 can change if the orientation of the camera is changed, such as if the camera is tilted.

In particular embodiments, a size of the object 3322 in the image data can be changed. For example, the size of the object can be made bigger or smaller by using a digital zoom. In another example, the size of the object can be made bigger or smaller by moving the camera, such as on mobile device 3334, closer or farther away from the object 3322.

When the size of the object changes, the distances between the tracking points can change, i.e., the pixel distances between the tracking points can increase or can decrease. The distance changes can be used to provide a scaling factor. In some embodiments, as the size of the object changes, the AR system can be configured to scale a size of the curve 3330 and/or arrow 3332. Thus, a size of the curve relative to the object can be maintained.

In another embodiment, a size of the curve can remain fixed. For example, a diameter of the curve can be related to a pixel height or width of the image, such as 330 percent of the pixel height or width. Thus, the object 3322 can appear to grow or shrink as a zoom is used or a position of the camera is changed. However, the size of curve 3330 in the image can remain relatively fixed.

Figure 34:
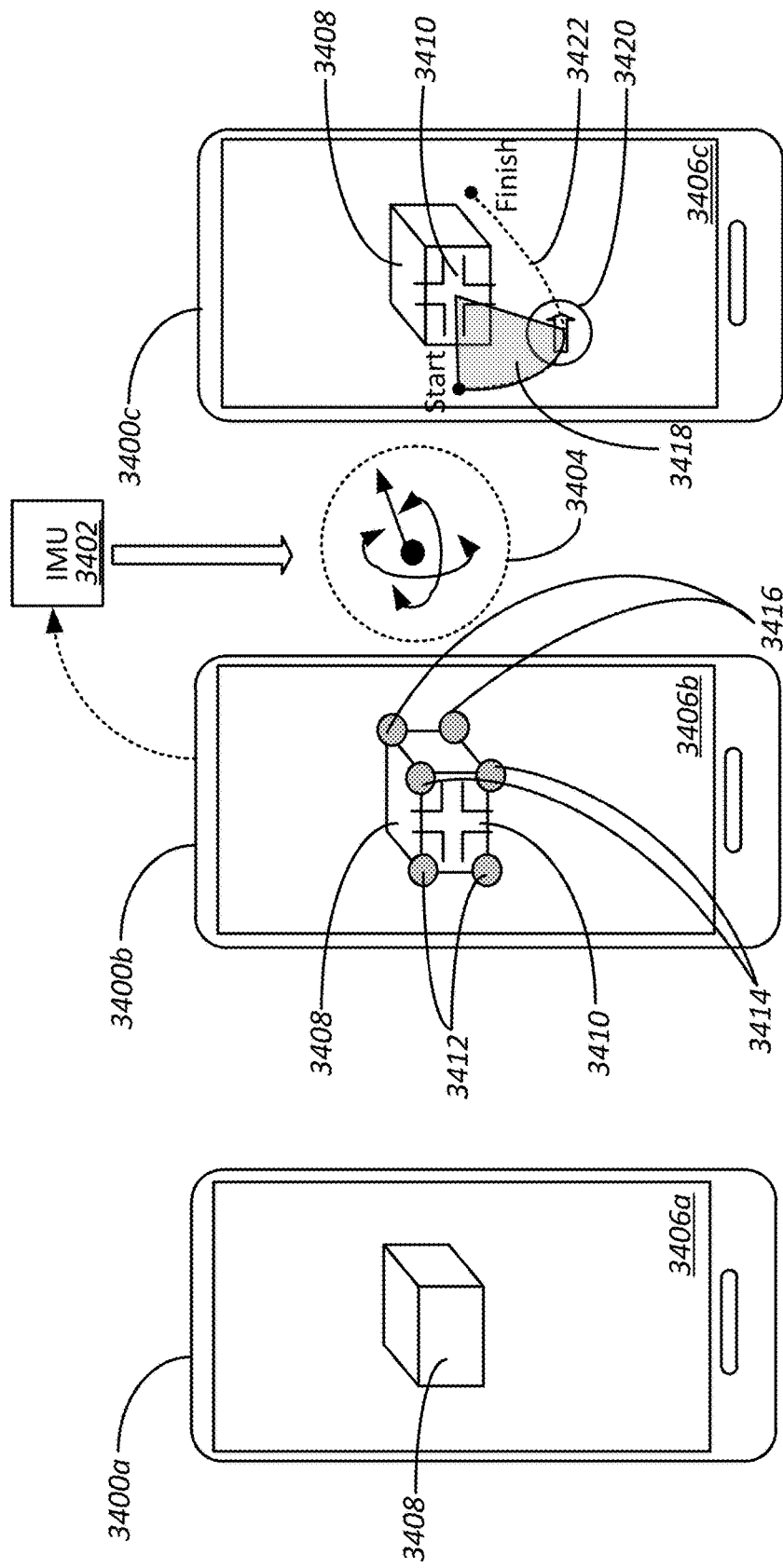
FIG. 34 illustrates one example of generating an Augmented Reality (AR) image capture track for capturing images used in a MVIDMR on a mobile device.

FIG. 34 illustrates a second example of generating an Augmented Reality (AR) image capture track for capturing images used in a MVIDMR on a mobile device. FIG. 34 includes a mobile device at three times 3400a, 3400b and 3400c. The device can include at least one camera, a display, an IMU, a processor (CPU), memory, microphone, audio output devices, communication interfaces, a power supply, graphic processor (GPU), graphical memory and combinations thereof. The display is shown with images at three times 3406a, 3406b and 3406c. The display can be overlaid with a touch screen.

In 3406a, an image of an object 3408 is output to the display in state 3406a. The object is a rectangular box. The image data output to the display can be live image data from a camera on the mobile device. The camera could also be a remote camera.

In some embodiments, a target, such as 3410, can be rendered to the display. The target can be combined with the live image data to create a synthetic image. Via the input interface on the phone, a user may be able to adjust a position of the target on the display. The target can be placed on an object and then an additional input can be made to select the object. For example, the touch screen can be tapped at the location of the target.

In another embodiment, object recognition can be applied to the live image data. Various markers can be rendered to the display, which indicate the position of the identified objects in the live image data. To select an object, the touchscreen can be tapped at a location of one of markers appearing in the image or another input device can be used to select the recognized object.

After an object is selected, a number of initial tracking points can be identified on the object, such as 3412, 3414 and 3416. In some embodiments, the tracking points may not appear on the display. In another embodiment, the tracking points may be rendered to the display. In some embodiments, if the tracking point is not located on the object of interest, the user may be able to select the tracking point and delete it or move it so that the tracking point lies on the object.

Next, an orientation of the mobile device can change. The orientation can include a rotation through one or more angles and translational motion as shown in 3404. The orientation change and current orientation of the device can be captured via the IMU data from IMU 3402 on the device.

As the orientation of the device is changed, one or more of the tracking points, such as 3412, 3414 and 3416, can be occluded. In addition, the shape of surfaces currently appearing in the image can change. Based on changes between frames, movement at various pixel locations can be determined. Using the IMU data and the determined movement at the various pixel locations, surfaces associated with the object 3408 can be predicted. The new surfaces can be appearing in the image as the position of the camera changes. New tracking points can be added to these surfaces.

As described above, the mobile device can be used to capture images used in a MVIDMR. To aid in the capture, the live image data can be augmented with a track or other guides to help the user move the mobile device correctly. The track can include indicators that provide feedback to a user while images associated with a MVIDMR are being recorded. In 3406c, the live image data is augmented with a path 3422. The beginning and end of the path is indicated by the text, "start" and "finish." The distance along the path is indicated by shaded region 3418.

The circle with the arrow 3420 is used to indicate a location on the path. In some embodiments, the position of the arrow relative to the path can change. For example, the arrow can move above or below the path or point in a direction which is not aligned with the path. The arrow can be rendered in this way when it is determined the orientation of the camera relative to the object or position of the camera diverges from a path that is desirable for generating the MVIDMR. Colors or other indicators can be used to indicate the status. For example, the arrow and/or circle can be rendered green when the mobile device is properly following the path and red when the position/orientation of the camera relative to the object is less than optimal.

Figure 35A:
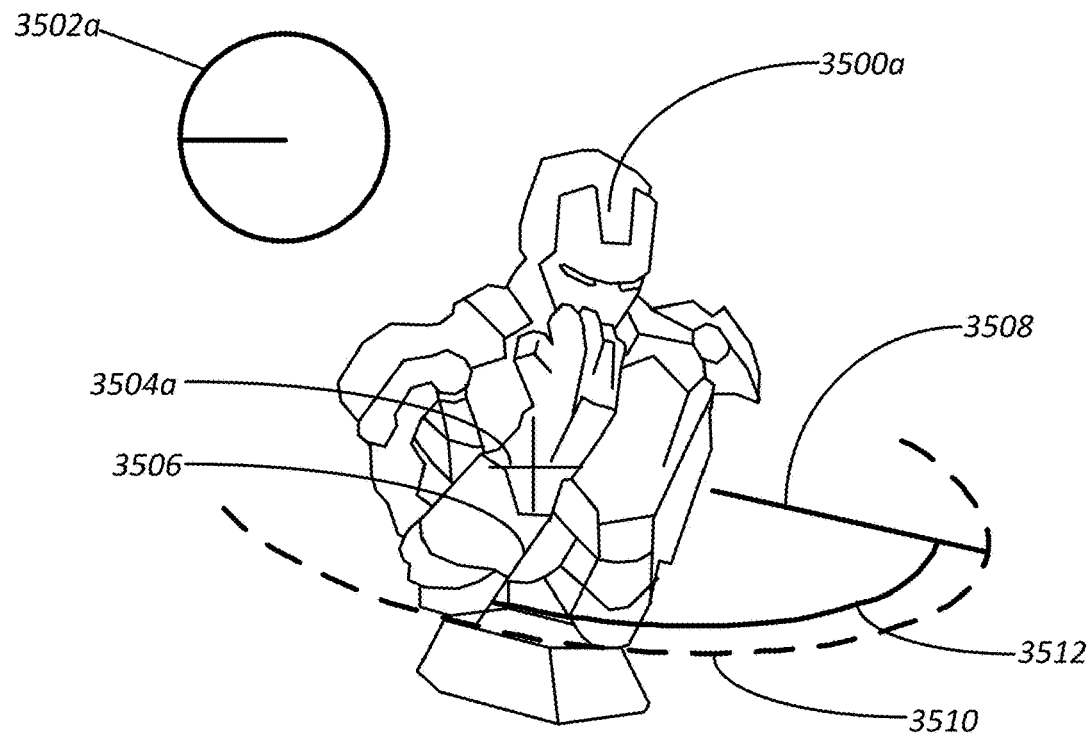
FIGS. 35A and 35B illustrate examples of generating an Augmented Reality (AR) image capture track including status indicators for capturing images used in a MVIDMR.
Figure 35B:
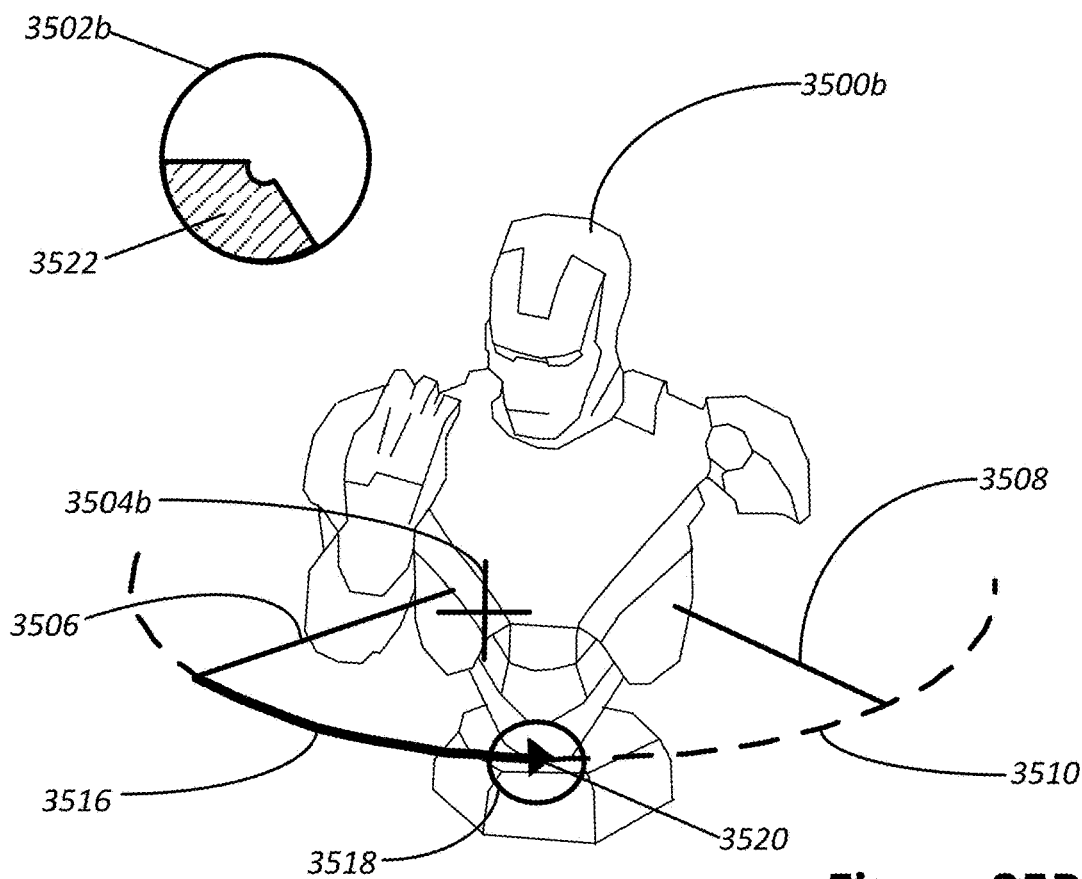

FIGS. 35A and 35B illustrate yet another example of generating an Augmented Reality (AR) image capture track including status indicators for capturing images used in a MVIDMR. The synthetic image generated by the AR system can consist of live image data from a camera augmented with one or more virtual objects. For example, as described above, the live image data can be from a camera on a mobile device.

In FIG. 35A, an object 3500a, which is a statue, is shown in an image 3515 from a camera at a first position and orientation. The object 3500a can be selected via the cross hairs 3504a. Once the cross hairs are placed on the object and the object is selected, the cross hairs can move and remain on the object as the object 3500a moves in the image data. As described above, as an object's position/orientation changes in an image, a location to place the cross hairs in an image can be determined. In some embodiments, the position of the cross hairs can be determined via tracking the movements of points in the image, i.e., the tracking points.

In particular embodiments, if another object is moved in front of a tracked object, it may not be possible to associate the target 3504a with the object. For example, if a person moves in front of the camera, a hand is passed in front of the camera or the camera is moved so the object no longer appears in the camera field of view, then the object which is being tracked will no longer be visible. Hence, it may not be possible to determine a location for the target associated with the tracked object. In the instance where the object reappears in the image, such as if a person that blocked the view of the object moved into and out of the view, then the system can be configured to reacquire the tracking points and reposition the target.

A first virtual object is rendered as indicator 3502a. Indicator 3502a can be used to indicate the progress in capturing images for a MVIDMR. A second virtual object is rendered as curve 3510. Third and fourth virtual objects are rendered as lines 3506 and 3508. A fifth virtual object is rendered as curve 3512.

The curve 3510 can be used to depict a path of a camera. Whereas lines 3506 and 3508 and curve 3512 can be used to indicate an angle range for the MVIDMR. In this example, the angle range is about ninety degrees.

In FIG. 35B, the position of the camera is different as compared to FIG. 35A. Hence, a different view of object 3500b is presented in image 3525. In particular, the camera view shows more of the front of the object as compared to the view in FIG. 35A. The target 3504b is still affixed to the object 3500b. However, the target is fixed in a different location on the object, i.e., on a front surface as opposed to an arm.

The curve 3516 with arrow 3520 at the end is used to indicate the progress of the image capture along curve 3510. The circle 3518 around the arrow 3520 further highlights the current position of the arrow. As described above, a position and a direction of the arrow 3520 can be used to provide feedback to a user on a deviation of the camera position and/or orientation from curve 3510. Based upon this information, the user may adjust a position and/or orientation of the camera while it is capturing the image data.

Lines 3506 and 3508 still appear in the image but are positioned differently relative to object 3500b. The lines again indicate an angle range. In 3520, the arrow is about half way between lines 3506 and 3508. Hence, an angle of about 45 degrees has been captured around the object 3500b.

The indicator 3502b now includes a shaded region 3522. The shaded region can indicate a portion of a MVIDMR angle range currently captured. In some embodiments, lines 3506 and 3508 can only indicate a portion of the angle range in a MVIDMR that is being captured and the total angle range can be shown via indicator 3502b. In this example, the angle range shown by indicator 3502b is three hundred sixty degrees while lines 3506 and 3508 show a portion of this range which ninety degrees.

Figure 36:
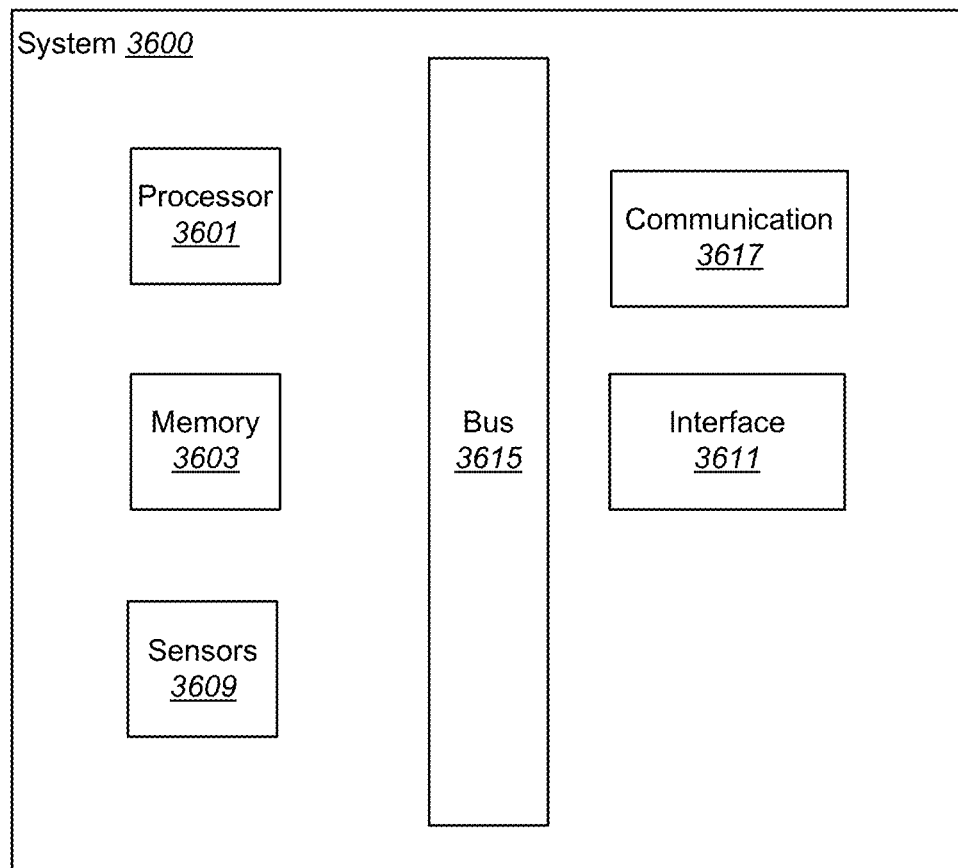
FIG. 36 illustrates a particular example of a computer system configured in accordance with various embodiments.

With reference to FIG. 36, shown is a particular example of a computer system that can be used to implement particular examples. For instance, the computer system 3600 can be used to provide MVIDMRs according to various embodiments described above. According to various embodiments, a system 3600 suitable for implementing particular embodiments includes a processor 3601, a memory 3603, an interface 3611, and a bus 3615 (e.g., a PCI bus).

The system 3600 can include one or more sensors 3609, such as light sensors, accelerometers, gyroscopes, microphones, cameras including stereoscopic or structured light cameras. As described above, the accelerometers and gyroscopes may be incorporated in an IMU. The sensors can be used to detect movement of a device and determine a position of the device. Further, the sensors can be used to provide inputs into the system. For example, a microphone can be used to detect a sound or input a voice command.

In the instance of the sensors including one or more cameras, the camera system can be configured to output native video data as a live video feed. The live video feed can be augmented and then output to a display, such as a display on a mobile device. The native video can include a series of frames as a function of time. The frame rate is often described as frames per second (fps). Each video frame can be an array of pixels with color or gray scale values for each pixel. For example, a pixel array size can be 512 by 512 pixels with three color values (red, green and blue) per pixel. The three color values can be represented by varying amounts of bits, such as 24, 30, 36, 40 bits, etc. per pixel. When more bits are assigned to representing the RGB color values for each pixel, a larger number of colors values are possible. However, the data associated with each image also increases. The number of possible colors can be referred to as the color depth.

The video frames in the live video feed can be communicated to an image processing system that includes hardware and software components. The image processing system can include non-persistent memory, such as random-access memory (RAM) and video RAM (VRAM). In addition, processors, such as central processing units (CPUs) and graphical processing units (GPUs) for operating on video data and communication busses and interfaces for transporting video data can be provided. Further, hardware and/or software for performing transformations on the video data in a live video feed can be provided.

In particular embodiments, the video transformation components can include specialized hardware elements configured to perform functions necessary to generate a synthetic image derived from the native video data and then augmented with virtual data. In data encryption, specialized hardware elements can be used to perform a specific data transformation, i.e., data encryption associated with a specific algorithm. In a similar manner, specialized hardware elements can be provided to perform all or a portion of a specific video data transformation. These video transformation components can be separate from the GPU(s), which are specialized hardware elements configured to perform graphical operations. All or a portion of the specific transformation on a video frame can also be performed using software executed by the CPU.

The processing system can be configured to receive a video frame with first RGB values at each pixel location and apply operation to determine second RGB values at each pixel location. The second RGB values can be associated with a transformed video frame which includes synthetic data. After the synthetic image is generated, the native video frame and/or the synthetic image can be sent to a persistent memory, such as a flash memory or a hard drive, for storage. In addition, the synthetic image and/or native video data can be sent to a frame buffer for output on a display or displays associated with an output interface. For example, the display can be the display on a mobile device or a view finder on a camera.

In general, the video transformations used to generate synthetic images can be applied to the native video data at its native resolution or at a different resolution. For example, the native video data can be a 512 by 512 array with RGB values represented by 24 bits and at frame rate of 24 fps. In some embodiments, the video transformation can involve operating on the video data in its native resolution and outputting the transformed video data at the native frame rate at its native resolution.

In other embodiments, to speed up the process, the video transformations may involve operating on video data and outputting transformed video data at resolutions, color depths and/or frame rates different than the native resolutions. For example, the native video data can be at a first video frame rate, such as 24 fps. But, the video transformations can be performed on every other frame and synthetic images can be output at a frame rate of 12 fps. Alternatively, the transformed video data can be interpolated from the 12 fps rate to 24 fps rate by interpolating between two of the transformed video frames.

In another example, prior to performing the video transformations, the resolution of the native video data can be reduced. For example, when the native resolution is 512 by 512 pixels, it can be interpolated to a 256 by 256 pixel array using a method such as pixel averaging and then the transformation can be applied to the 256 by 256 array. The transformed video data can output and/or stored at the lower 256 by 256 resolution. Alternatively, the transformed video data, such as with a 256 by 256 resolution, can be interpolated to a higher resolution, such as its native resolution of 512 by 512, prior to output to the display and/or storage. The coarsening of the native video data prior to applying the video transformation can be used alone or in conjunction with a coarser frame rate.

As mentioned above, the native video data can also have a color depth. The color depth can also be coarsened prior to applying the transformations to the video data. For example, the color depth might be reduced from 40 bits to 24 bits prior to applying the transformation.

As described above, native video data from a live video can be augmented with virtual data to create synthetic images and then output in real-time. In particular embodiments, real-time can be associated with a certain amount of latency, i.e., the time between when the native video data is captured and the time when the synthetic images including portions of the native video data and virtual data are output. In particular, the latency can be less than 100 milliseconds. In other embodiments, the latency can be less than 50 milliseconds. In other embodiments, the latency can be less than 30 milliseconds. In yet other embodiments, the latency can be less than 20 milliseconds. In yet other embodiments, the latency can be less than 10 milliseconds.

The interface 3611 may include separate input and output interfaces, or may be a unified interface supporting both operations. Examples of input and output interfaces can include displays, audio devices, cameras, touch screens, buttons and microphones. When acting under the control of appropriate software or firmware, the processor 3601 is responsible for such tasks such as optimization. Various specially configured devices can also be used in place of a processor 3601 or in addition to processor 3601, such as graphical processor units (GPUs). The complete implementation can also be done in custom hardware. The interface 3611 is typically configured to send and receive data packets or data segments over a network via one or more communication interfaces, such as wireless or wired communication interfaces. Particular examples of interfaces the device supports include Ethernet interfaces, frame relay interfaces, cable interfaces, DSL interfaces, token ring interfaces, and the like.

In addition, various very high-speed interfaces may be provided such as fast Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control such communications intensive tasks as packet switching, media control and management.

According to various embodiments, the system 3600 uses memory 3603 to store data and program instructions and maintained a local side cache. The program instructions may control the operation of an operating system and/or one or more applications, for example. The memory or memories may also be configured to store received metadata and batch requested metadata.

The system 3600 can be integrated into a single device with a common housing. For example, system 3600 can include a camera system, processing system, frame buffer, persistent memory, output interface, input interface and communication interface. In various embodiments, the single device can be a mobile device like a smart phone, an augmented reality and wearable device like Google Glass™ or a virtual reality head set that includes a multiple cameras, like a Microsoft Hololens™. In other embodiments, the system 3600 can be partially integrated. For example, the camera system can be a remote camera system. As another example, the display can be separate from the rest of the components like on a desktop PC.

In the case of a wearable system, like a head-mounted display, as described above, a virtual guide can be provided to help a user record a MVIDMR. In addition, a virtual guide can be provided to help teach a user how to view a MVIDMR in the wearable system. For example, the virtual guide can be provided in synthetic images output to head mounted display which indicate that the MVIDMR can be viewed from different angles in response to the user moving some manner in physical space, such as walking around the projected image. As another example, the virtual guide can be used to indicate a head motion of the user can allow for different viewing functions. In yet another example, a virtual guide might indicate a path that a hand could travel in front of the display to instantiate different viewing functions.

The invention claimed is:

1. A method comprising:
    capturing a first one or more images of a designated object via a camera at a mobile computing device, each of the first one or more images being captured from a respective viewpoint;
    comparing the first one or more images to reference data to identify a difference between the first one or more images and the reference data, wherein the difference includes a statistical estimate, wherein the estimate represents a probability of a damage characterization of the difference; and
    transmitting an instruction to a display screen at the mobile computing device to provide image capture guidance, the image capture guidance including an instruction for capturing a second one or more images of the designated object, the second one or more images including a designated portion of the object that includes the identified difference, wherein the image capture guidance is provided so as to decrease statistical uncertainty for the statistical estimate, wherein the statistical uncertainty represents a probability of whether the damage characterization is correct.

2. The method recited in claim 1, wherein the image capture guidance is provided as an overlay on a live video feed presented on the display screen.

3. The method recited in claim 1, wherein the difference includes a characteristic selected from the group consisting of: an estimated probability of damage to the designated object portion, an estimated severity of damage to the designated object portion, and an estimated type of damage to the designated object portion.

4. The method recited in claim 1, wherein the image capture guidance identifies a targeted camera position.

5. The method recited in claim 1, wherein the image capture guidance identifies a targeted camera orientation.

6. The method recited in claim 1, wherein the image capture guidance identifies a targeted camera zoom level.

7. The method recited in claim 1, wherein the image capture guidance is configured to as to align the camera with a designated perspective view within a three-dimensional model of the object.

8. The method recited in claim 1, wherein comparing the first one or more images to reference data to identify the difference comprises applying a neural network to estimate one or more two-dimensional skeleton joints for a respective one of the first images.

9. The method recited in claim 1, wherein comparing the first one or more images to reference data to identify the difference comprises estimating pose information for a designated one of the first images, the pose information including a location and angle of the camera with respect to the designated object for the designated image.

10. The method recited in claim 1, wherein comparing the first one or more images to reference data to identify the difference comprises applying a neural network to the first one or more images to map the first one or more images to an object model.

11. The method recited in claim 1, the method further comprising:
   constructing a multi-view representation of the designated object at the mobile computing device based on the first one or more images, the multi-view representation being navigable in one or more directions.

12. The method recited in claim 11, the method further comprising:
   updating the multi-view representation of the designated object based on the second one or more images.

13. A mobile computing device comprising:
   a camera configured to capture a first one or more images of a designated object, each of the first one or more images being captured from a respective viewpoint;
   a processor configured to compare the first one or more images to reference data to identify a difference between the first one or more images and the reference data, wherein the difference includes a statistical estimate, wherein the estimate represents a probability of a damage characterization of the difference; and
   a display screen configured to provide image capture guidance, the image capture guidance including an instruction for capturing a second one or more images of the designated object, the second one or more images including a designated portion of the object that includes the identified difference, wherein the image capture guidance is provided so as to decrease statistical uncertainty for the statistical estimate.

14. The mobile computing device recited in claim 13, wherein the image capture guidance is provided as an overlay on a live video feed presented on the display screen.

15. The mobile computing device recited in claim 13, wherein the difference includes a characteristic selected from the group consisting of: an estimated probability of damage to the designated object portion, an estimated severity of damage to the designated object portion, and an estimated type of damage to the designated object portion.

16. The mobile computing device recited in claim 13, wherein the image capture guidance identifies a targeted camera position.

17. The mobile computing device recited in claim 13, wherein the image capture guidance identifies a targeted camera orientation.

18. One or more non-transitory computer readable media having instructions stored thereon for performing a method, the method comprising:
   comparing the first one or more images to reference data to identify a difference between the first one or more images and the reference data, wherein the difference includes a statistical estimate, wherein the estimate represents a probability of a damage characterization of the difference; and
   transmitting an instruction to a display screen at the mobile computing device to provide image capture guidance, the image capture guidance including an instruction for capturing a second one or more images of the designated object, the second one or more images including a designated portion of the object that includes the identified difference, wherein the image capture guidance is provided so as to decrease statistical uncertainty for the statistical estimate.

* * * * *